(12) United States Patent
Lee et al.

(10) Patent No.: US 12,398,159 B2
(45) Date of Patent: Aug. 26, 2025

(54) ORGANIC COMPOUND AND ORGANIC ELECTRIC FIELD LIGHTEMITTING DEVICE COMPRISING SAME

(71) Applicant: MATERIAL SCIENCE CO., LTD., Seoul (KR)

(72) Inventors: Dong Hun Lee, Seoul (KR); Kwang Seok Do, Seoul (KR); Ji Woong Yoo, Seoul (KR)

(73) Assignee: MATERIAL SCIENCE CO., LTD., Seoul (KR)

( * ) Notice: Subject to any disclaimer, the term of this patent is extended or adjusted under 35 U.S.C. 154(b) by 885 days.

(21) Appl. No.: 17/529,241

(22) Filed: Nov. 17, 2021

(65) Prior Publication Data

US 2022/0112221 A1   Apr. 14, 2022

Related U.S. Application Data

(63) Continuation of application No. PCT/KR2020/006766, filed on May 25, 2020.

(30) Foreign Application Priority Data

May 24, 2019  (KR) .................. 10-2019-0060940
May 21, 2020  (KR) .................. 10-2020-0061210

(51) Int. Cl.
*C07F 5/02* (2006.01)
*H10K 50/11* (2023.01)
(Continued)

(52) U.S. Cl.
CPC ............... *C07F 5/027* (2013.01); *C07F 5/02* (2013.01); *H10K 85/322* (2023.02);
(Continued)

(58) Field of Classification Search
CPC ......... C07F 5/02; C07F 5/027; H10K 85/322; H10K 85/658; H10K 85/657; C09K 2211/1096

See application file for complete search history.

(56) References Cited

U.S. PATENT DOCUMENTS

| 2018/0069182 A1 | 3/2018 | Hatakeyama et al. |
| 2020/0190115 A1* | 6/2020 | Hatakeyama ...... H10K 85/6572 |

(Continued)

FOREIGN PATENT DOCUMENTS

| CN | 106467526 A | 3/2017 |
| CN | 107868031 A | 4/2018 |

(Continued)

OTHER PUBLICATIONS

English translation of Japanese Office Action from related application No. 2021-568929, Jun. 27, 2023, 13 pages.

(Continued)

*Primary Examiner* — Jenna N Chandhok
(74) *Attorney, Agent, or Firm* — Carter, DeLuca & Farrell LLP; Jeffrey S. Steen

(57) ABSTRACT

The present disclosure relates to a novel organic compound and an organic electroluminescent device comprising the same, and more particularly, to an organic compound having excellent lifespan, efficiency, electrochemical stability, and thermal stability, and an organic electroluminescent device comprising the same.

5 Claims, 1 Drawing Sheet

(51) Int. Cl.
  *H10K 50/15* (2023.01)
  *H10K 50/17* (2023.01)
  *H10K 50/18* (2023.01)
  *H10K 85/30* (2023.01)
  *H10K 85/60* (2023.01)
  *H10K 101/10* (2023.01)

(52) U.S. Cl.
  CPC ......... *H10K 85/626* (2023.02); *H10K 85/636* (2023.02); *H10K 85/654* (2023.02); *H10K 85/6572* (2023.02); *H10K 85/6574* (2023.02); *H10K 85/6576* (2023.02); *H10K 85/658* (2023.02); *H10K 50/11* (2023.02); *H10K 50/15* (2023.02); *H10K 50/17* (2023.02); *H10K 50/18* (2023.02); *H10K 2101/10* (2023.02)

(56) References Cited

U.S. PATENT DOCUMENTS

| 2022/0037591 A1* | 2/2022 | Hatakeyama | C08G 61/122 |
| 2023/0128708 A1 | 4/2023 | Ryota et al. | |
| 2023/0287010 A1* | 9/2023 | Yang | H10K 85/658 |

FOREIGN PATENT DOCUMENTS

| JP | 2015153911 A | 8/2015 |
| JP | 2019217554 A | 12/2019 |
| JP | 2020022474 A | 2/2020 |
| JP | 2020083896 A | 6/2020 |
| JP | 2020132636 A | 8/2020 |
| JP | 2020147563 A | 9/2020 |
| KR | 20160119683 A | 10/2016 |
| KR | 20170130435 A | 11/2017 |
| WO | WO2015102118 A1 | 7/2015 |
| WO | WO2018113538 A1 | 6/2018 |
| WO | WO2018212169 A1 | 11/2018 |
| WO | 2019111971 A1 | 6/2019 |
| WO | WO2020101001 A1 | 5/2020 |

OTHER PUBLICATIONS

Chinese Office Action from related application No. 202080034332.5, Jun. 30, 2023, 9 pages.
International Search Report of PCT/KR2020/006766, Aug. 27, 2020, English translation.
Soichiro Nakatsuka et al, Divergent Synthesis of Heteroatom-Centered 4, 8, 12-Triazatriangulenes, Angewandte Chemie, 2017, vol. 56, pp. 5087-5090, Wiley-VCH Verlag TmbH & Co, KGaA, Weinheim, Germany.
C. W. Tang and S. A. Vanslyke, Organic electroluminescent diodes, Apply Physics, Sep. 21, 1987, vol. 51, No. 12, pp. 913-915, American Institute of Physics, College Park, USA.
Frederik C. Krebs et al, Synthesis, Structure, and Properties of 4,8,12-Trioxa-12c-phospha-4,8, 12,12c-tetrahydrodibenzo-[cd,mn]pyrene, a Molecular Pyroelectric, Journal of American Chemical Society, 1997, vol. 119, No. 6, pp. 1208-1216, American Chemical Society, Washington DC, USA.
Takuji Hatakeyama et al, Ultrapure Blue Thermally Activated Delayed Fluorescence Molecules: Efficient HOMO-LUMO Separation by the Multiple Resonance Effect, Advanced Materials, 2016, vol. 28, pp. 2777-2781, Wiley-VCH Verlag TmbH & Co, KGaA, Weinheim, Germany.
English translation of Japanese Office Action for application No. 2023-183623, Jan. 21, 2025, 12 pages.

* cited by examiner

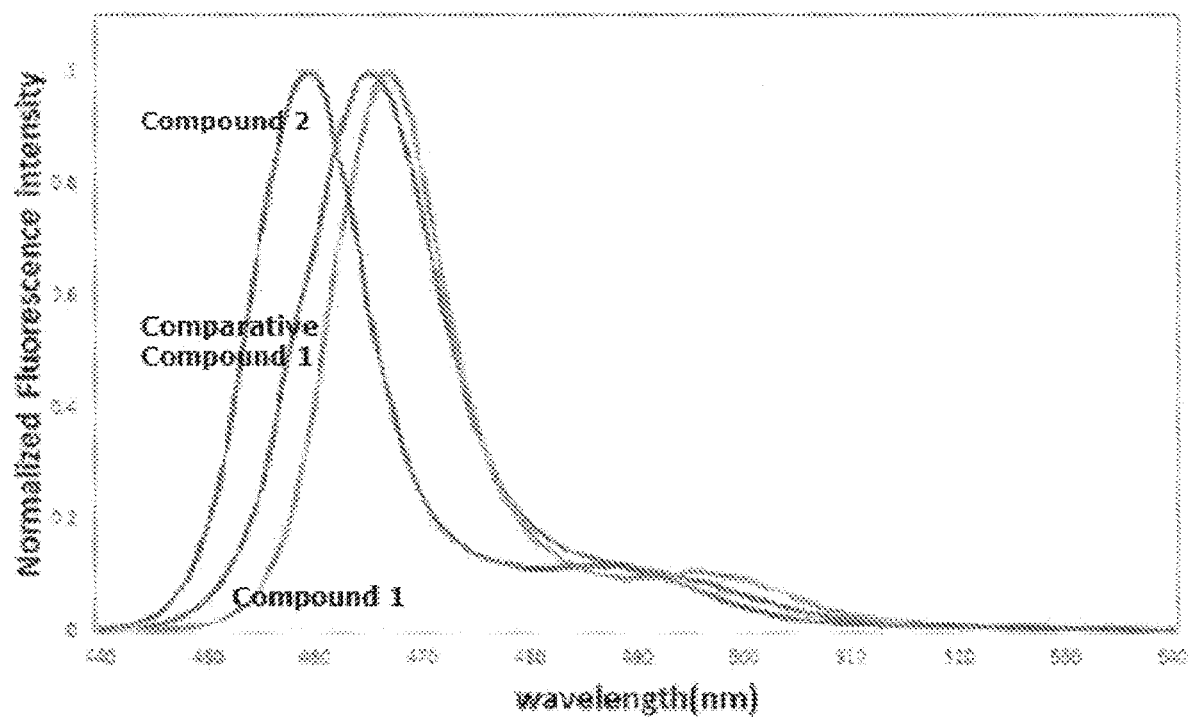

ORGANIC COMPOUND AND ORGANIC ELECTRIC FIELD LIGHTEMITTING DEVICE COMPRISING SAME

CROSS-REFERENCE TO RELATED APPLICATIONS

This application is a continuation of Application No. PCT/KR2020/006766 filed on May 25, 2020, which in turn claims the benefit of Korean Patent Applications No. 10-2019-0060940 filed on May 24, 2019, and No. 10-2020-0061210 filed on May 21, 2020, the disclosures of which are incorporated by reference into the present application.

TECHNICAL FIELD

The present disclosure relates to a novel organic compound and an organic electroluminescent device comprising the same.

BACKGROUND ART

Organic electroluminescent devices have simple structures, have various advantages in manufacturing processes, are high in luminance and excellent in viewing angle characteristics, have fast response speeds, and have low driving voltages compared to other flat panel display devices of existing liquid crystal displays (LCDs), plasma display panels (PDPs), field emission displays (FEDs), etc. Therefore, the organic electroluminescent devices are being actively developed and commercialized so that they may be used as a backlight for flat panel displays or displays of wall-mounted TVs, etc., and a light source for lighting, billboards, etc.

The first organic electroluminescent (EL) device was reported by C. W. Tang et al of Eastman Kodak Company (C. W. Tang, S. A. Vanslyke, Applied Physics Letters, Vol. 51 p. 913, 1987), and its light emitting principle is generally based on that, when a voltage is applied, holes injected from the anode and electrons injected from the cathode recombine to form excitons, which are electron-hole pairs, and which are converted into light by transferring the energy of the excitons to the light emitting material.

More specifically, the organic electroluminescent device has a structure including a cathode (electron injection electrode), an anode (hole injection electrode), and one or more organic layers between the two electrodes. At this time, the organic electroluminescent device is stacked in the order of a hole injection layer (HIL), a hole transport layer (HTL), a light emitting layer (EML), an electron transport layer (ETL), or an electron injection layer (EIL) from the anode, and an electron blocking layer (EBL) or a hole blocking layer (HBL) may be additionally included before and after the light emitting layer respectively in order to increase the efficiency of the light emitting layer.

A material used in the organic layer of the organic electroluminescent device accounts for most of a complex compound in which a metal forms a complex with a pure organic material or an organic material. It may be divided into a hole injection material, a hole transport material, a light emitting material, an electron transport material, an electron injection material, etc. depending on uses.

Here, an organic material that is easily oxidized and has an electrochemically stable state during oxidation is mainly used as the hole injection material or the hole transport material. An organic material that is easily reduced and has an electrochemically stable state during reduction is mainly used as the electron injecting material or the electron transport material.

Meanwhile, a material having a stable form in both oxidation and reduction states is preferable as a light emitting layer material, and a material having high luminous efficiency for converting them into light when excitons are formed is preferable. More specifically, the light emitting layer is composed of two materials of a host and a dopant, and the dopant should have high quantum efficiency, and it is preferable that the host material has a larger energy gap than the dopant material so that energy transfer to the dopant easily occurs. The displays used for TVs, mobiles, etc. implement full colors with three colors of red, green, and blue, and the light emitting layer is composed of a red host/dopant, a green host/dopant, and a blue host/dopant respectively.

Although a material used as a conventional blue dopant has accounted for a large proportion of using of fluorescent molecules such as perylene, coumarin, anthracene, pyrene, etc., there is a disadvantage in that pure blue light cannot be used when manufacturing a device since the emission spectrum and full width at half maximum of the dopant are wide. Such characteristics are the main reason that not only reduces the efficiency of blue in the resonance structure of the device, but also makes it difficult to use the deep blue section.

Recently, a document utilizing boron-based dopants with narrow emission spectrum of a device and high efficiency of the device has been published in Adv. Mater. 2016, 28, 2777-2781 and Angew. Chem. Int. Ed 2017, 56, 5087-5090, and disclosed in Korean Patent Application Laid-Open No. 10-2016-0119683. In the case of the previously introduced boron-based blue dopant material, a boron atom is contained in the center and cyclized, and the boron forms only a three-coordinated bond due to this so that the molecular structure maintains a planar state.

The dopants of such a planar structure have an advantage of emitting pure light since energy levels of the vibration mode of the molecules are similar so that the emission spectrums and full widths at half maximum are narrowed.

PRIOR ART DOCUMENTS

Patent Documents (Patent Document 1) (Non-Patent Document 1) Krebs, Frederik C., et al. "Synthesis, Structure, and Properties of 4, 8, 12-Trioxa-12c-phospha-4, 8, 12, 12c-tetrahydrodibenzo [cd, mn] pyrene, a Molecular Pyroelectric." Journal of the American Chemical Society 119.6 (1997): 1208-1216.

DISCLOSURE

Technical Problem

An object of the present disclosure is to provide a novel organic compound and an organic electroluminescent device comprising the same.

Other object of the present disclosure is to provide a novel compound which can be used as a light emitting layer material and the like, as an organic compound that has narrow emission spectrum and full width at half maximum.

Another object of the present disclosure is to provide an organic electroluminescent device in which an organic compound having excellent lifespan, efficiency, electrochemical stability, and thermal stability is used so that the driving voltage is low, the efficiency is high in the low doping section, and efficiency reduction is relatively suppressed even in the overdoping section, and particularly characteristics such as lifespan, etc. are excellent.

Still another object of the present disclosure is to provide a blue-based blue host/dopant system and an organic electroluminescent device which are suitable for AM-OLED using the organic compound.

Technical Solution

In order to achieve the aforementioned object, the present disclosure provides a compound represented by the following Chemical Formula 1:

[Chemical Formula 1]

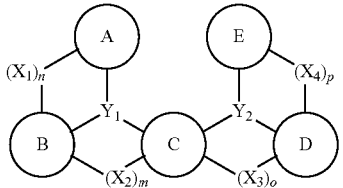

wherein n, m, o, and p are the same as or different from each other, and are each independently an integer of 0 or 1, n+m+o+p is an integer of 2 or more, $Y_1$ and $Y_2$ are the same as or different from each other, and are each independently B, N, $C(R_1)(R_2)$, P=O, or P=S, $X_1$ to $X_4$ are the same as or different from each other, and are each independently $B(R_3)$, $N(R_4)$, O, S, or Se, A, B, C, D, and E are the same as or different from each other, and are each independently a substituted or unsubstituted $C_6$-$C_{30}$ aryl group or a substituted or unsubstituted $C_2$-$C_{60}$ heteroaryl group, at least one of A, B, C, D, and E is a substituted or unsubstituted $C_2$-$C_{60}$ heteroaryl group, and $R_1$ to $R_4$ are the same as or different from each other, may be each independently selected from the group consisting of hydrogen, a cyano group, a trifluoromethyl group, a nitro group, a halogen group, a hydroxy group, a substituted or unsubstituted $C_1$-$C_4$ alkylthio group, a substituted or unsubstituted $C_1$-$C_{30}$ alkyl group, a substituted or unsubstituted $C_3$-$C_{20}$ cycloalkyl group, a substituted or unsubstituted $C_2$-$C_{30}$ alkenyl group, a substituted or unsubstituted $C_2$-$C_{24}$ alkynyl group, a substituted or unsubstituted $C_7$-$C_{30}$ aralkyl group, a substituted or unsubstituted $C_6$-$C_{30}$ aryl group, a substituted or unsubstituted $C_2$-$C_{60}$ heteroaryl group, a substituted or unsubstituted $C_3$-$C_{20}$ heterocycloalkyl group, a substituted or unsubstituted $C_3$-$C_{30}$ heteroarylalkyl group, a substituted or unsubstituted $C_1$-$C_{30}$ alkoxy group, a substituted or unsubstituted $C_1$-$C_{30}$ alkylamino group, a substituted or unsubstituted $C_6$-$C_{30}$ arylamino group, a substituted or unsubstituted $C_6$-$C_{30}$ aralkylamino group, a substituted or unsubstituted $C_2$-$C_{24}$ heteroarylamino group, a substituted or unsubstituted $C_1$-$C_{30}$ alkylsilyl group, a substituted or unsubstituted $C_6$-$C_{30}$ arylsilyl group, and a substituted or unsubstituted $C_6$-$C_{30}$ aryloxy group, and may combine with an adjacent group to form a substituted or unsubstituted ring.

Further, the present disclosure provides an organic electroluminescent device in which at least one of the one or more organic material layers comprises the compound represented by Chemical Formula 1 above, as an organic light emitting device including: a first electrode; a second electrode provided to face the first electrode; and one or more organic material layers provided between the first electrode and the second electrode.

For example, the organic electroluminescent device may have a structure including a hole injection layer, a hole transport layer, an electron blocking layer, a light emitting layer, a hole blocking layer, an electron transport layer, an electron injection layer, etc. However, the structure of the organic electroluminescent device is not limited thereto and may include a smaller number of organic material layers.

According to a preferred embodiment of the present disclosure, the organic material layer is the light emitting layer, and the light emitting layer comprises the compound represented by Chemical Formula 1 above.

According to a preferred embodiment of the present disclosure, the organic material layer is the hole injection layer, the hole transport layer, or the electron blocking layer, and the hole injection layer, the hole transport layer, or the electron blocking layer comprises the compound represented by Chemical Formula 1 above.

In the present disclosure, "hydrogen" is hydrogen, light hydrogen, deuterium, or tritium.

In the present specification, "halogen group" is fluorine, chlorine, bromine, or iodine.

In the present disclosure, "alkyl" refers to a monovalent substituent derived from a linear or branched $C_1$-$C_{40}$ saturated hydrocarbon. Although examples of alkyl may include methyl, ethyl, propyl, isobutyl, sec-butyl, pentyl, iso-amyl, hexyl, etc., the present disclosure is not limited thereto.

In the present disclosure, "alkenyl" refers to a monovalent substituent derived from a linear or branched $C_2$-$C_{40}$ unsaturated hydrocarbon having one or more carbon-carbon double bonds. Although examples of alkenyl may include vinyl, allyl, isopropenyl, 2-butenyl, etc., the present disclosure is not limited thereto.

In the present disclosure, "alkynyl" refers to a monovalent substituent derived from a linear or branched $C_2$-$C_{40}$ unsaturated hydrocarbon having one or more carbon-carbon triple bonds. Although examples of alkynyl may include ethynyl, 2-propynyl, etc., the present disclosure is not limited thereto.

In the present disclosure, "alkylthio" refers to the above-described alkyl group bonded through a sulfur linkage (—S—).

In the present disclosure, "aryl" refers to a monovalent substituent derived from a $C_6$-$C_{60}$ aromatic hydrocarbon in which a single ring or two or more rings are combined. Further, a form in which two or more rings are simply attached (pendant) or condensed to each other may also be included. Although examples of such aryl may include phenyl, naphthyl, phenanthryl, anthryl, fluorenyl, dimethyl fluorenyl, etc., the present disclosure is not limited thereto.

In the present disclosure, "heteroaryl" refers to a monovalent substituent derived from a monoheterocyclic or polyheterocyclic $C_6$-$C_{30}$ aromatic hydrocarbon. At this time, one or more carbons, preferably 1 to 3 carbons in the ring are substituted with a heteroatom such as N, O, S, or Se. Further, a form in which two or more rings are simply attached (pendant) or condensed to each other may also be included, and furthermore, a form in which the rings are condensed with an aryl group may also be included. Although examples of such heteroaryl may include 6-membered monocyclic rings such as pyridyl, pyrazinyl, pyrimidinyl, pyridazinyl, and triazinyl, polycyclic rings such as phenoxathienyl, indolizinyl, indolyl, purinyl, quinolyl, benzothiazole, and carbazolyl, and 2-furanyl, N-imidazolyl, 2-isoxazolyl, 2-pyridinyl, 2-pyrimidinyl, etc., the present disclosure is not limited thereto.

In the present disclosure, "aryloxy" is a monovalent substituent represented by RO—, wherein R means $C_6$-$C_{60}$ aryl. Although examples of such aryloxy may include phenyloxy, naphthyloxy, diphenyloxy, etc., the present disclosure is not limited thereto.

In the present disclosure, "alkyloxy" is a monovalent substituent represented by R'O—, wherein R' means $C_1$-$C_{40}$ alkyl, and may include a linear, branched, or cyclic structure. Although examples of alkyloxy may include methoxy, ethoxy, n-propoxy, 1-propoxy, t-butoxy, n-butoxy, pentoxy, etc., the present disclosure is not limited thereto.

In the present disclosure, "alkoxy" may be a linear, branched, or cyclic chain. Although the number of carbon atoms of alkoxy is not particularly limited, it is preferably 1 to 20. Specifically, alkoxy may be methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, etc., the present disclosure is not limited thereto.

In the present disclosure, "aralkyl" refers to an aryl-alkyl group where aryl and alkyl are as described above. Preferred aralkyls include lower alkyl groups. Non-limiting examples of suitable aralkyl groups include benzyl, 2-phenethyl, and naphthalenylmethyl. Binding to the parent residue is made through alkyl.

In the present disclosure, "arylamino group" refers to an amine substituted with a $C_6$-$C_{30}$ aryl group.

In the present disclosure, "alkylamino group" refers to an amine substituted with a $C_1$-$C_{30}$ alkyl group.

In the present disclosure, "aralkylamino group" refers to an amine substituted with a $C_6$-$C_{30}$ aryl-alkyl group.

In the present disclosure, "heteroarylamino group" refers to an amine group substituted with $C_6$-$C_{30}$ aryl group and heterocyclic group.

In the present disclosure, "heteroaralkyl group" refers to an aryl-alkyl group substituted with a heterocyclic group.

In the present disclosure, "cycloalkyl" refers to a monovalent substituent derived from a monocyclic or polycyclic $C_3$-$C_{40}$ non-aromatic hydrocarbon. Although examples of such cycloalkyl may include cyclopropyl, cyclobutyl, cyclopentyl, cyclohexyl, norbornyl, adamantine, etc., the present disclosure is not limited thereto.

In the present disclosure, "heterocycloalkyl" refers to a monovalent substituent derived from a $C_3$-$C_{40}$ non-aromatic hydrocarbon, and one or more carbons, preferably 1 to 3 carbons in the ring are substituted with a heteroatom such as N, O, S, or Se. Although examples of such heterocycloalkyl may include morpholine, piperazine, etc., the present disclosure is not limited thereto.

In the present disclosure, "alkylsilyl" is silyl substituted with $C_1$-$C_{40}$ alkyl, and "arylsilyl" refers to silyl substituted with $C_6$-$C_{60}$ aryl.

In the present disclosure, "condensed ring" refers to a condensed aliphatic ring, a condensed aromatic ring, a condensed heteroaliphatic ring, a condensed heteroaromatic ring, or a combined form thereof.

In the present disclosure, "combining with an adjacent group each other to form a ring" means combining with the adjacent group each other to form a substituted or unsubstituted aliphatic hydrocarbon ring; a substituted or unsubstituted aromatic hydrocarbon ring; a substituted or unsubstituted aliphatic heterocycle; a substituted or unsubstituted aromatic heterocycle; or a condensed ring thereof.

In the present specification, "alicyclic compound" has the same meaning as "aliphatic hydrocarbon ring", and refers to a ring composed of only carbon and hydrogen atoms, as a non-aromatic ring.

In the present specification, "heteroalicyclic compound" refers to an alicyclic compound in which one or more carbons of the "aliphatic hydrocarbon ring" are substituted with heteroatoms so that it includes at least one heteroatom.

In the present specification, although examples of the "aromatic hydrocarbon ring" may include a phenyl group, a naphthyl group, an anthracenyl group, etc., the present disclosure is not limited thereto.

In the present specification, "aliphatic heterocycle" refers to an aliphatic ring including one or more heteroatoms.

In the present specification, "aromatic heterocycle" refers to an aromatic ring including one or more heteroatoms.

In the present specification, the aliphatic hydrocarbon ring, the aromatic hydrocarbon ring, the aliphatic heterocycle, and the aromatic heterocycle may be monocyclic or polycyclic.

In the present specification, "substitution" means that a hydrogen atom bonded to a carbon atom of a compound is replaced with another substituent, and the position to be substituted is not limited as long as it is the position at which the hydrogen atom is substituted, that is, a position where the substituent is substitutable, and when it is substituted twice or more, two or more substituents may be the same as or different from each other. Although the substituent may be substituted with one or more substituents selected from the group consisting of hydrogen, a cyano group, a nitro group, a halogen group, a hydroxy group, a $C_1$-$C_{30}$ alkyl group, a $C_2$-$C_{30}$ alkenyl group, a $C_2$-$C_{24}$ alkynyl group, a $C_2$-$C_{30}$ heteroalkyl group, a $C_6$-$C_{30}$ aralkyl group, a $C_5$-$C_{30}$ aryl group, a $C_2$-$C_{30}$ heteroaryl group, a $C_3$-$C_{30}$ heteroarylalkyl group, a $C_1$-$C_{30}$ alkoxy group, a $C_1$-$C_{30}$ alkylamino group, a $C_6$-$C_{30}$ arylamino group, a $C_6$-$C_{30}$ aralkylamino group, and a $C_2$-$C_{24}$ heteroarylamino group, the present disclosure is not limited thereto.

In the present specification, "combining with an adjacent group each other to form a ring" means combining with the adjacent group each other to form a substituted or unsubstituted aliphatic hydrocarbon ring, a substituted or unsubstituted aromatic hydrocarbon ring, a substituted or unsubstituted aliphatic heterocycle, a substituted or unsubstituted aromatic heterocycle, or a condensed ring thereof.

Advantageous Effects

The present disclosure provides a novel compound that can be used as a light emitting layer material and the like, as an organic compound having narrow emission spectrum and full width at half maximum.

The present disclosure provides an organic electroluminescent device which has low driving voltage and is capable of remarkably improving color gamut by using an organic compound having excellent lifespan, efficiency, electrochemical stability, and thermal stability.

Further, the present disclosure provides a blue-based blue host/dopant system and an organic electroluminescent device which are suitable for AM-OLED using the organic compound.

BRIEF DESCRIPTION OF DRAWINGS

The FIGURE relates to a result of measuring emission wavelengths of a compound according to an embodiment of the present disclosure.

MODE FOR INVENTION

Hereinafter, embodiments of the present disclosure will be described in detail so that those of ordinary skill in the art can easily carry out the present disclosure. However, the present disclosure may be embodied in various different forms and is not limited to the embodiments described herein.

An organic compound according to the present disclosure can remarkably improve color gamut by having a planar structure, minimizing the molecular pi ($\pi$-$\pi$) mutual attraction within molecules, and having almost similar energy levels of the vibration mode of the molecules, thereby having narrow emission spectrum and full width at half maximum.

The organic compound according to the present disclosure prevents the generation of an excited dimer (excimer) in a molecule by containing an atom providing a planar structure such as a boron-based element, and makes it possible to increase efficiency and lifespan of the device by increasing electron density of the core and stability of the dopant.

Specifically, it relates to a compound represented by the following Chemical Formula 1:

[Chemical Formula 1]

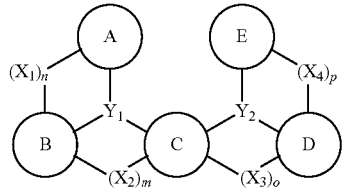

wherein
n, m, o, and p are the same as or different from each other, and are each independently an integer of 0 or 1,
n+m+o+p is an integer of 2 or more,
$Y_1$ and $Y_2$ are the same as or different from each other, and are each independently B, N, $C(R_1)(R_2)$, P=O, or P=S,
$X_1$ to $X_4$ are the same as or different from each other, and are each independently $B(R_3)$, $N(R_4)$, O, S, or Se,
A, B, C, D, and E are the same as or different from each other, and are each independently a substituted or unsubstituted $C_6$-$C_{30}$ aryl group or a substituted or unsubstituted $C_2$-$C_{60}$ heteroaryl group,
At least one of A, B, C, D, and E is a substituted or unsubstituted $C_2$-$C_{60}$ heteroaryl group, and
$R_1$ to $R_4$ may be the same as or different from each other, may be each independently selected from the group consisting of hydrogen, a cyano group, a trifluoromethyl group, a nitro group, a halogen group, a hydroxy group, a substituted or unsubstituted $C_1$-$C_4$ alkylthio group, a substituted or unsubstituted $C_1$-$C_{30}$ alkyl group, a substituted or unsubstituted $C_3$-$C_{20}$ cycloalkyl group, a substituted or unsubstituted $C_2$-$C_{30}$ alkenyl group, a substituted or unsubstituted $C_2$-$C_{24}$ alkynyl group, a substituted or unsubstituted $C_7$-$C_{30}$ aralkyl group, a substituted or unsubstituted $C_6$-$C_{30}$ aryl group, a substituted or unsubstituted $C_2$-$C_{60}$ heteroaryl group, a substituted or unsubstituted $C_3$-$C_{20}$ heterocycloalkyl group, a substituted or unsubstituted $C_3$-$C_{30}$ heteroaralkyl group, a substituted or unsubstituted $C_1$-$C_{30}$ alkoxy group, a substituted or unsubstituted $C_1$-$C_{30}$ alkylamino group, a substituted or unsubstituted $C_6$-$C_{30}$ arylamino group, a substituted or unsubstituted $C_6$-$C_{30}$ aralkylamino group, a substituted or unsubstituted $C_2$-$C_{24}$ heteroarylamino group, a substituted or unsubstituted $C_1$-$C_{30}$ alkylsilyl group, a substituted or unsubstituted $C_6$-$C_{30}$ arylsilyl group, and a substituted or unsubstituted $C_6$-$C_{30}$ aryloxy group, and may combine with an adjacent group to form a substituted or unsubstituted ring.

At least one of A, C, and E may be a substituted or unsubstituted $C_3$-$C_{20}$ heteroaryl group.

Specifically, the heteroaryl group may be selected from the group consisting of substituted or unsubstituted pyrrole, substituted or unsubstituted furan, substituted or unsubstituted thiophene, substituted or unsubstituted dioxin, substituted or unsubstituted oxathiin, substituted or unsubstituted dithiin, substituted or unsubstituted indole, substituted or unsubstituted benzofuran, substituted or unsubstituted benzothiophene, substituted or unsubstituted benzodioxin, substituted or unsubstituted benzooxathiin, substituted or unsubstituted benzodithiin, substituted or unsubstituted carbazole, substituted or unsubstituted dibenzofuran, substituted or unsubstituted dibenzothiophene, substituted or unsubstituted dibenzodioxin, substituted or unsubstituted phenoxanthine, and substituted or unsubstituted thianthrene, and when the heteroaryl group is substituted, adjacent substituents may be connected to each other to form a cyclic compound.

More specifically, A, C, and E may be the same as or different from each other, and may be each independently a compound represented by the following Chemical Formula 2 or Chemical Formula 3:

[Chemical Formula 2]

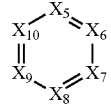

[Chemical Formula 3]

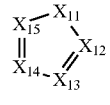

wherein,
$X_5$ to $X_{10}$ and $X_{12}$ to $X_{15}$ are the same as or different from each other, and are each independently selected from the group consisting of $C(R_5)$, N, S, and O,
$X_{11}$ is selected from the group consisting of $C(R_6)(C_7)$, $N(R_8)$, S, and O, and
$R_5$ to $R_8$ may be the same as or different from each other, may be each independently selected from the group consisting of hydrogen, a cyano group, a trifluoromethyl group, a nitro group, a halogen group, a hydroxy group, a substituted or unsubstituted $C_1$-$C_4$ alkylthio group, a substituted or unsubstituted $C_1$-$C_{30}$ alkyl group, a substituted or unsubstituted $C_1$-$C_{20}$ cycloalkyl group, a substituted or unsubstituted $C_2$-$C_{30}$ alkenyl group, a substituted or unsubstituted $C_2$-$C_{24}$ alkynyl group, a substituted or unsubstituted $C_7$-$C_{30}$ aralkyl group, a substituted or unsubstituted $C_6$-$C_{30}$ aryl group, a substituted or unsubstituted $C_2$-$C_{60}$ heteroaryl group, a substituted or unsubstituted $C_6$-$C_{30}$ heteroarylalkyl group, a substituted or unsubstituted $C_1$-$C_{30}$ alkoxy group, a substituted or unsubstituted $C_1$-$C_{30}$ alkylamino group, a substituted or unsubstituted $C_6$-$C_{30}$ arylamino group, a substituted or unsubstituted $C_6$-$C_{30}$ aralkylamino group, a substituted or unsubstituted $C_2$-$C_{24}$ heteroarylamino group, a substituted or unsubstituted $C_1$-$C_{30}$ alkylsilyl group, a substituted or unsubstituted $C_6$-$C_{30}$ arylsilyl group, and a substituted or unsubstituted $C_6$-$C_{30}$ aryloxy group, and may combine with an adjacent group to form a substituted or unsubstituted ring.

Specifically, when A, C, and E are all composed of Chemical Formula 2, $X_5$ to $X_{10}$ are not all $C(R_5)$.

When A, C, and E are all composed of Chemical Formula 3, $X_{11}$ is $C(R_6)(C_7)$, and at the same time $X_{12}$ to $X_{15}$ cannot all be $C(R_5)$.

When $X_5$ to $X_{10}$ and $X_{12}$ to $X_{15}$ are all $C(R_5)$, $X_{11}$ is not $C(R_6)(C_7)$.

C may be selected from the group consisting of the following Chemical Formulas 4 to 7:

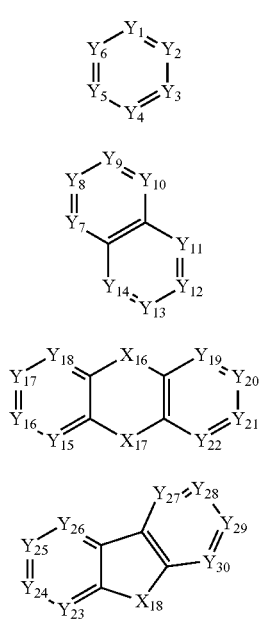

[Chemical Formula 4]

[Chemical Formula 5]

[Chemical Formula 6]

[Chemical Formula 7]

wherein, 4 groups of $Y_1$ to $Y_6$ are moieties bonded to adjacent groups, those groups of $Y_1$ to $Y_6$, that are not bonded to the adjacent groups, are the same as or different from each other, and are each independently selected from the group consisting of $C(R_9)$, N, S, and O, 2 groups of $Y_7$ to $Y_{10}$ are moieties bonded to adjacent groups, those groups of $Y_7$ to $Y_{10}$, that are not bonded to the adjacent groups, are the same as or different from each other, and are each independently selected from the group consisting of $C(R_{10})$, N, S, and O, 2 groups of $Y_{11}$ to $Y_{14}$ are moieties bonded to adjacent groups, those groups of $Y_{11}$ to $Y_{14}$, that are not bonded to the adjacent groups, are the same as or different from each other, and are each independently selected from the group consisting of $C(R_{11})$, N, S, and O, 2 groups of $Y_{15}$ to $Y_{18}$ are moieties bonded to adjacent groups, those groups of $Y_{15}$ to $Y_{18}$, that are not bonded to the adjacent groups, are the same as or different from each other, and are each independently selected from the group consisting of $C(R_{12})$, N, S, and O, 2 groups of $Y_{19}$ to $Y_{22}$ are moieties bonded to adjacent groups, those groups of $Y_{19}$ to $Y_{22}$, that are not bonded to the adjacent groups, are the same as or different from each other, and are each independently selected from the group consisting of $C(R_{13})$, N, S, and O, 2 groups of $Y_{23}$ to $Y_{26}$ are moieties bonded to adjacent groups, those groups of $Y_{23}$ to $Y_{26}$, that are not bonded to the adjacent groups, are the same as or different from each other, and are each independently selected from the group consisting of $C(R_{14})$, N, S, and O, 2 groups of $Y_{27}$ to $Y_{30}$ are moieties bonded to adjacent groups, those groups of $Y_{27}$ to $Y_{30}$, that are not bonded to adjacent groups, are the same as or different from each other, and are each independently selected from the group consisting of $C(R_{15})$, N, S, and O, $X_{16}$ to $X_{18}$ are the same as or different from each other, and are each independently selected from the group consisting of $C(R_{16})(C_{17})$ $N(R_{18})$, S, and O, and $R_9$ to $R_{18}$ may be the same as or different from each other, may be each independently selected from the group consisting of hydrogen, a cyano group, a trifluoromethyl group, a nitro group, a halogen group, a hydroxy group, a substituted or unsubstituted $C_1$-$C_4$ alkylthio group, a substituted or unsubstituted $C_1$-$C_{30}$ alkyl group, a substituted or unsubstituted $C_1$-$C_{20}$ cycloalkyl group, a substituted or unsubstituted $C_2$-$C_{30}$ alkenyl group, a substituted or unsubstituted $C_2$-$C_{24}$ alkynyl group, a substituted or unsubstituted $C_7$-$C_{30}$ aralkyl group, a substituted or unsubstituted $C_6$-$C_{30}$ aryl group, a substituted or unsubstituted $C_2$-$C_{60}$ heteroaryl group, a substituted or unsubstituted $C_6$-$C_{30}$ heteroarylalkyl group, a substituted or unsubstituted $C_1$-$C_{30}$ alkoxy group, a substituted or unsubstituted $C_1$-$C_{30}$ alkylamino group, a substituted or unsubstituted $C_6$-$C_{30}$ arylamino group, a substituted or unsubstituted $C_6$-$C_{30}$ aralkylamino group, a substituted or unsubstituted $C_2$-$C_{24}$ heteroarylamino group, a substituted or unsubstituted $C_1$-$C_{30}$ alkylsilyl group, a substituted or unsubstituted $C_6$-$C_{30}$ arylsilyl group, and a substituted or unsubstituted $C_6$-$C_{30}$ aryloxy group, and may combine with an adjacent group to form a substituted or unsubstituted ring.

A and E may be the same as or different from each other, and may be each independently a compound selected from the group consisting of the following Chemical Formulas 8 to 11:

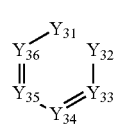

[Chemical Formula 8]

[Chemical Formula 8]

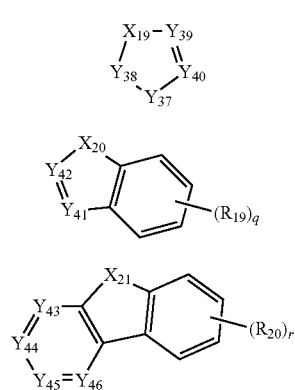

[Chemical Formula 10]

[Chemical Formula 11]

wherein, q and r are an integer of 0 to 4, 2 groups of $Y_{31}$ to $Y_{36}$ are moieties bonded to adjacent groups, those groups of $Y_{31}$ to $Y_{36}$, that are not bonded to the adjacent groups, are the same as or different from each other, and are each independently selected from the group consisting of $C(R_{21})$, N, S, and O, 2 groups of $Y_{37}$ to $Y_{40}$ are moieties bonded to adjacent groups, those groups of $Y_{37}$ to $Y_{40}$, that are not bonded to the adjacent groups, are the same as or different from each other, and are each independently selected from the group consisting of $C(R_{22})$, N, S, and O, $Y_{41}$ and $Y_{42}$ are moieties bonded to adjacent groups, 2 groups of $Y_{43}$ to $Y_{46}$ are moieties bonded to adjacent groups, those groups of $Y_{43}$ to $Y_{46}$, that are not bonded to the adjacent groups, are the same as or different from each other, and are each independently selected from the group consisting of $C(R_{23})$, N, S, and O, $X_{19}$ and $X_{21}$ are the same as or different from each other, and are each independently selected from the group consisting of $C(R_{24})(R_{25})$, $N(R_{26})$, S, and O, and $R_{19}$ to $R_{26}$ may be the same as or different from each other, may be each independently selected from the group consisting of hydrogen, a cyano group, a trifluoromethyl group, a nitro group, a halogen group, a hydroxy group, a substituted or unsubstituted $C_1$-$C_4$ alkylthio group, a substituted or unsubstituted $C_1$-$C_{30}$ alkyl group, a substituted or unsubstituted $C_1$-$C_{20}$ cycloalkyl group, a substituted or unsubstituted $C_2$-$C_{30}$ alkenyl group, a substituted or unsubstituted $C_2$-$C_{24}$ alkynyl group, a substituted or unsubstituted $C_7$-$C_{30}$ aralkyl group, a substituted or unsubstituted $C_6$-$C_{30}$ aryl group, a substituted or unsubstituted $C_2$-$C_{60}$ heteroaryl group, a substituted or unsubstituted $C_6$-$C_{30}$ heteroarylalkyl group, a substituted or unsubstituted $C_1$-$C_{30}$ alkoxy group, a substituted or unsubstituted $C_1$-$C_{30}$ alkylamino group, a substituted or unsubstituted $C_6$-$C_{30}$ arylamino group, a substituted or unsubstituted $C_6$-$C_{30}$ aralkylamino group, a substituted or unsubstituted $C_2$-$C_{24}$ heteroarylamino group, a substituted or unsubstituted $C_1$-$C_{30}$ alkylsilyl group, a substituted or unsubstituted $C_6$-$C_{30}$ arylsilyl group, and a substituted or unsubstituted $C_6$-$C_{30}$ aryloxy group, and may combine with an adjacent group to form a substituted or unsubstituted ring.

$Y_1$ and $Y_2$ are the same as or different from each other, and are each independently B or N.

B and D are the same as or different from each other, and are each independently a substituted or unsubstituted $C_6$-$C_{30}$ aryl group.

Although the compound represented by Chemical Formula 1 according to the present disclosure may be shown as the following compounds, the present disclosure is not limited thereto:

1

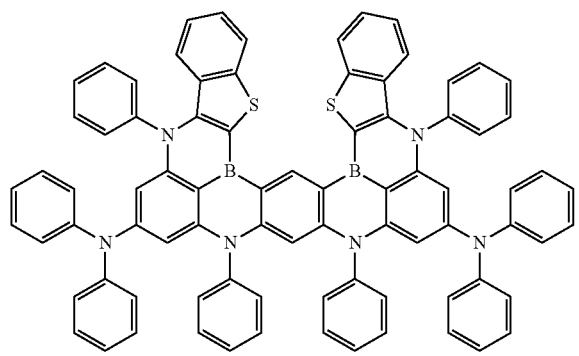

2

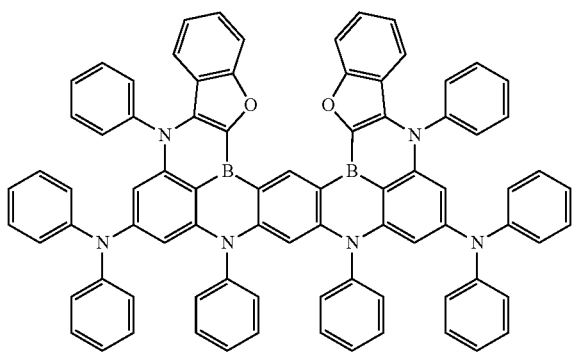

-continued
3
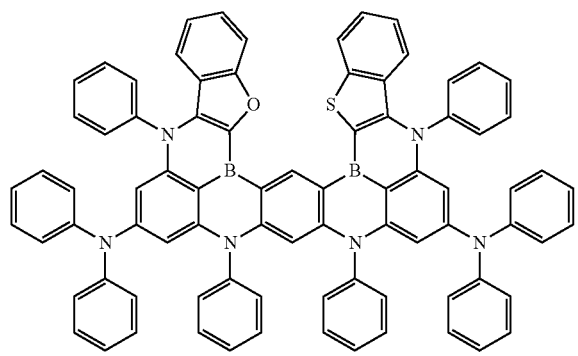
4
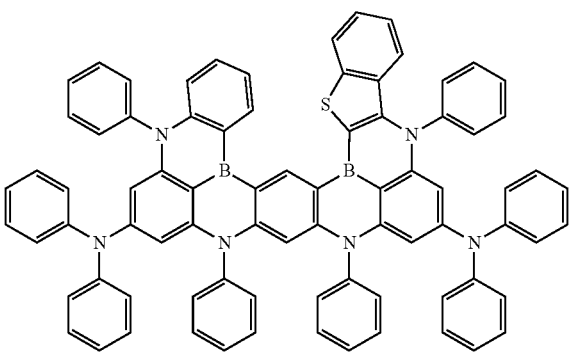
5
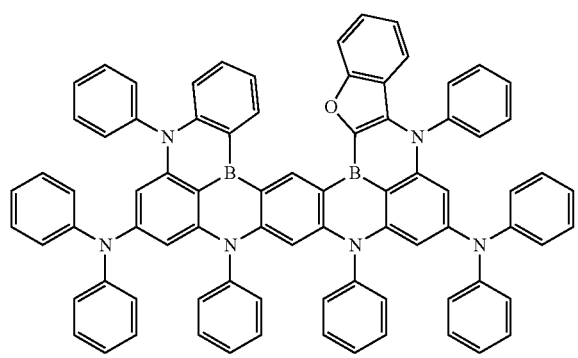
6
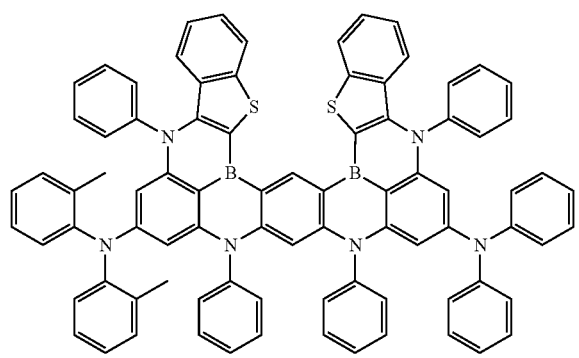
7
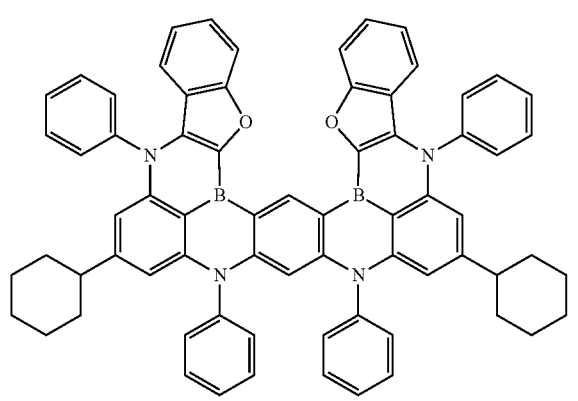
8
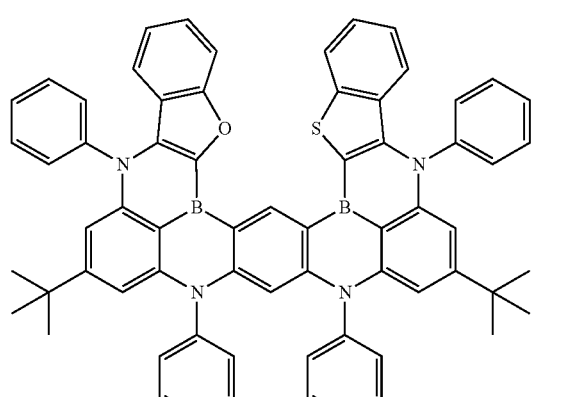
9
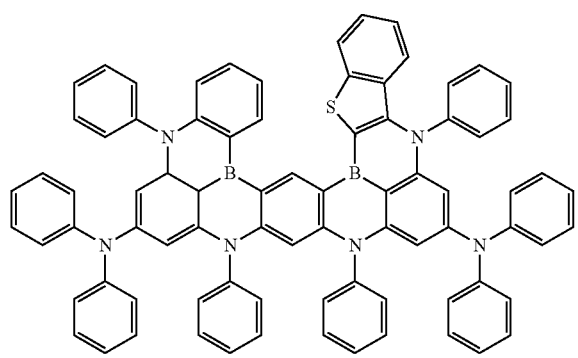
10
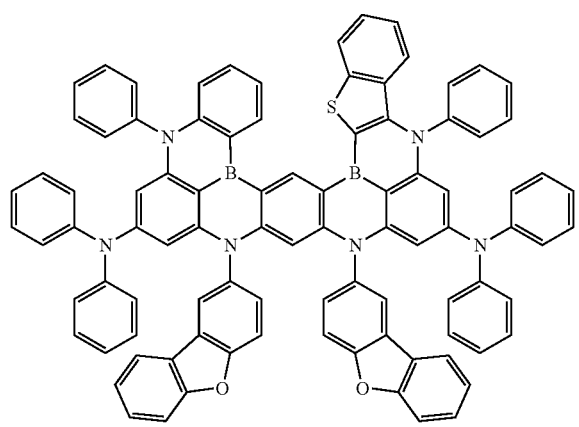

-continued
11
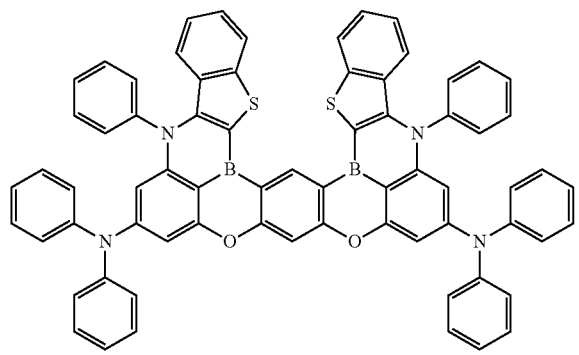
12
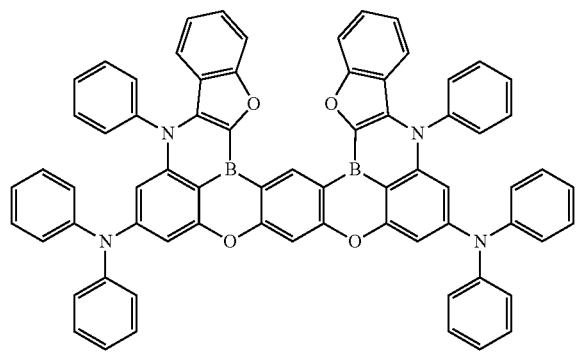
13
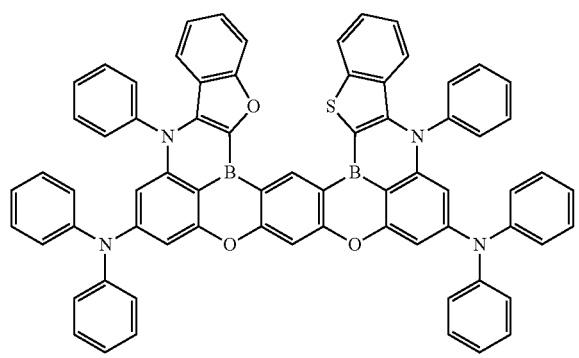
14
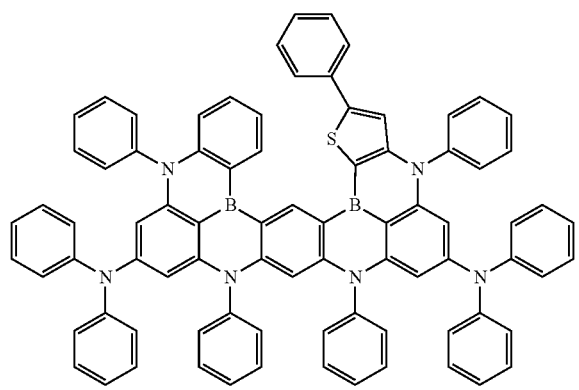
15
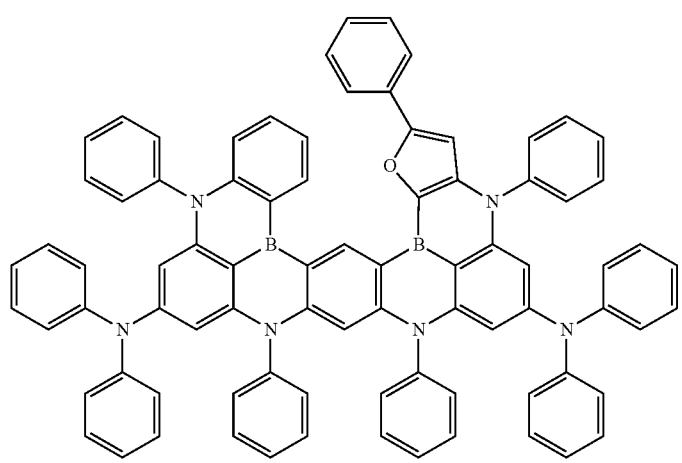

16
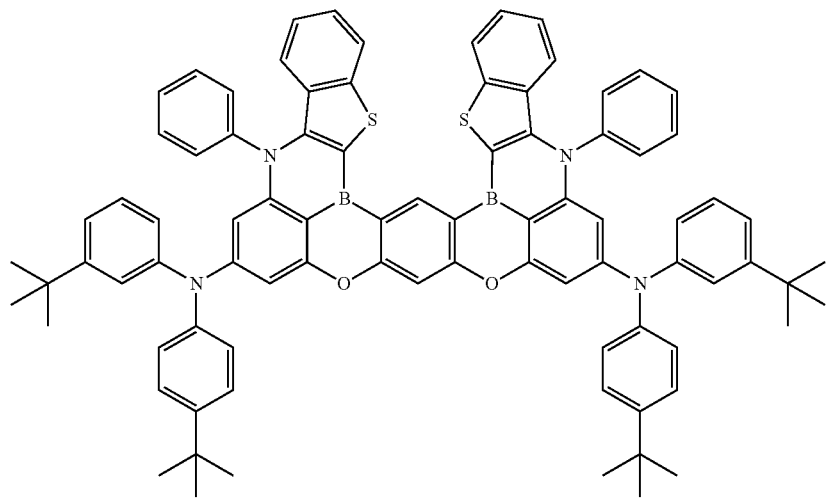
17
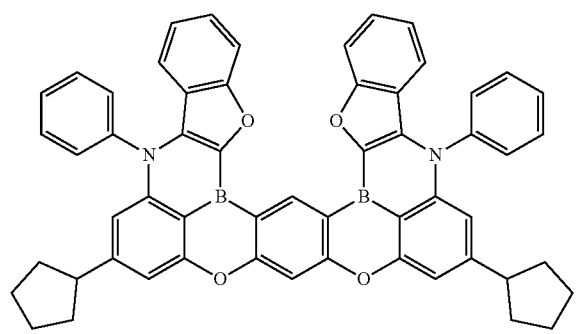
18
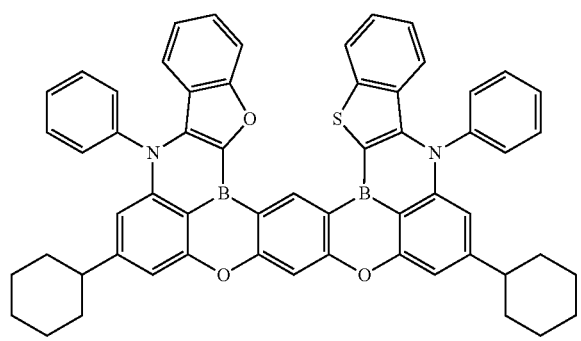
19
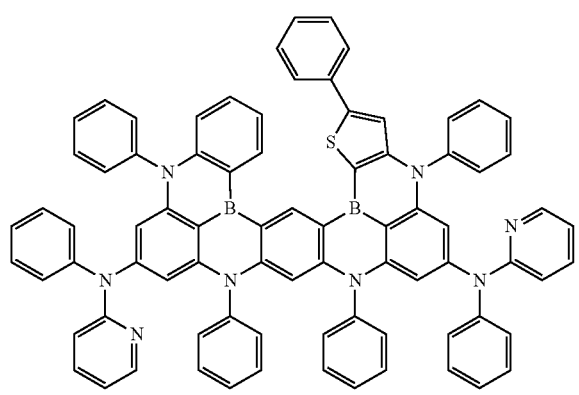
20
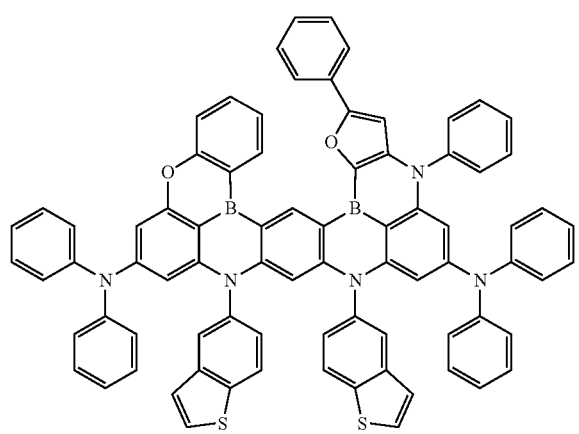
21
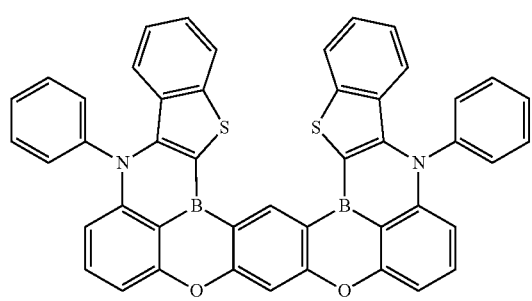
22
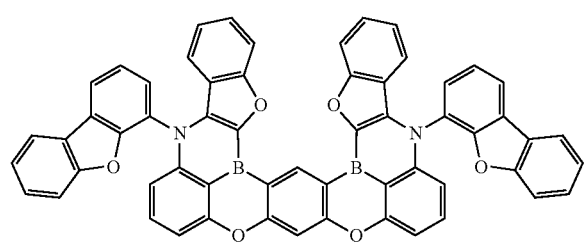

-continued
23
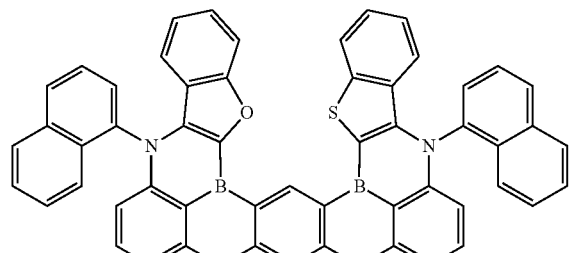
24
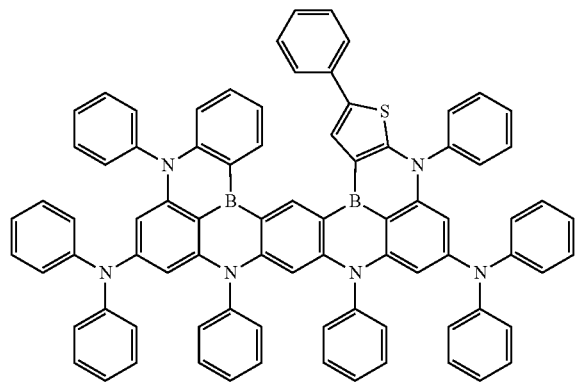
25
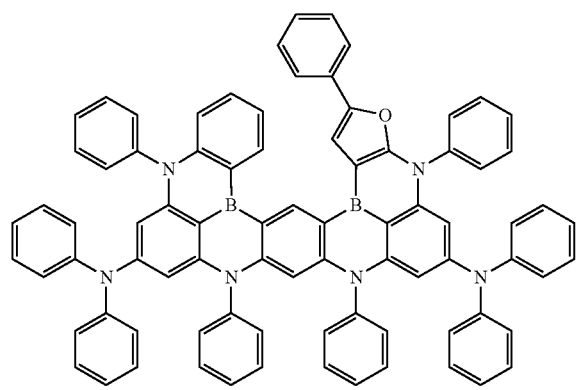
26
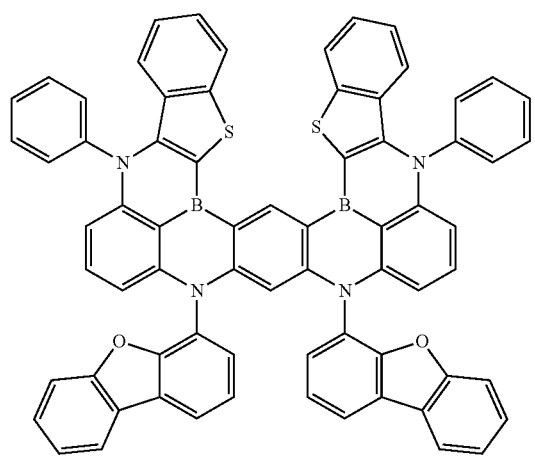
27
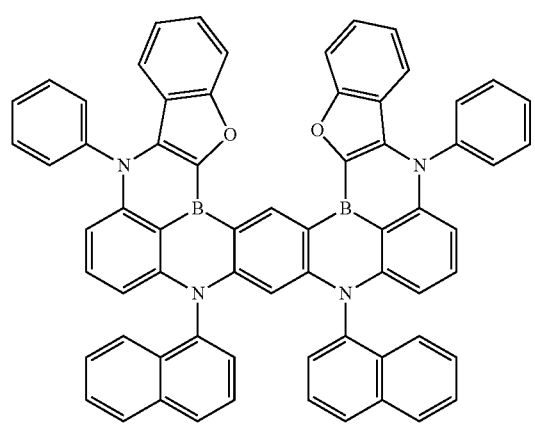
28
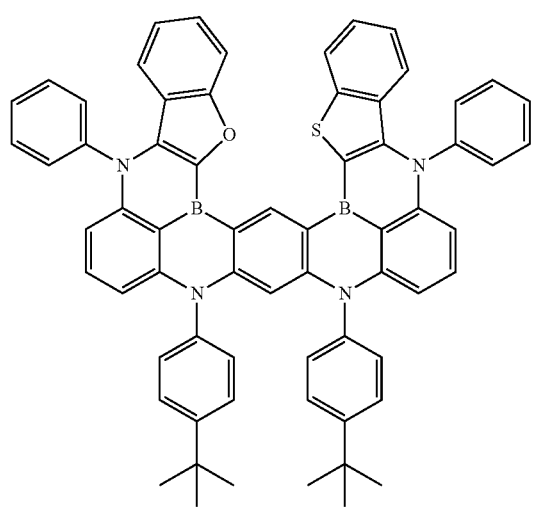

-continued
29
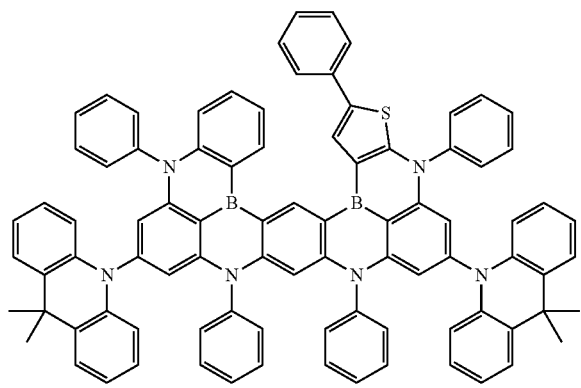
30
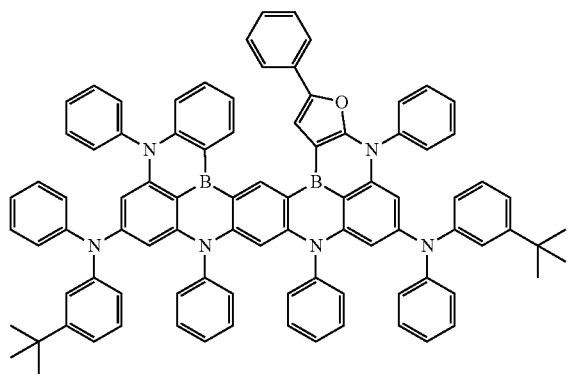
31
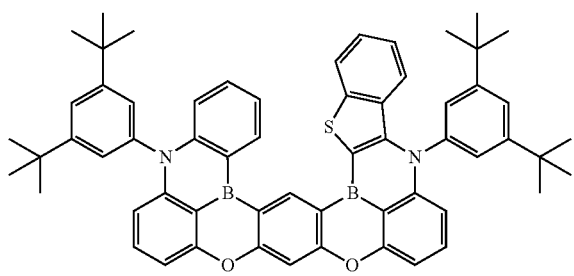
32
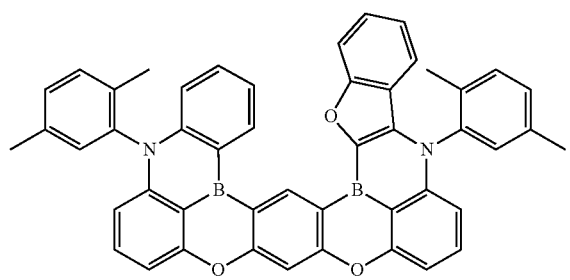
33
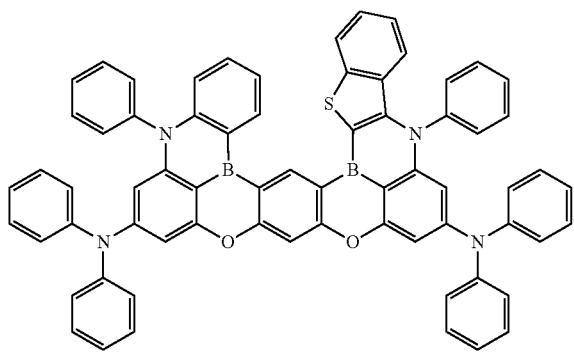
34
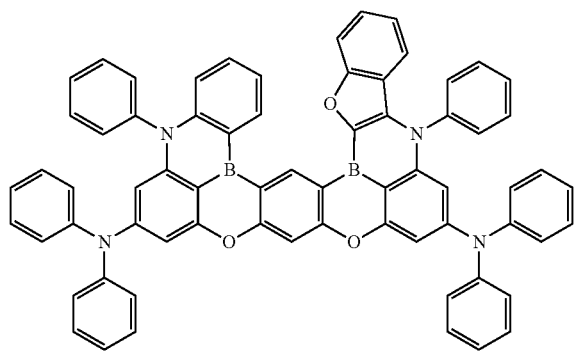
35
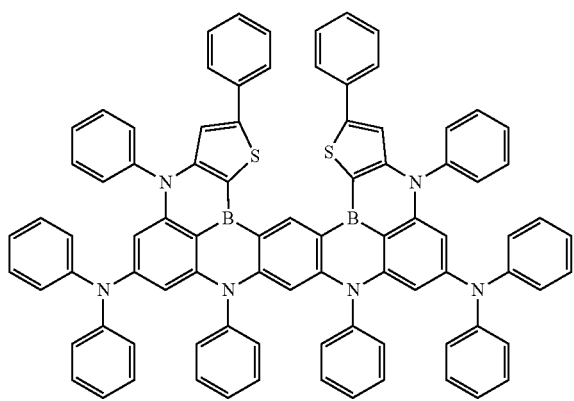
36
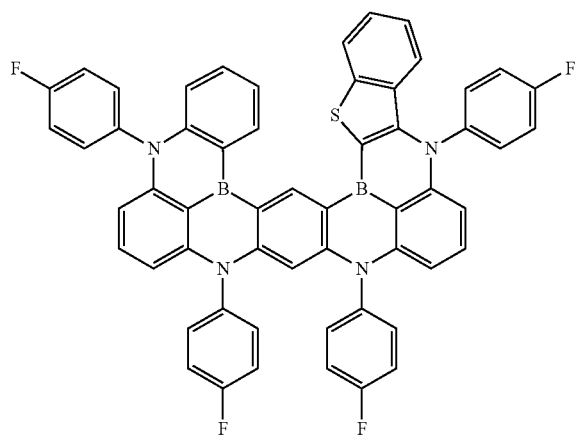

37
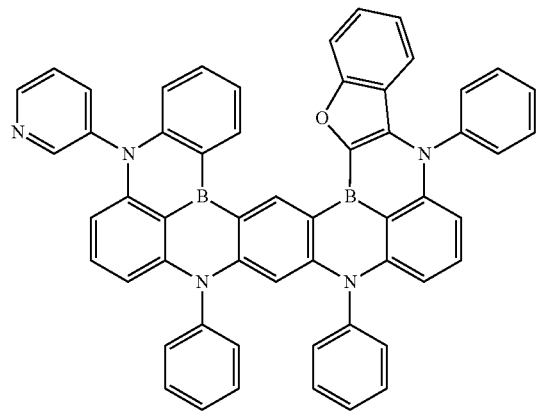
38
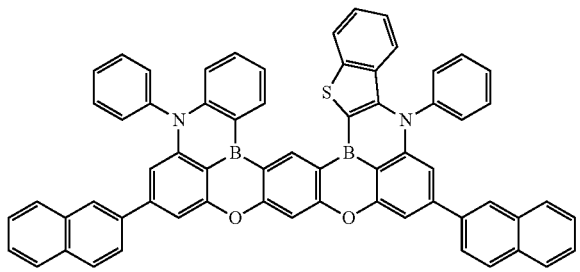
39
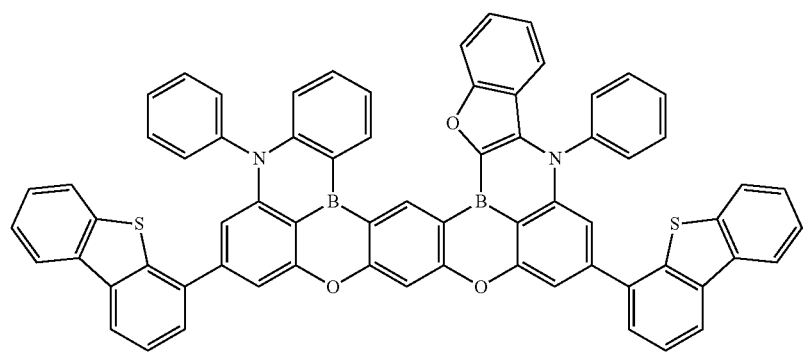
40
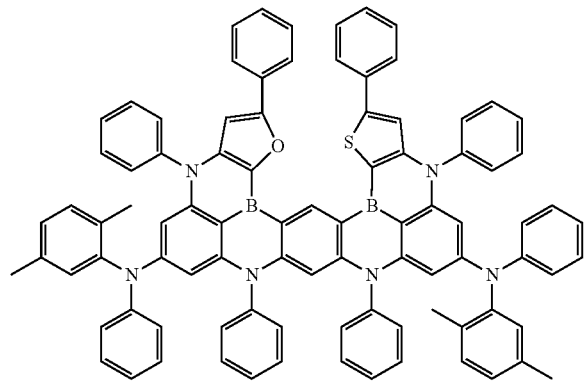
41
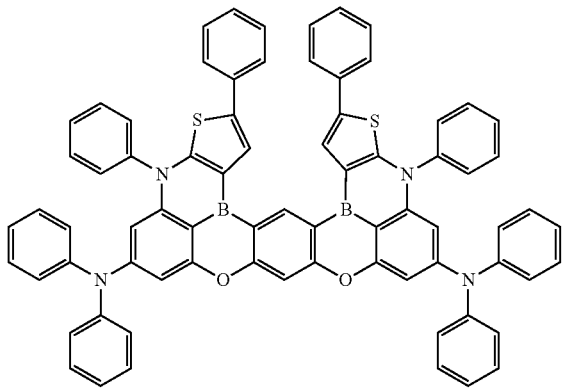

42
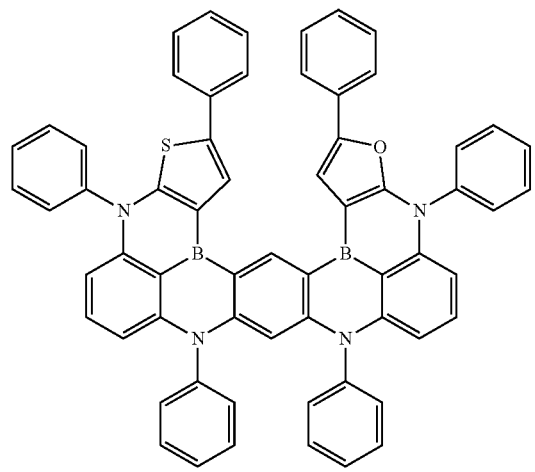
43
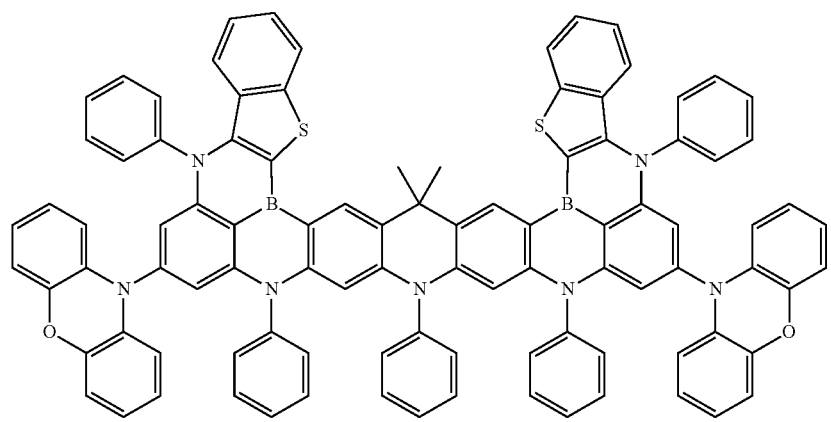
44
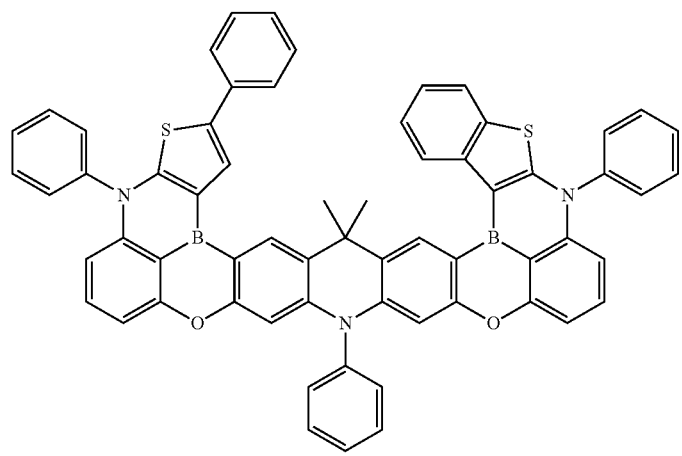

-continued
45
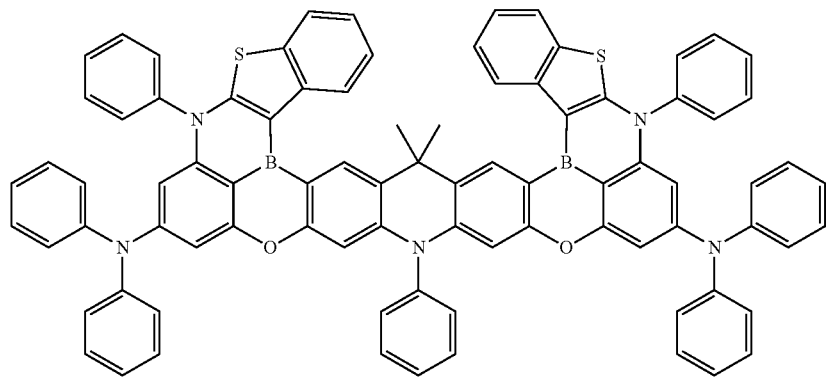
46
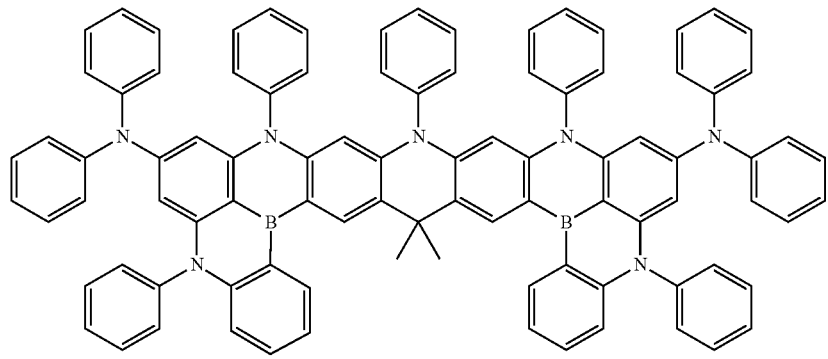
47
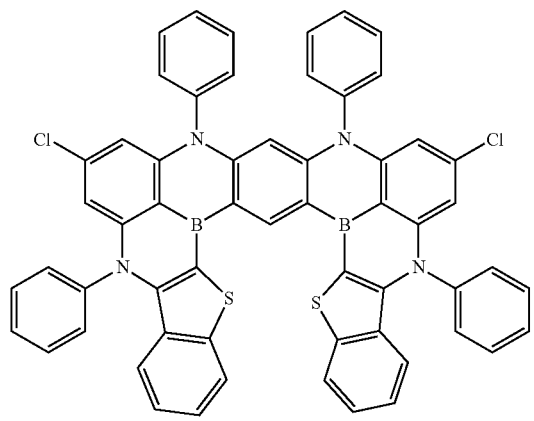
48
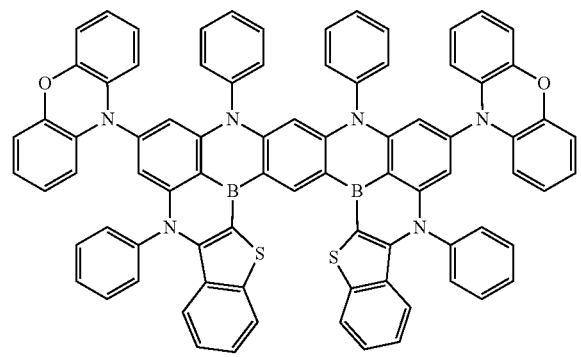
49
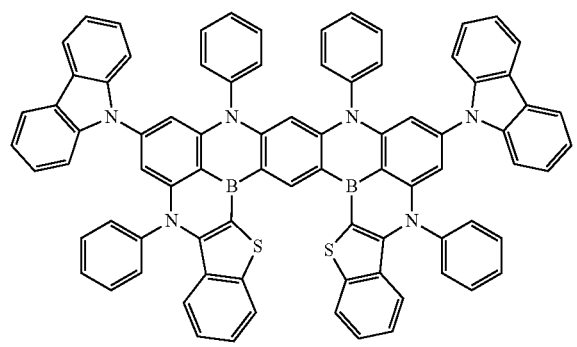
50
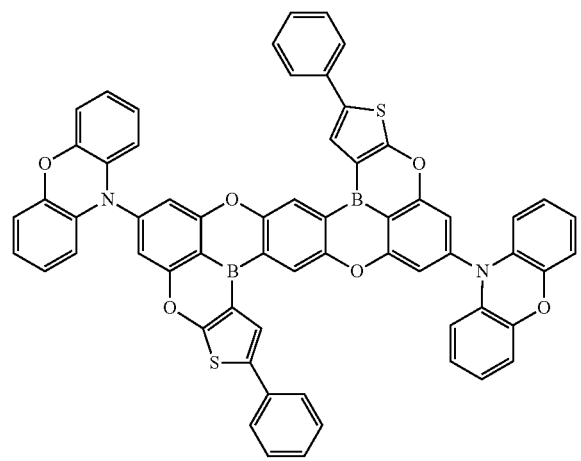

-continued
51
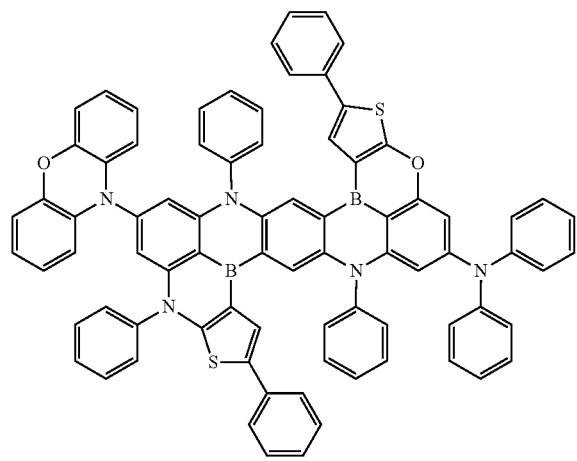
52
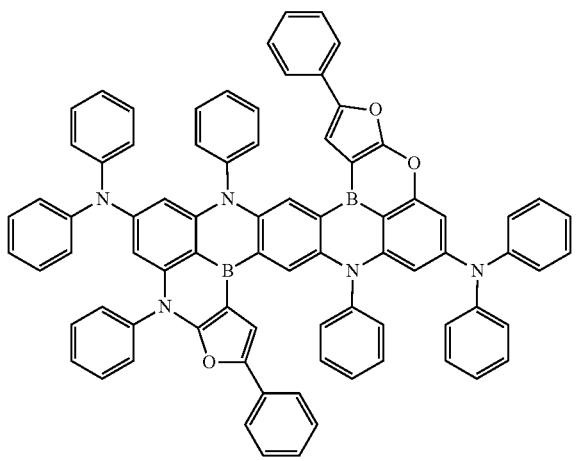
53
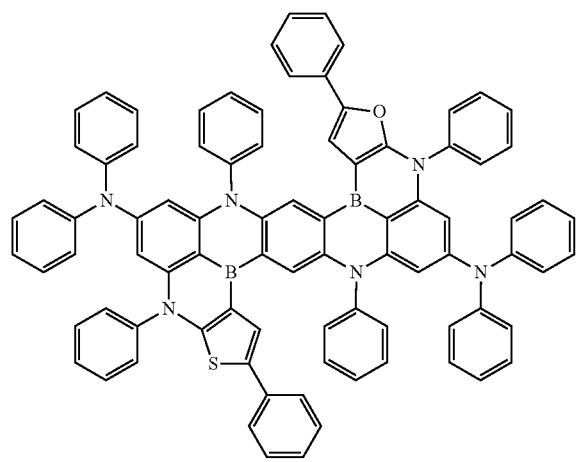
54
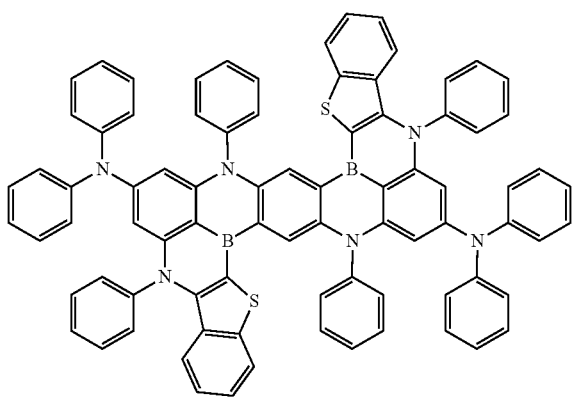
55
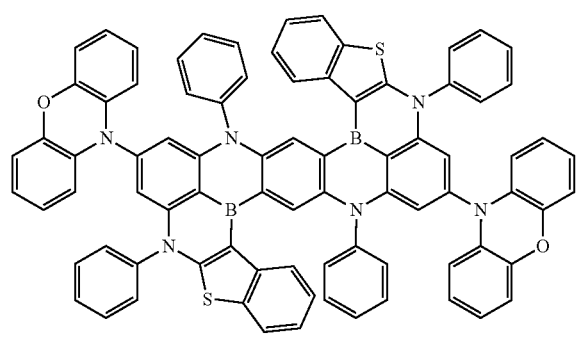
56
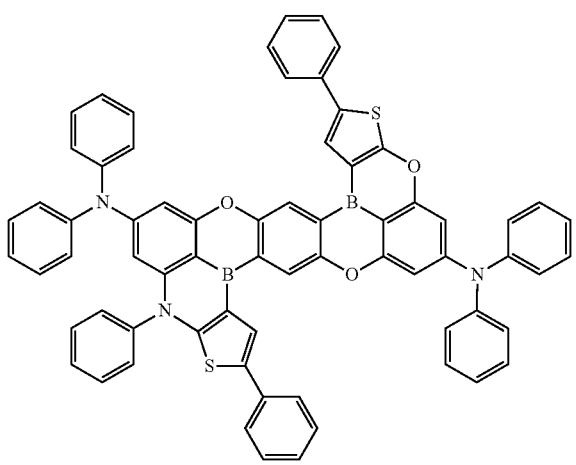

-continued
57
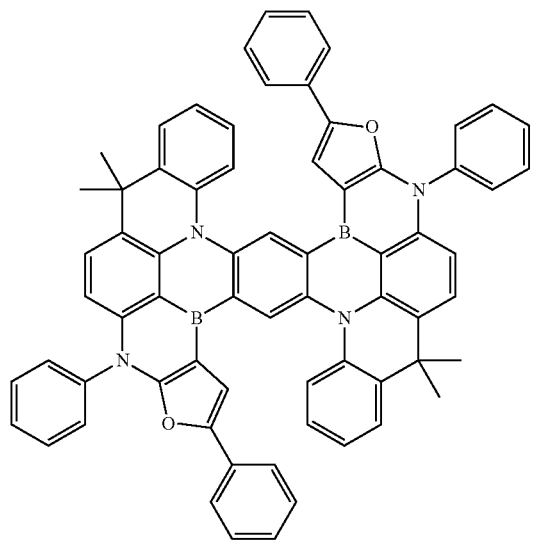
58
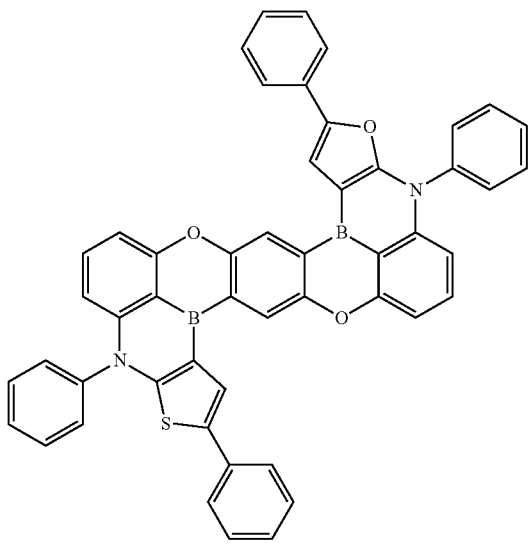
59
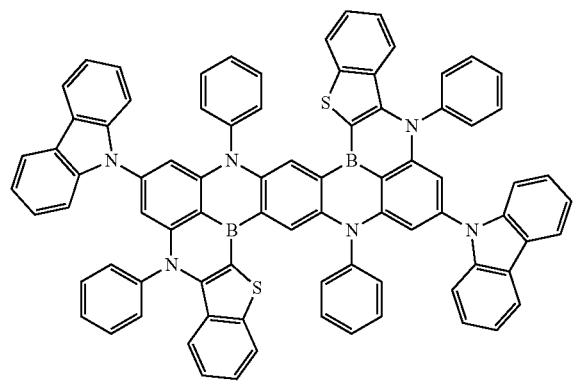
60
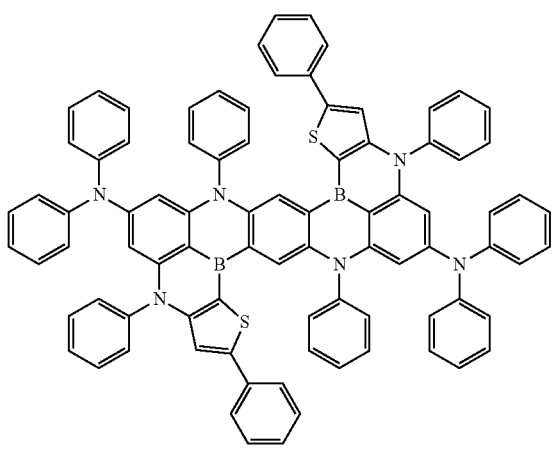
61
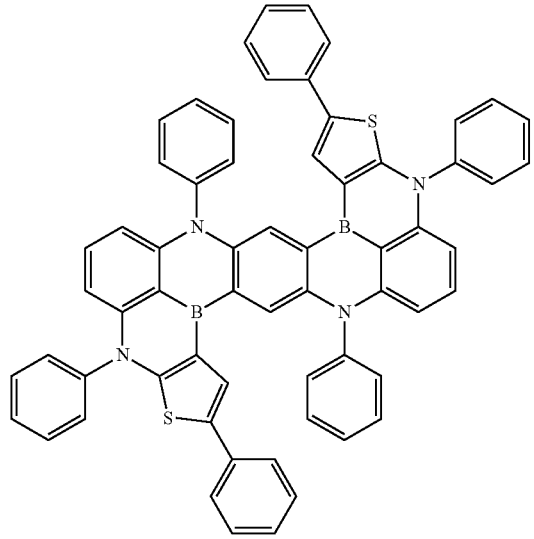
62
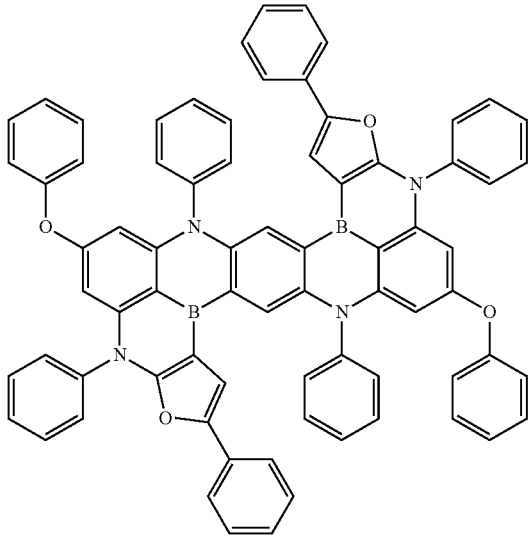

-continued
63
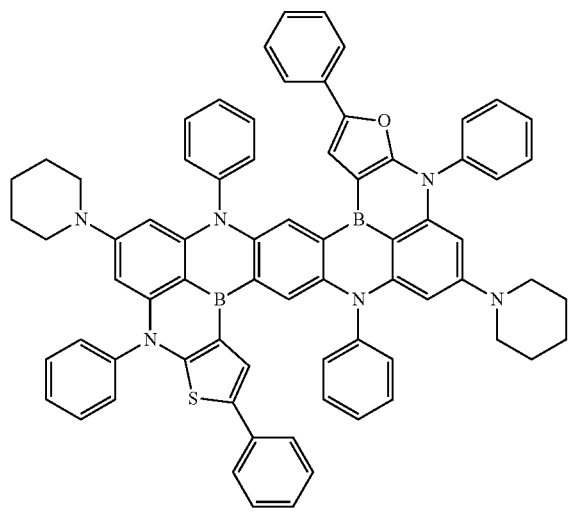
64
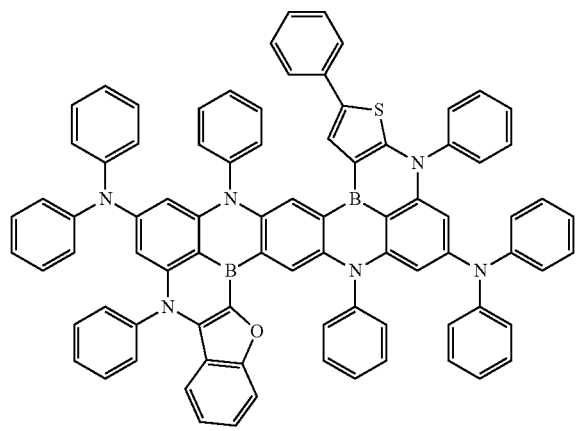
65
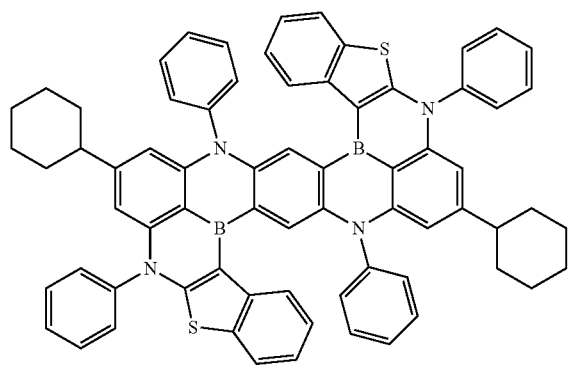
66
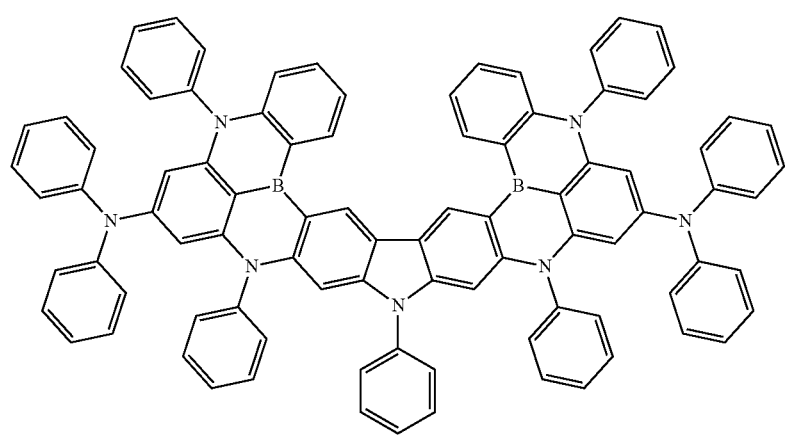

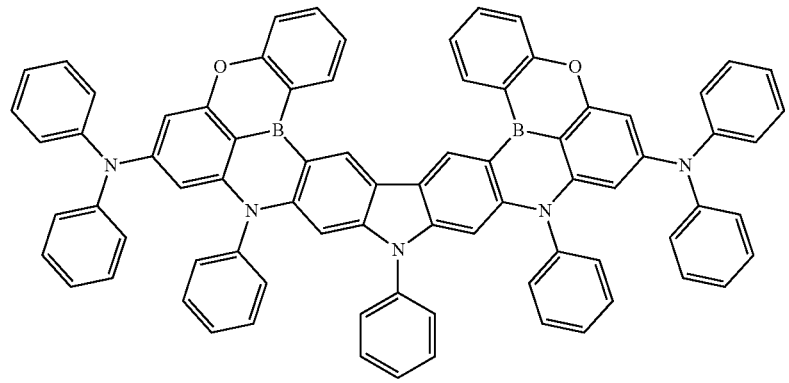
67
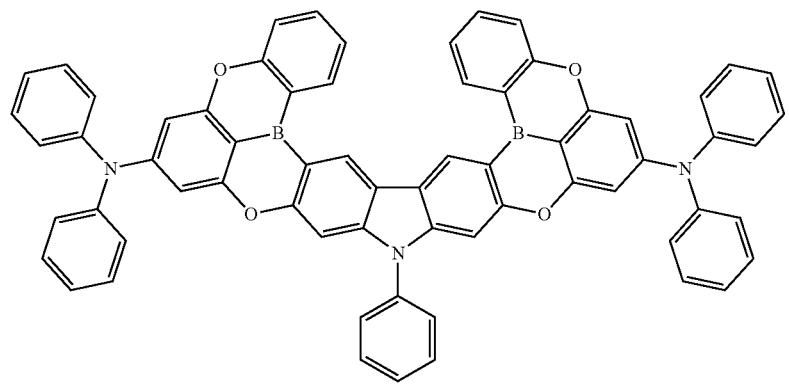
68
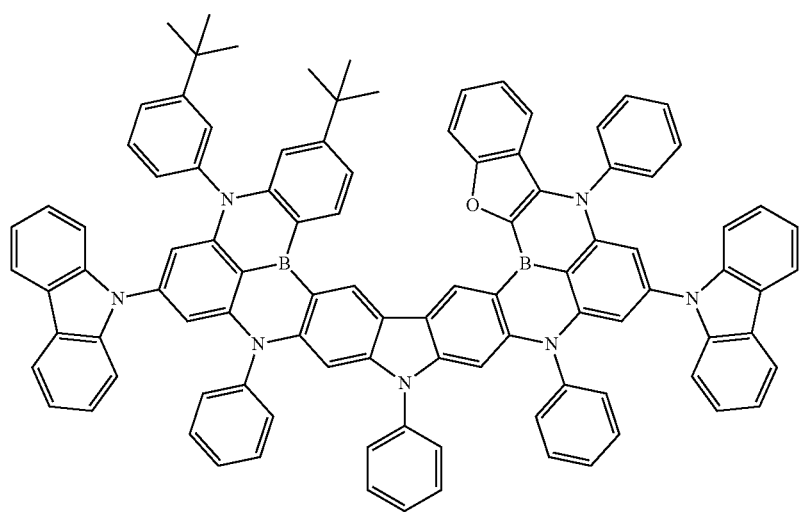
69

70
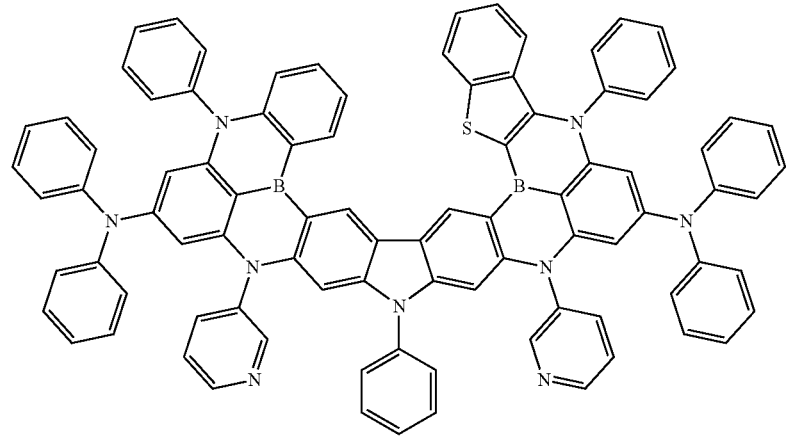
71
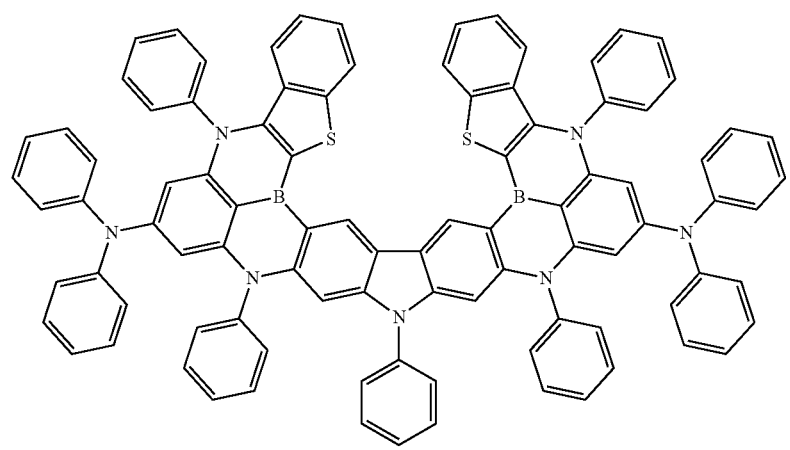
72
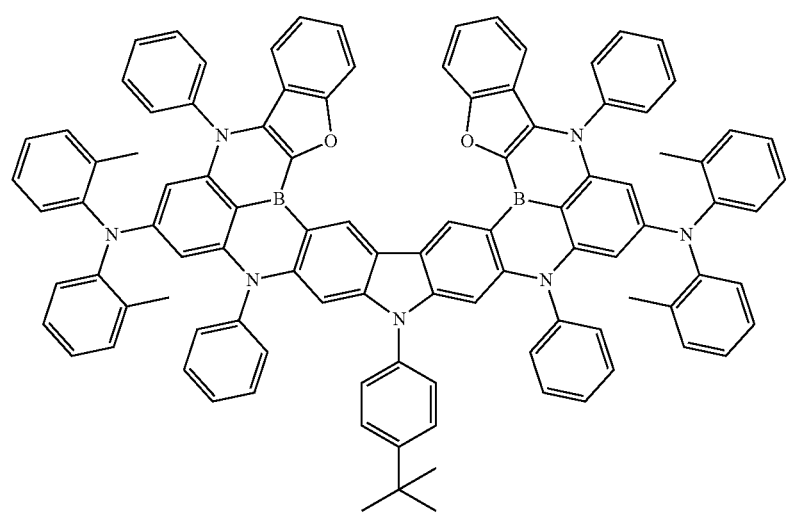

-continued
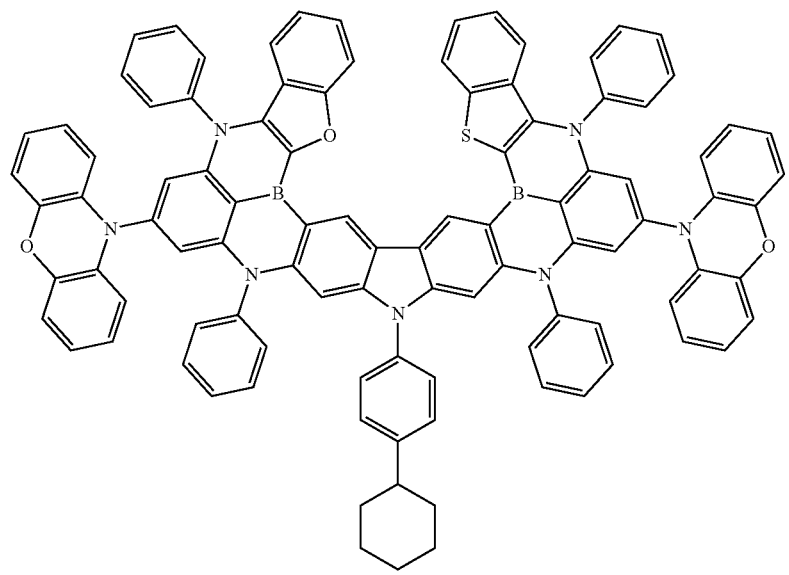
73
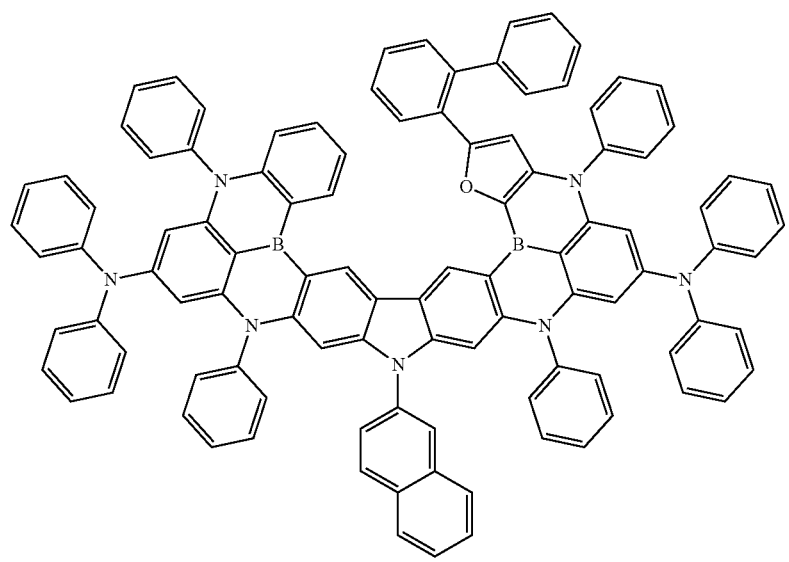
74
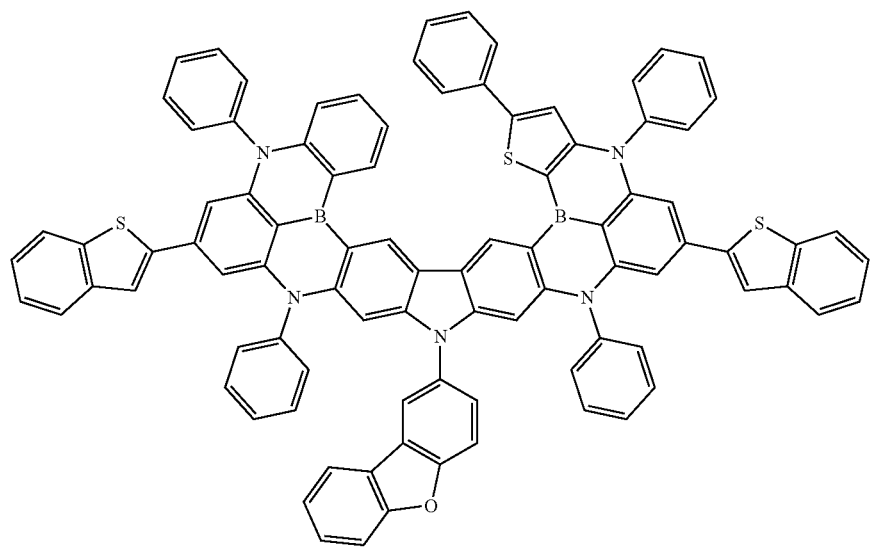
75

-continued
76
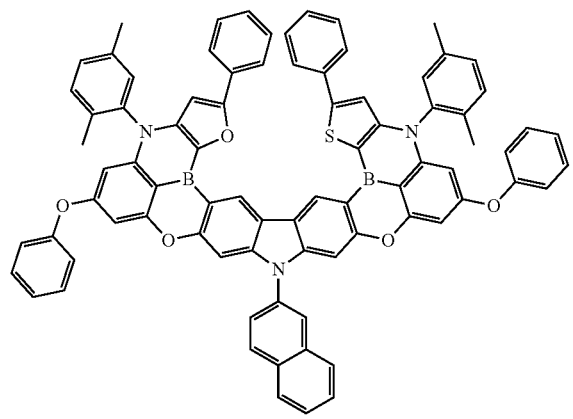
77
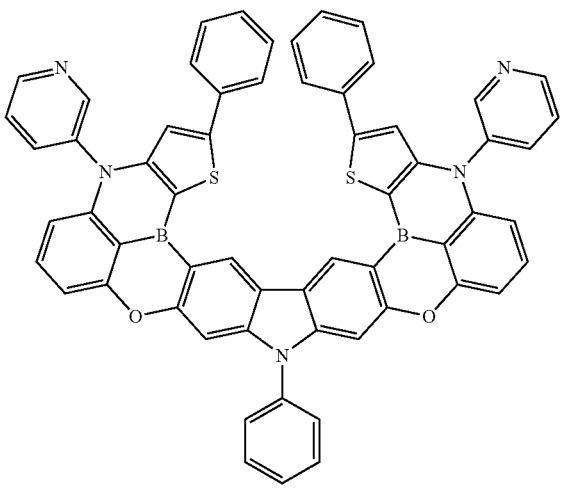
78
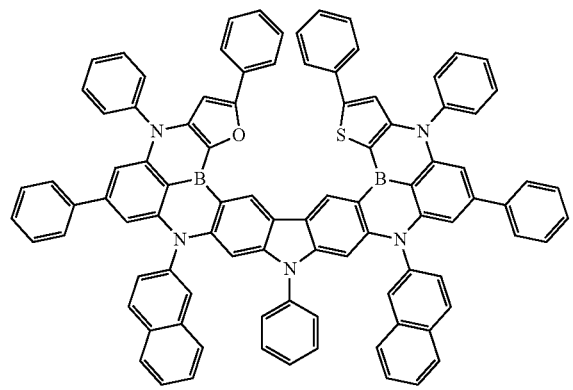
79
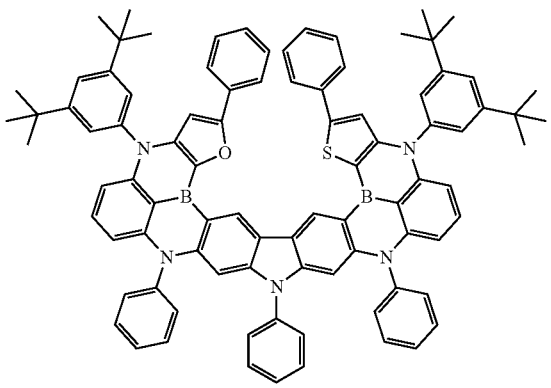
80
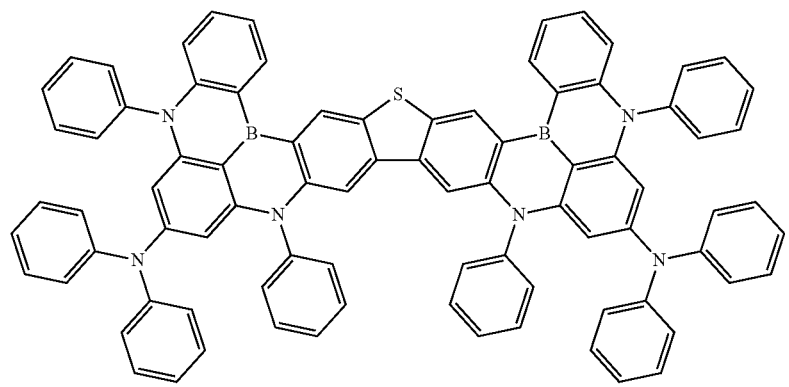

-continued
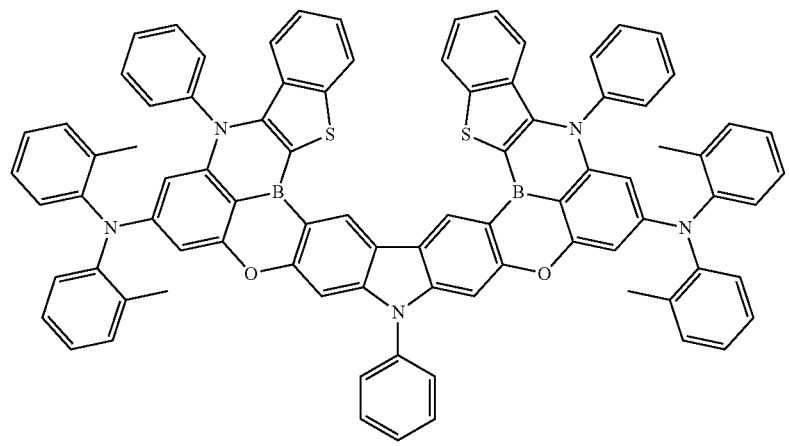
81
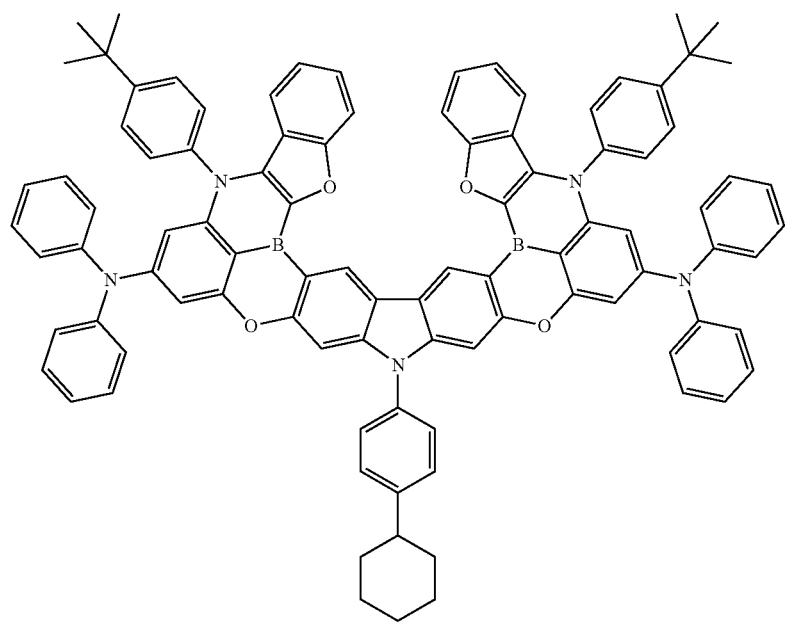
82
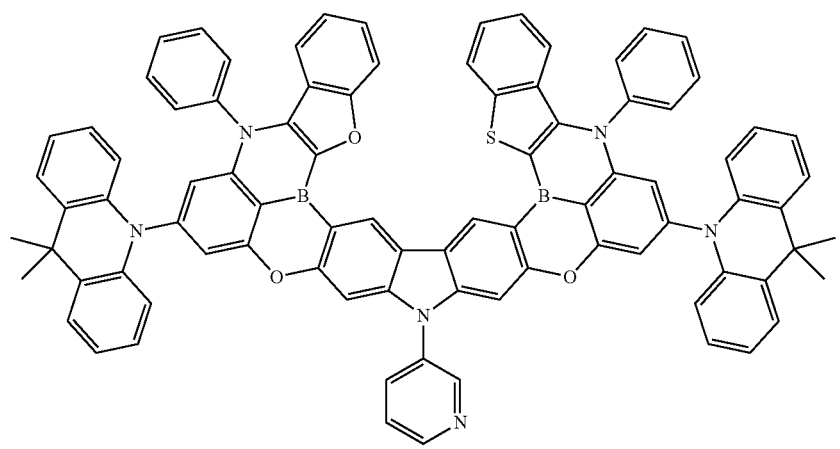
83

-continued
84
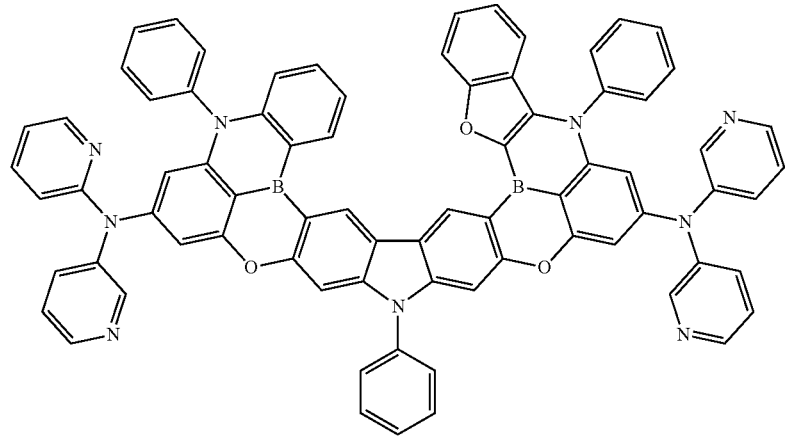
85
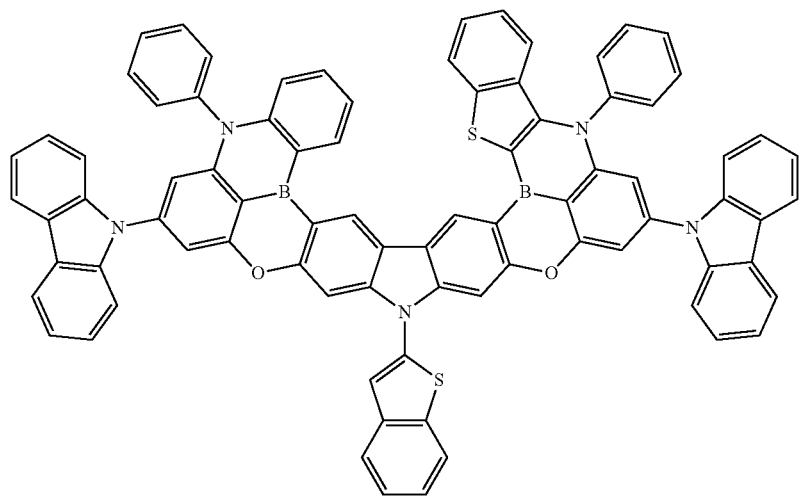
86
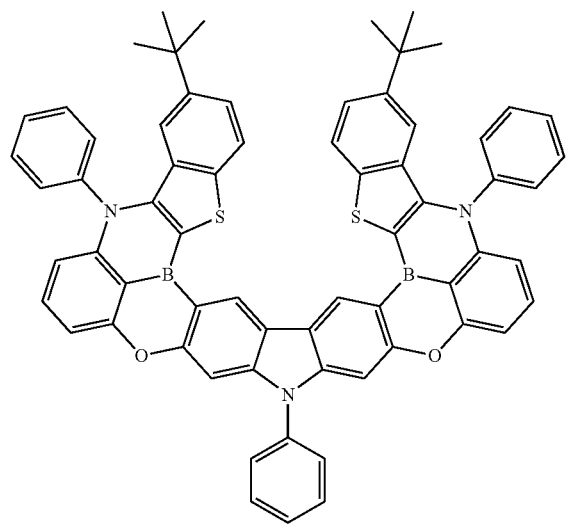
87
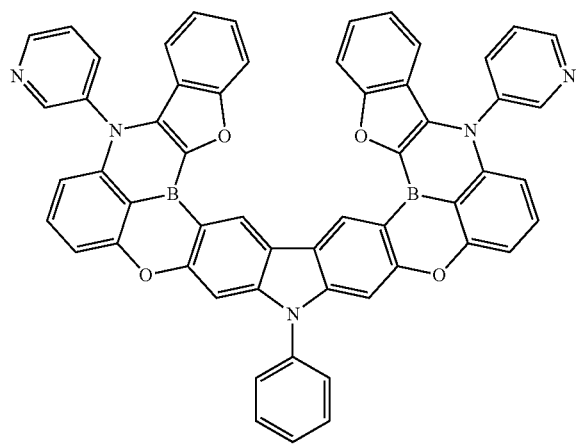

88
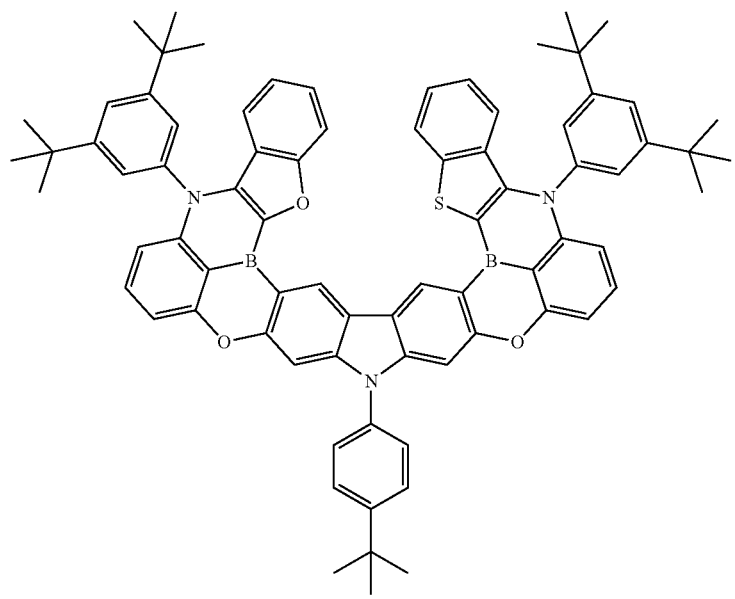
89
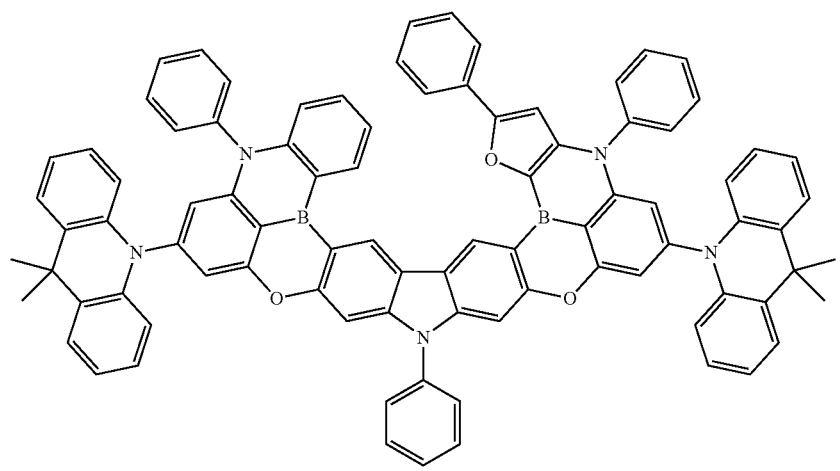
90
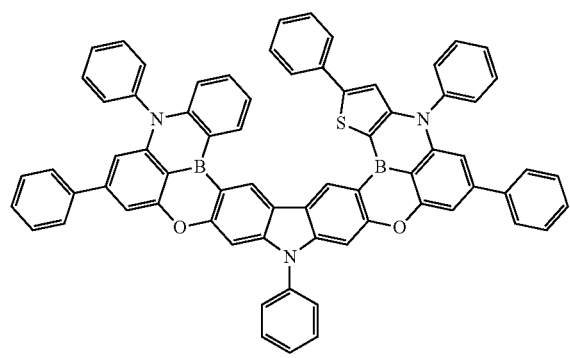
91
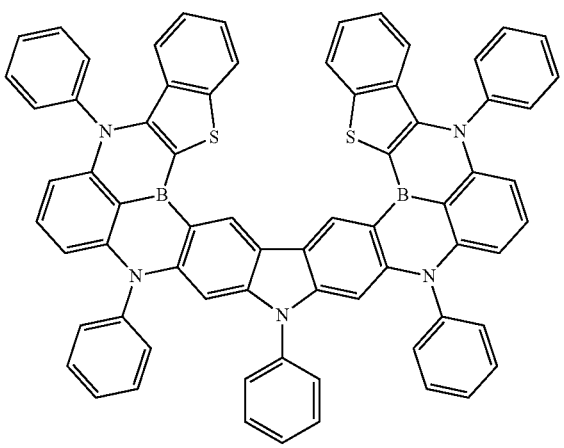

92
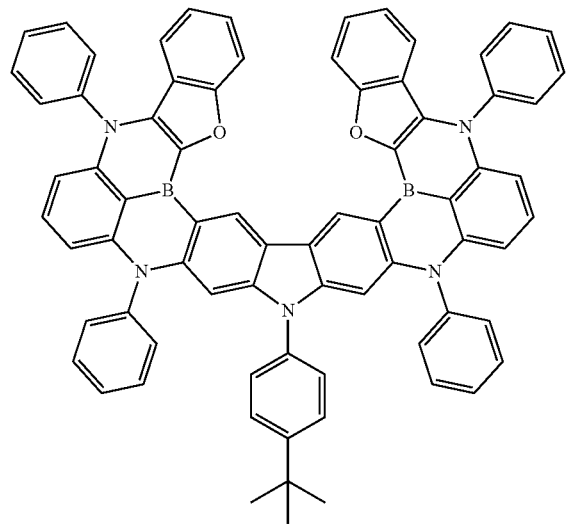
93
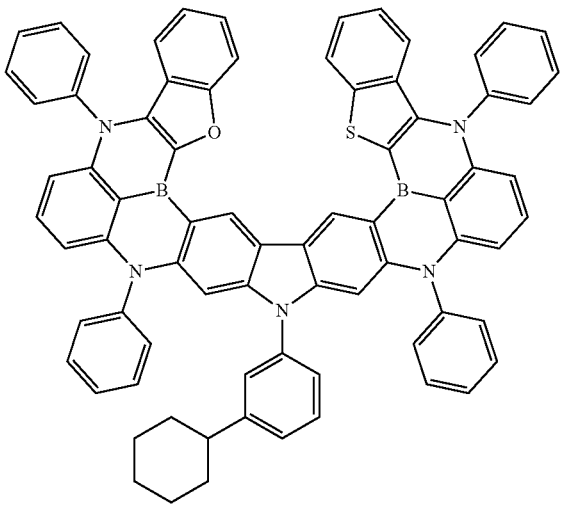
94
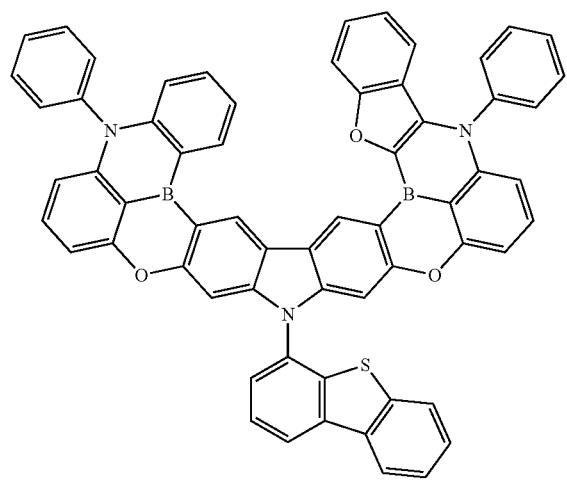
95
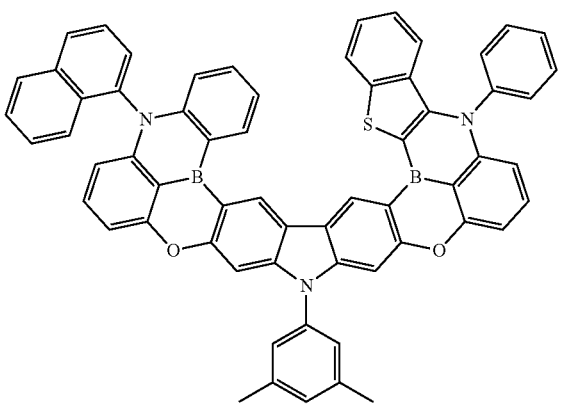
96
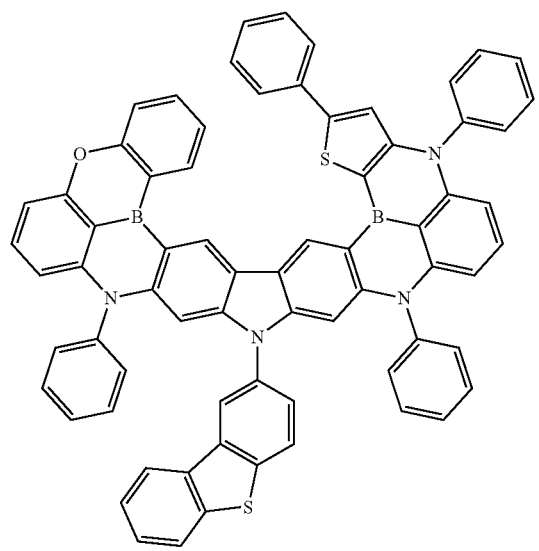
97
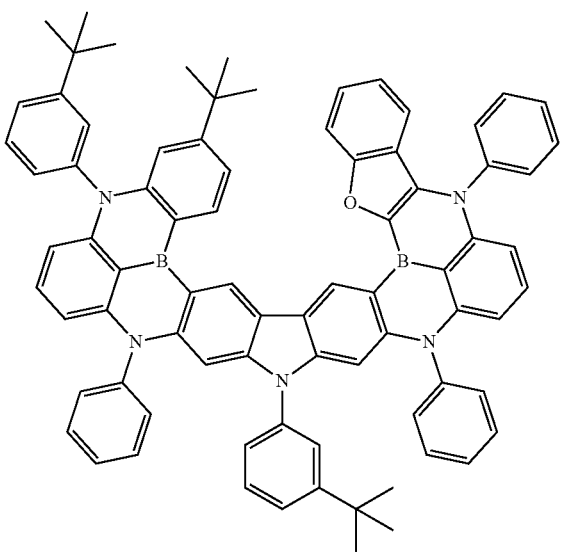

-continued
98
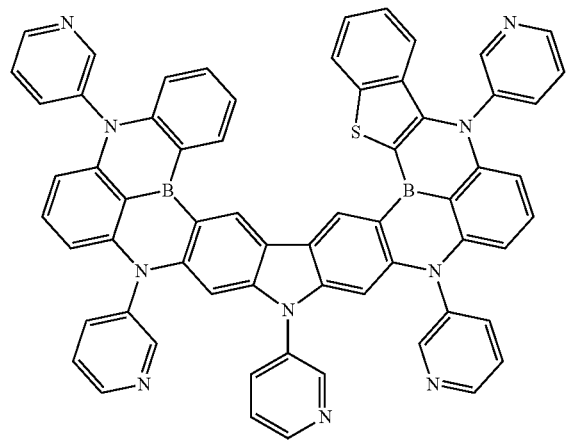
99
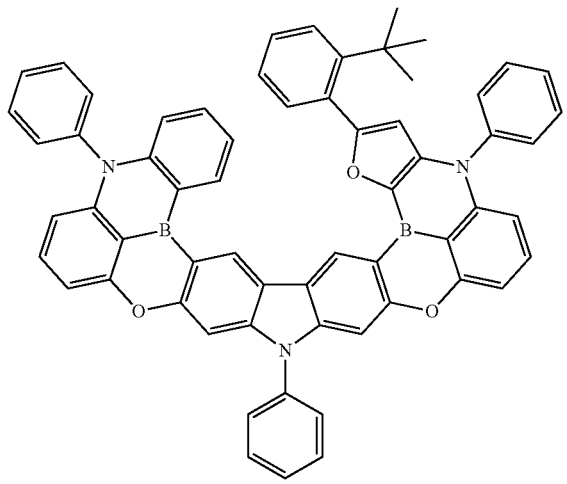
100
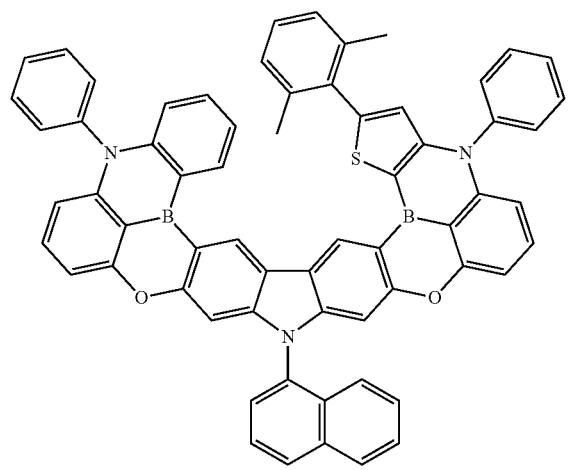
101
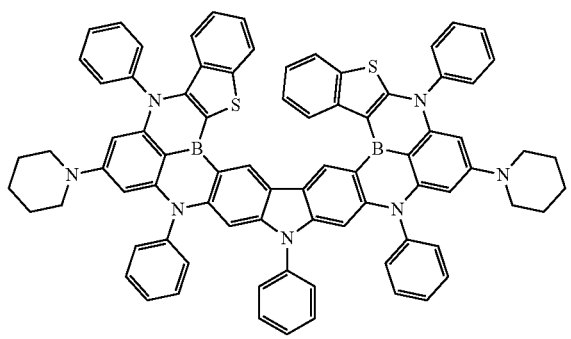
102
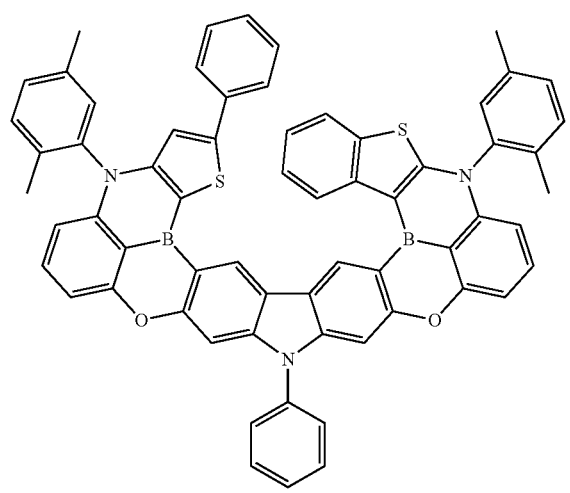
103
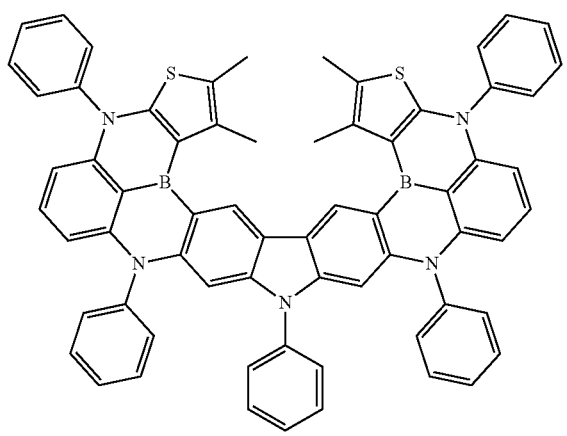

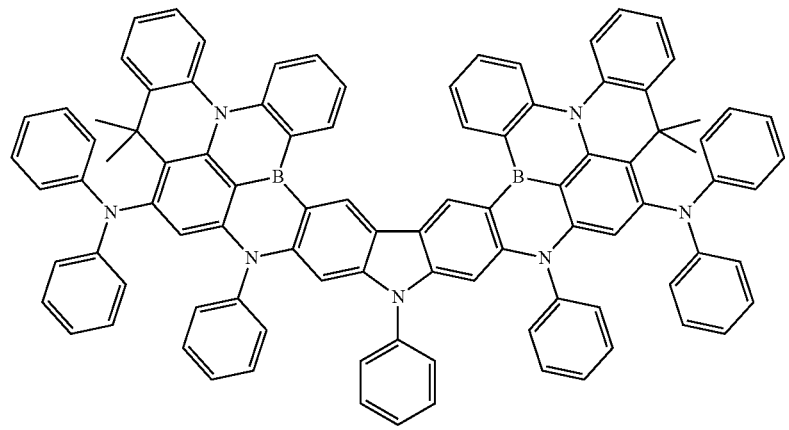
104
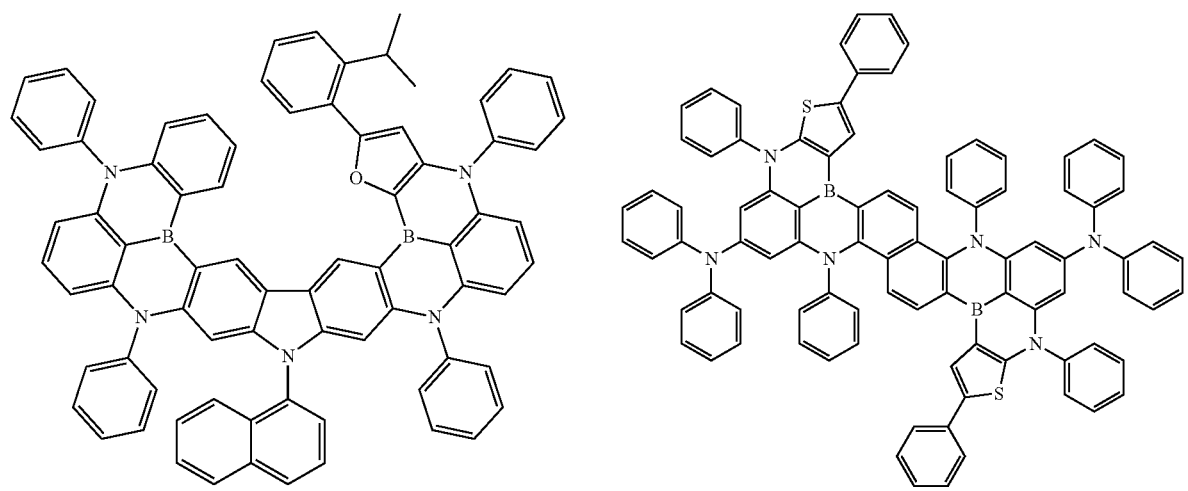
105
106
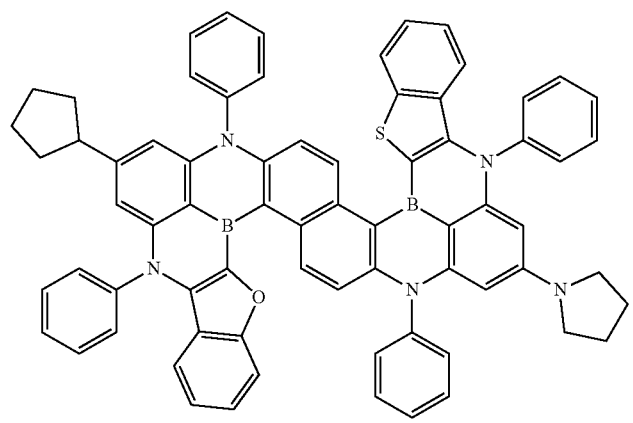
107

108
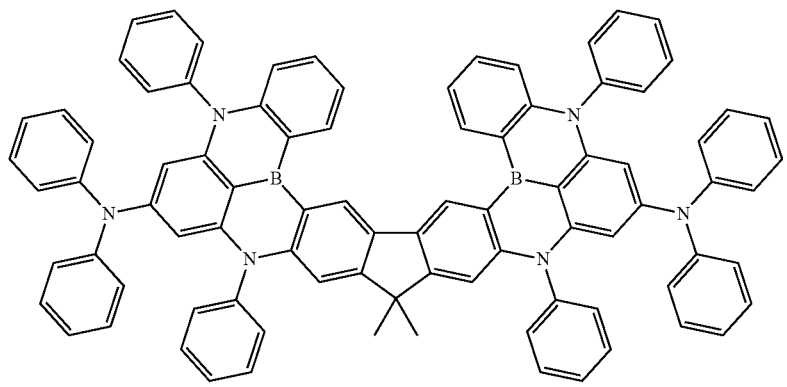
109
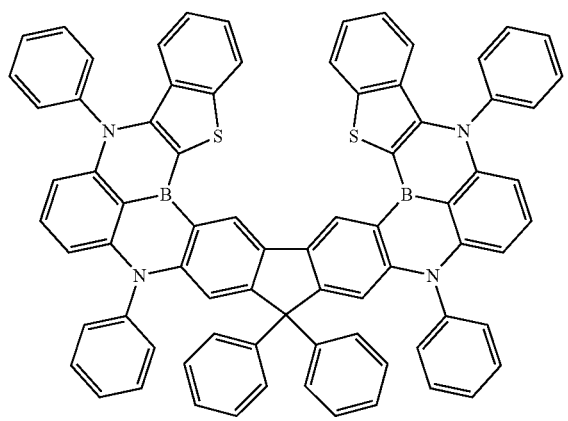
110
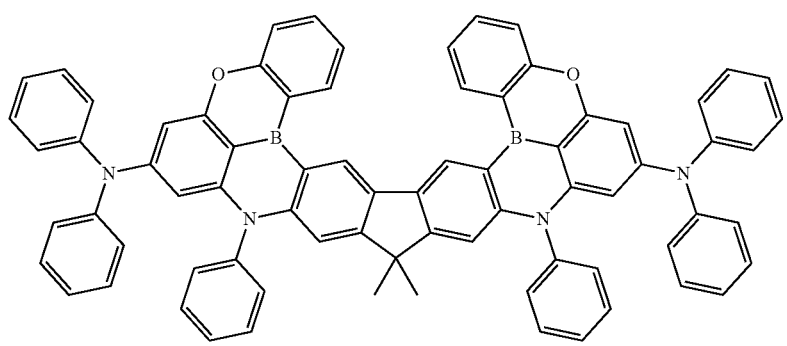
111
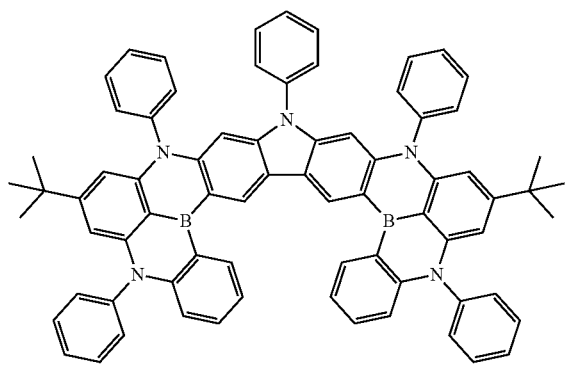
112
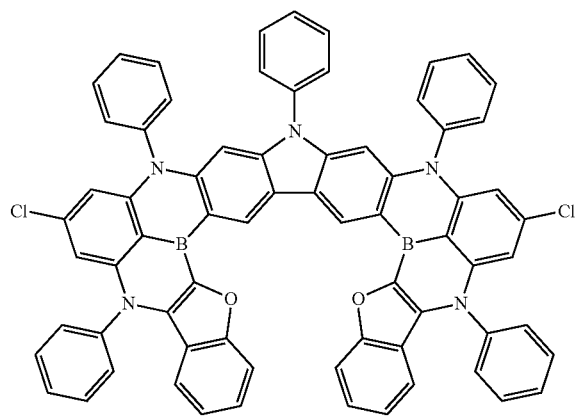

-continued
113
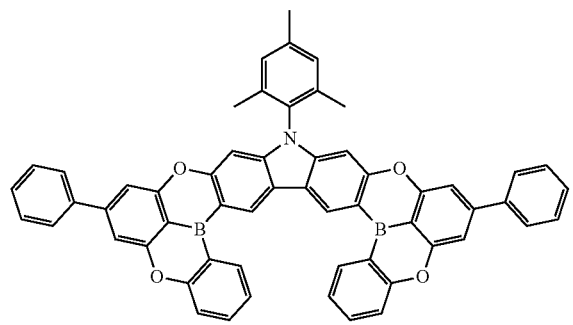
114
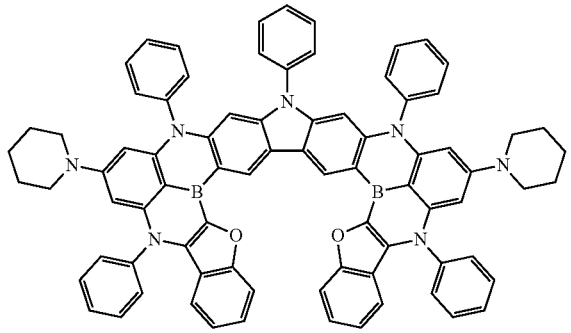
115
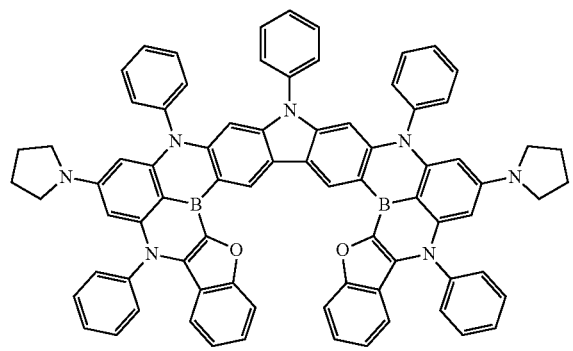
116
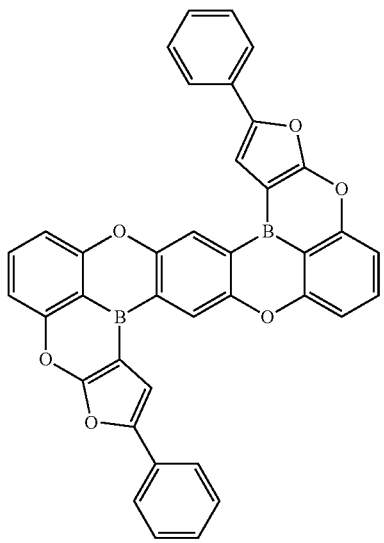
117
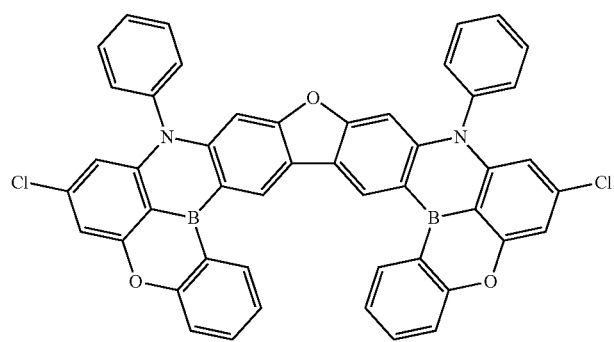
118
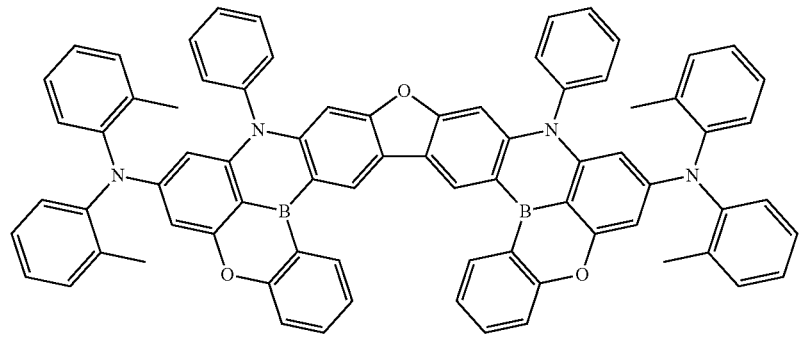

-continued
119
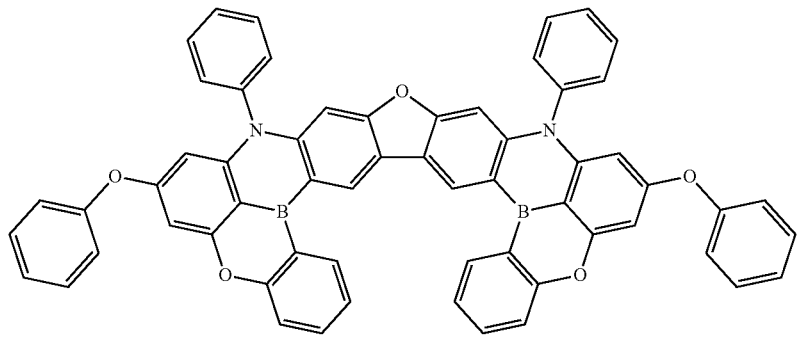
120
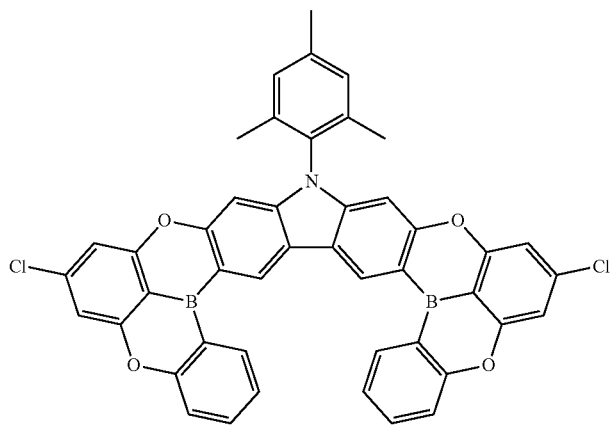
121
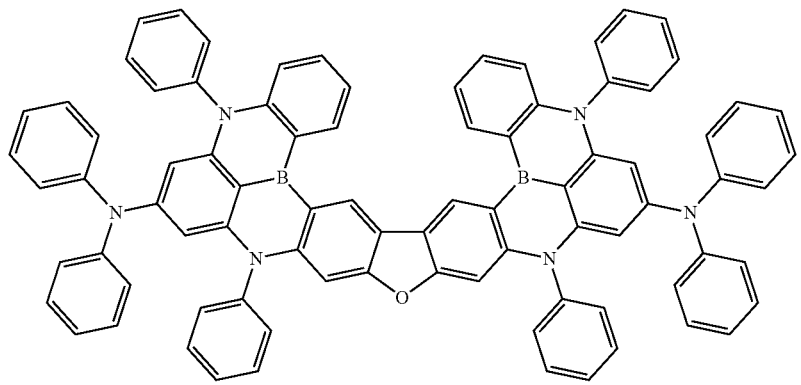
122
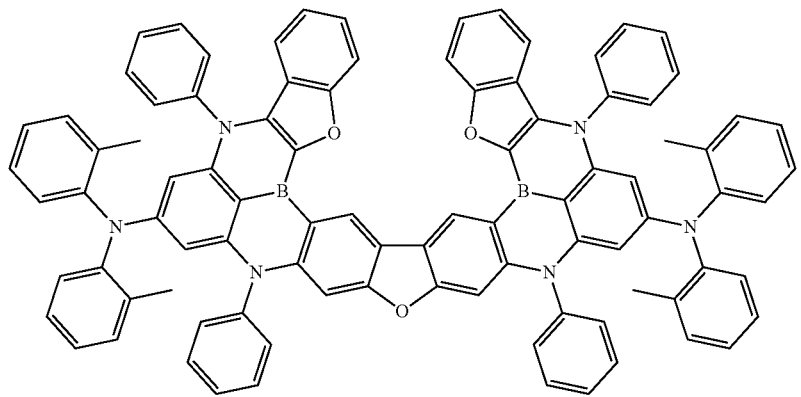

-continued
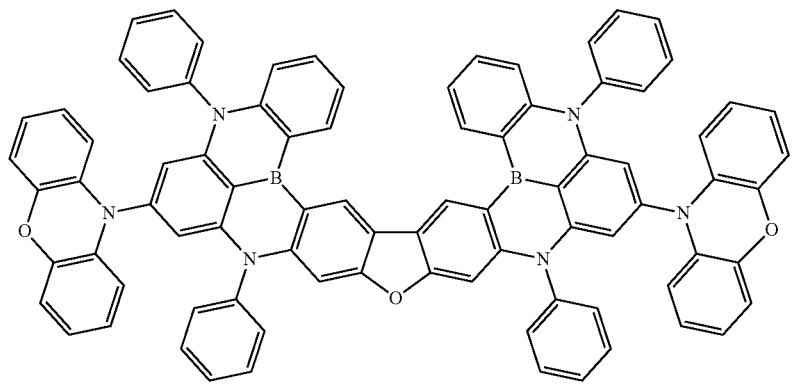
123
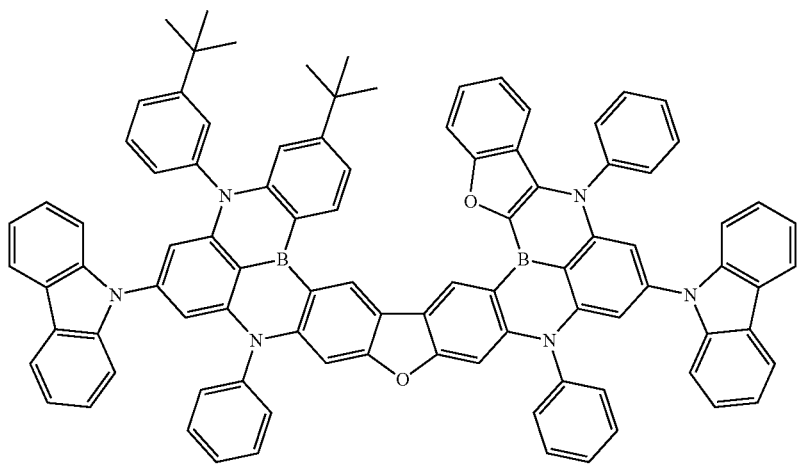
124
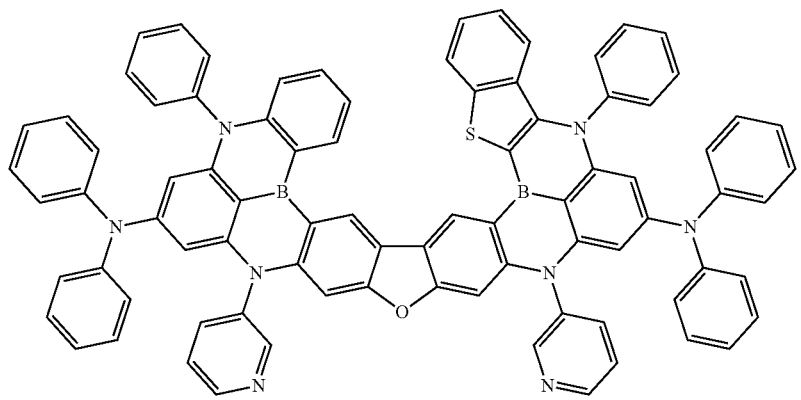
125
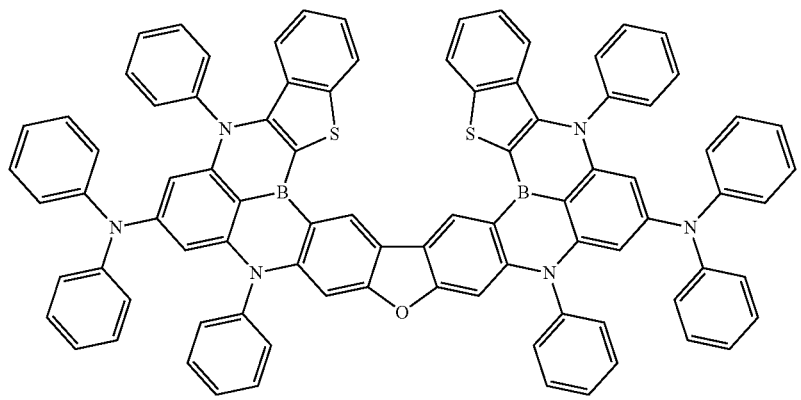
126

-continued
127
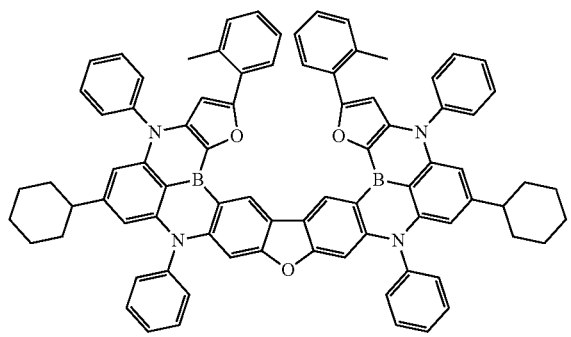
128
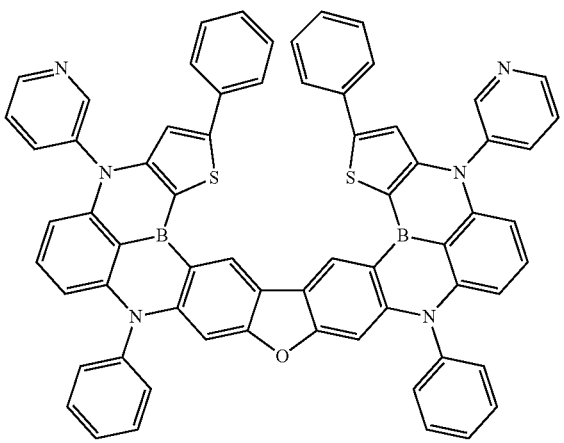
129
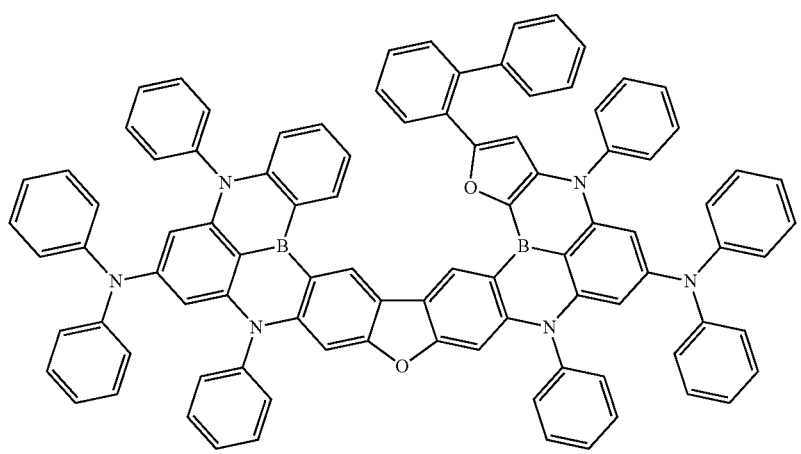
130
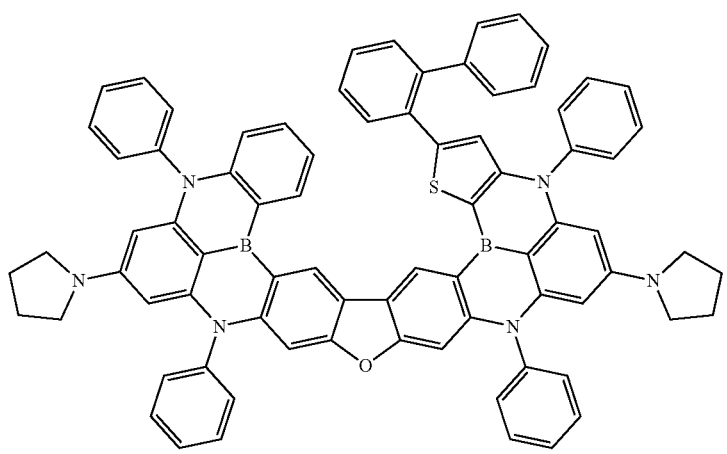

-continued
131
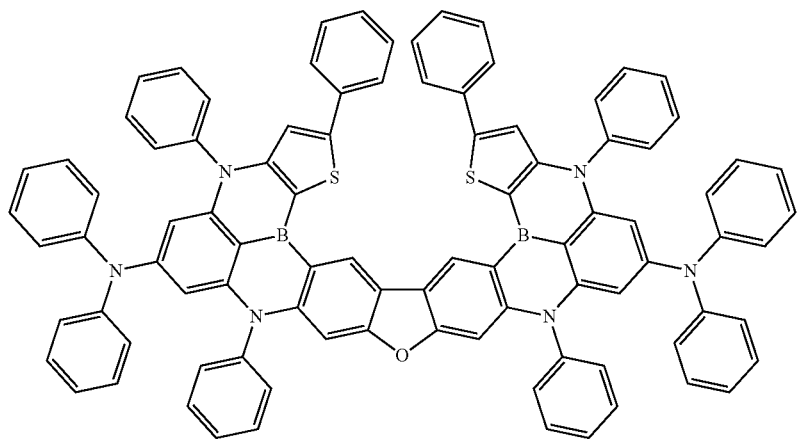
132
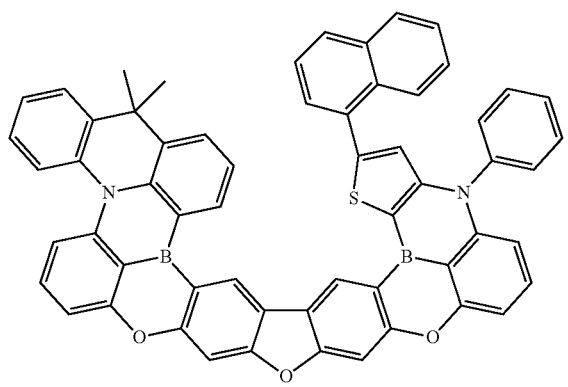
133
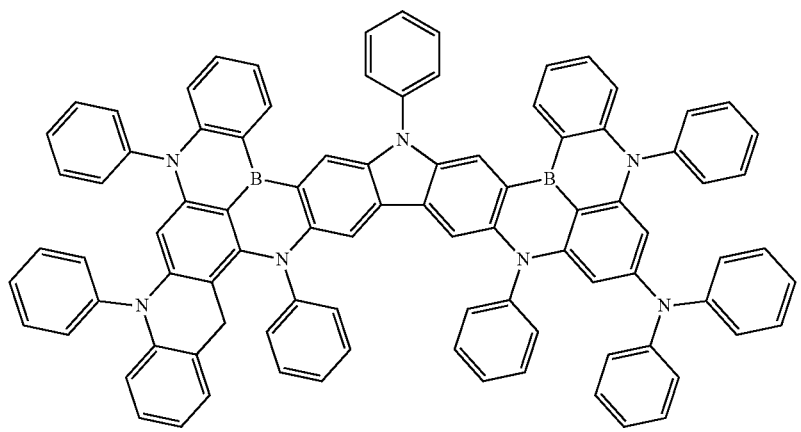

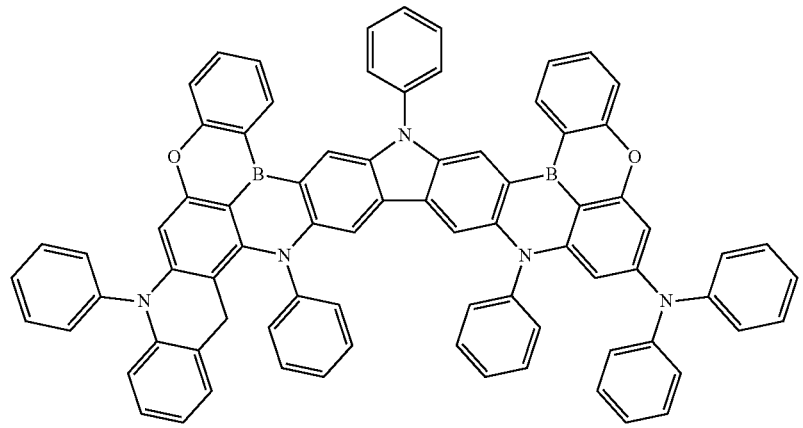
134
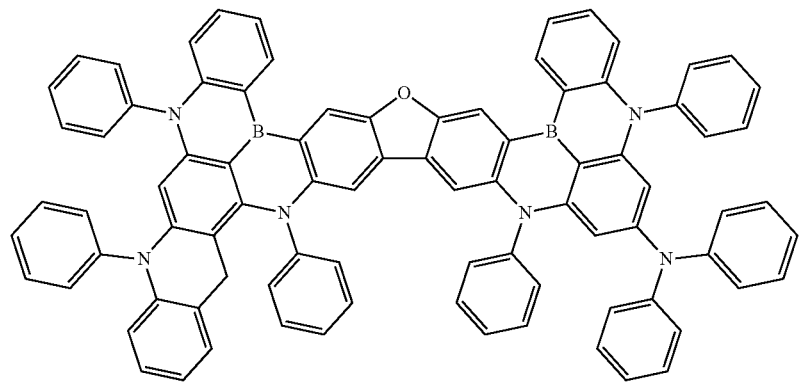
135
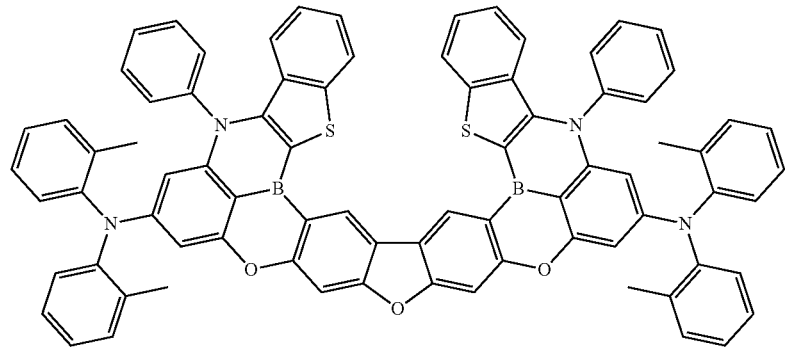
136
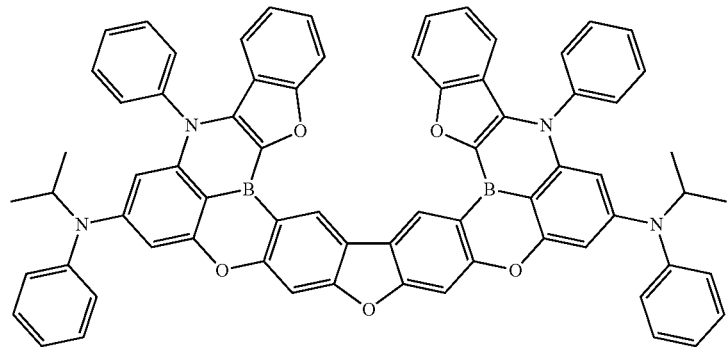
137

-continued
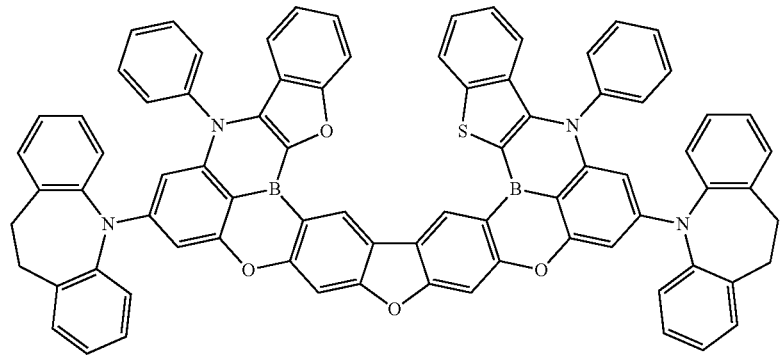
138
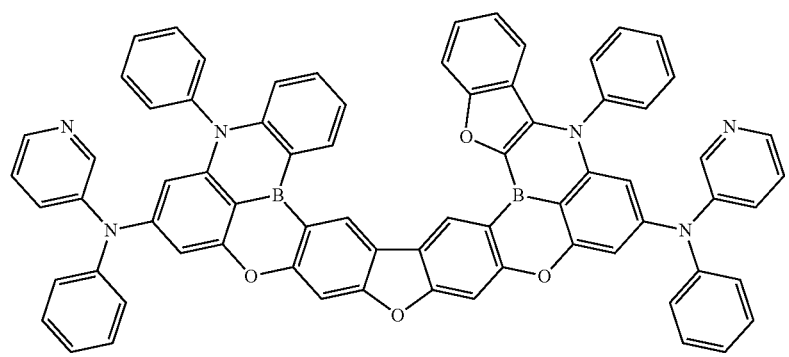
139
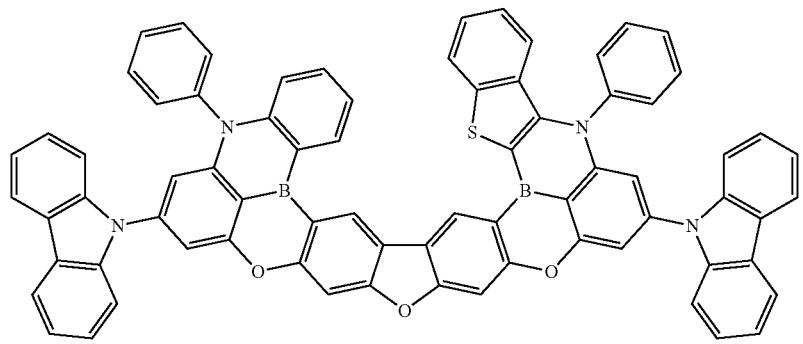
140
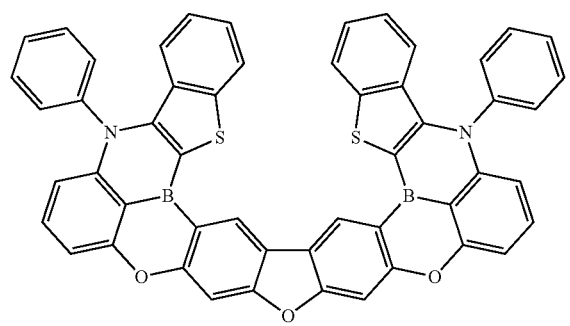
141
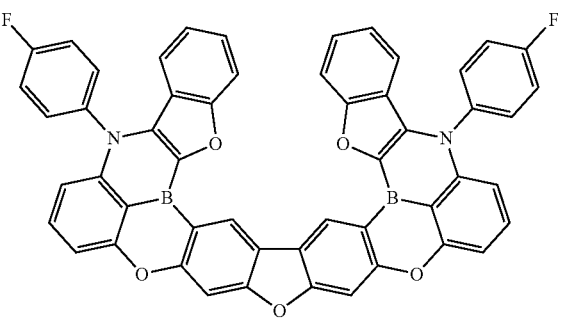
142

-continued
143
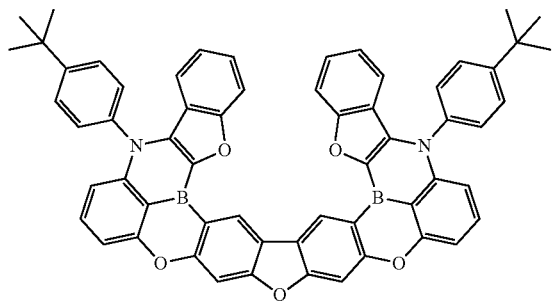
144
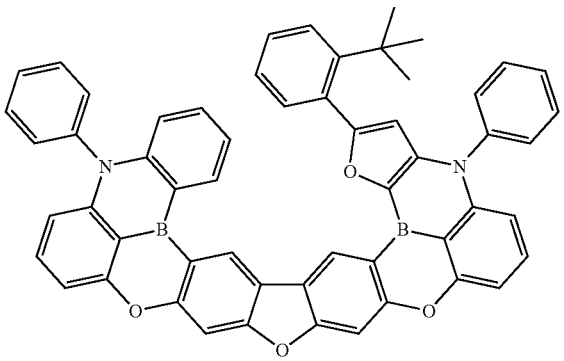
145
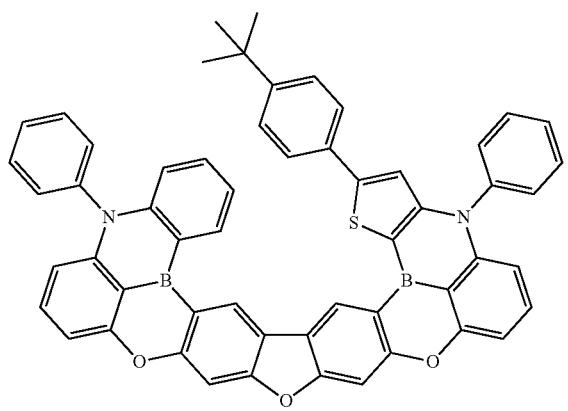
146
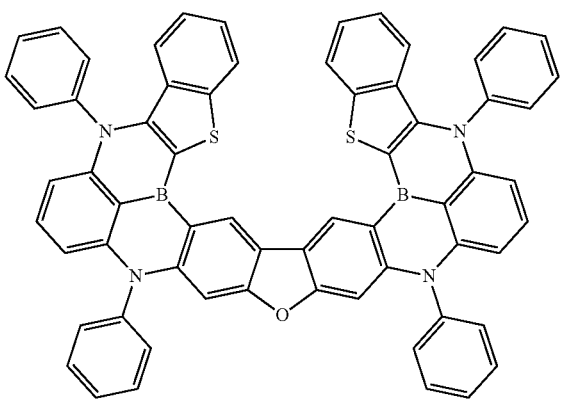
147
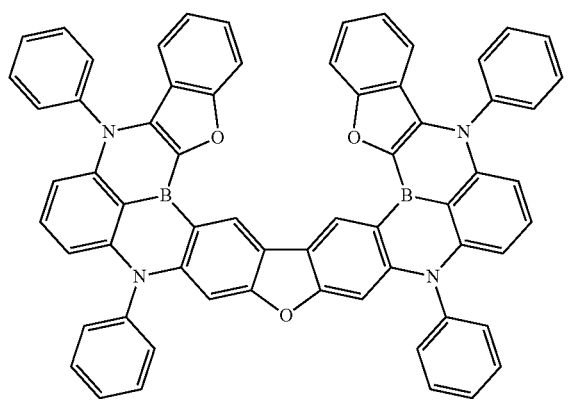
148
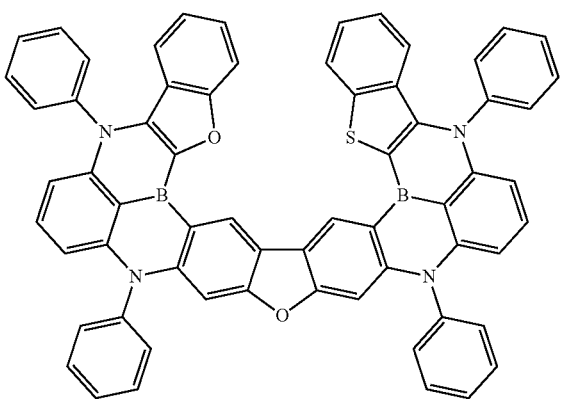

149
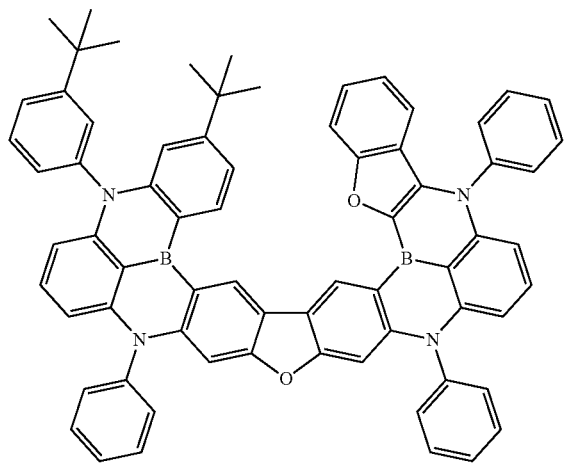
150
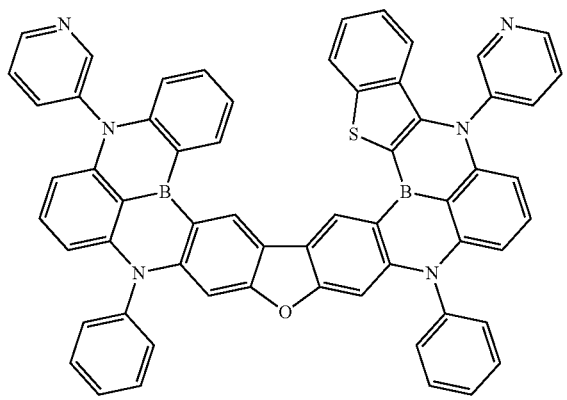
151
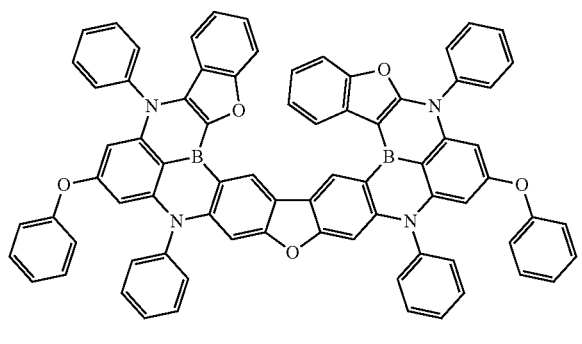
152
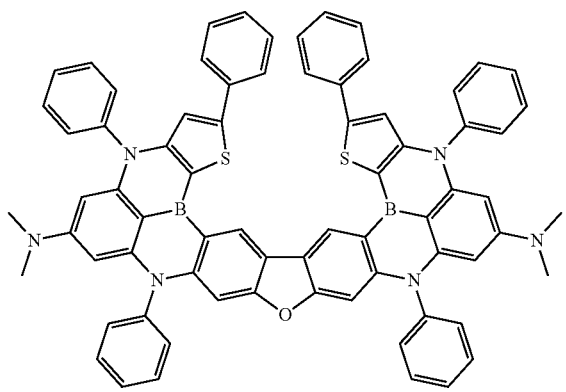
153
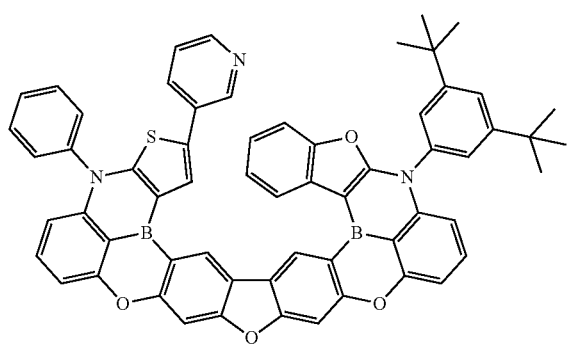
154
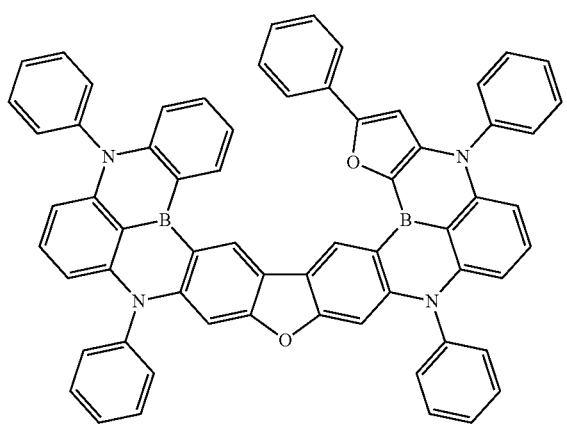

155
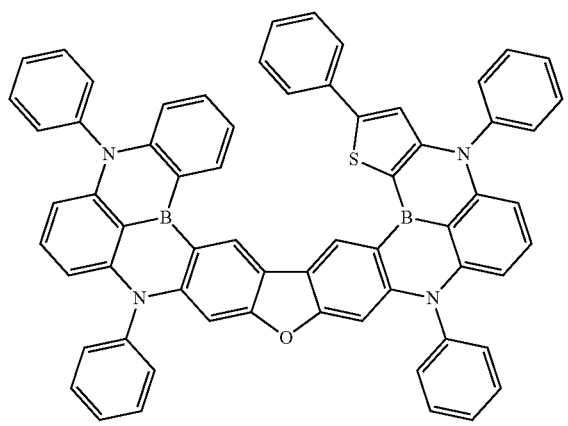
156
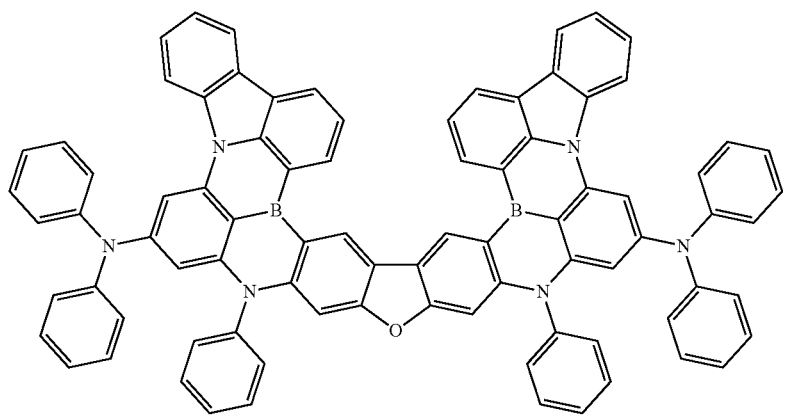
157
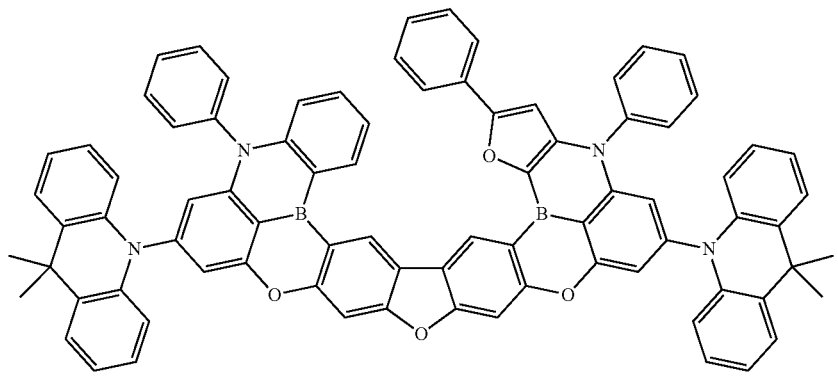
158
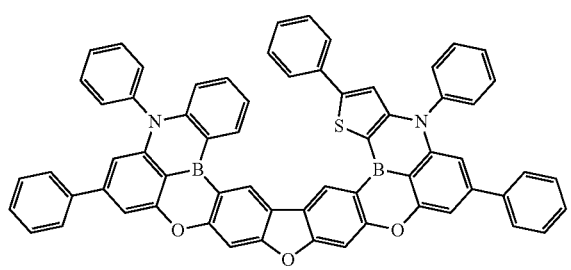
159
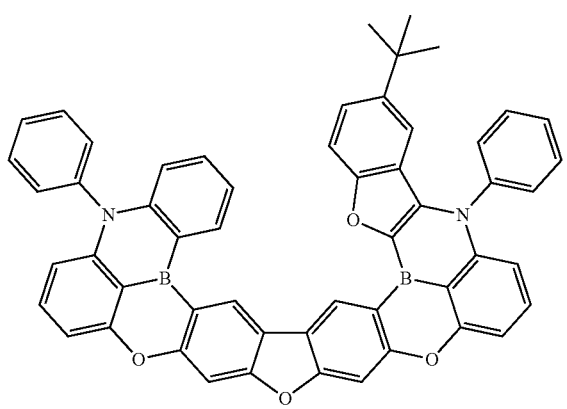

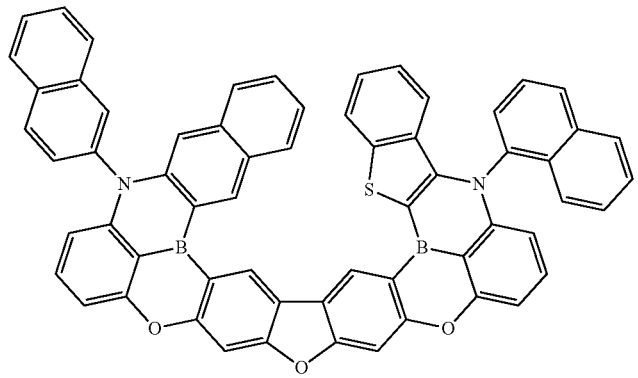
160
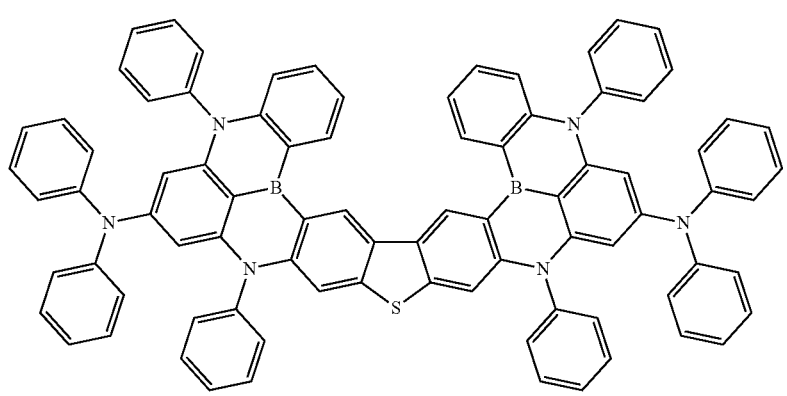
161
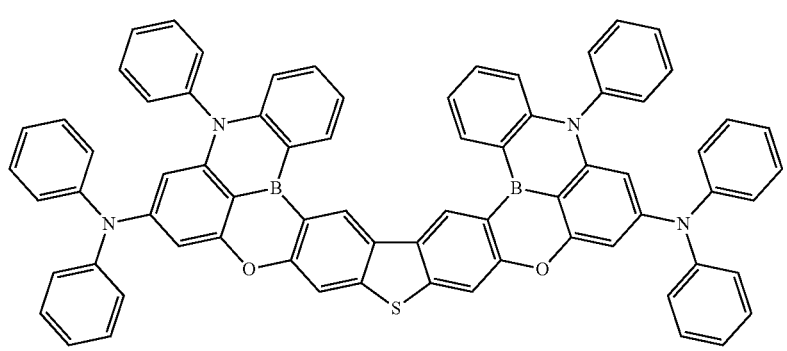
162
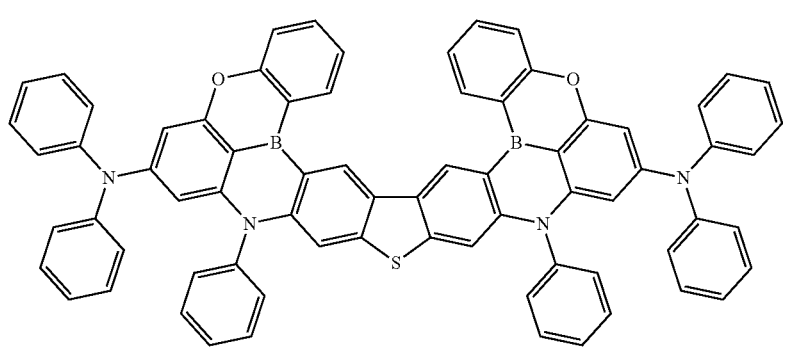
163

164
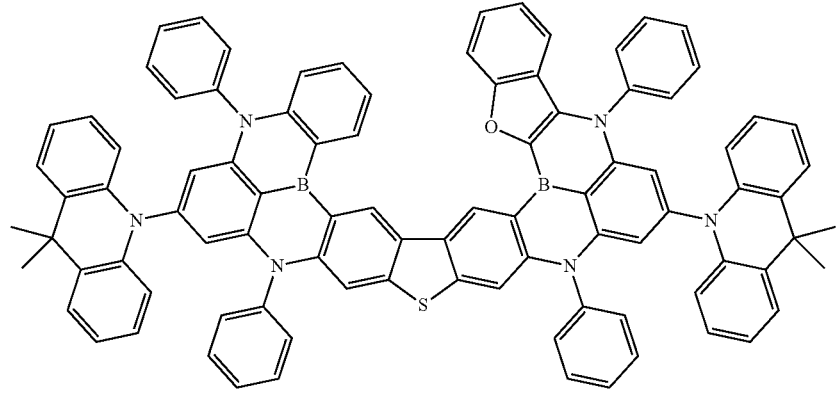
165
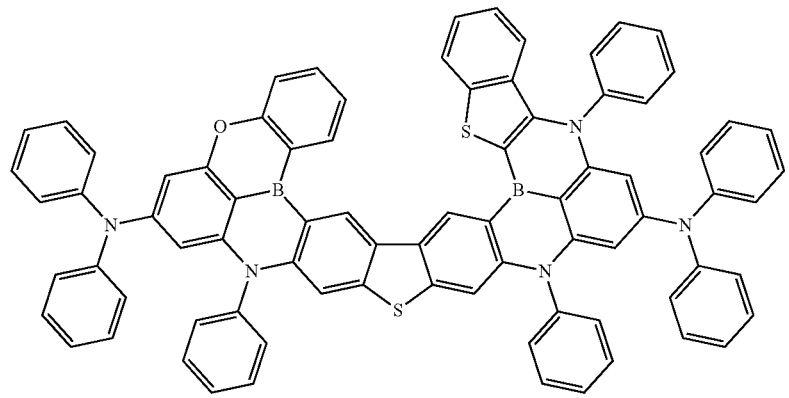
166
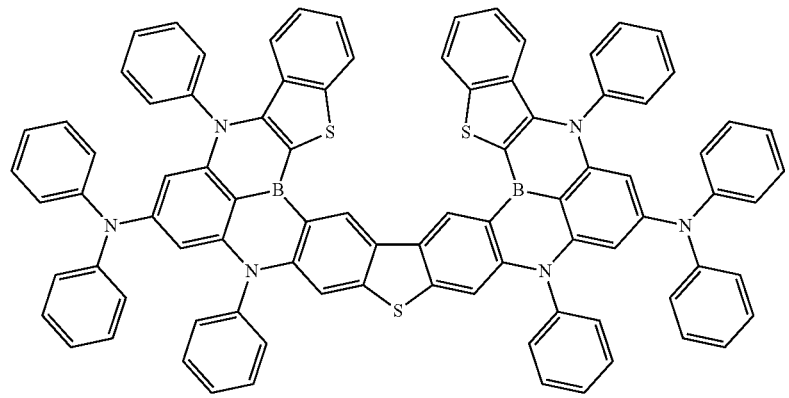
167
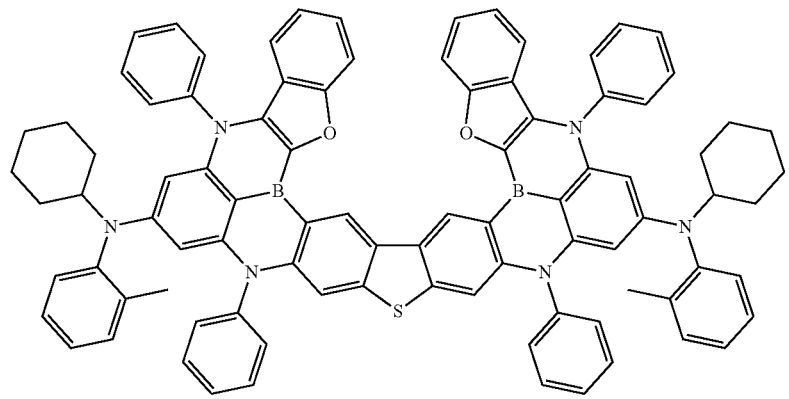

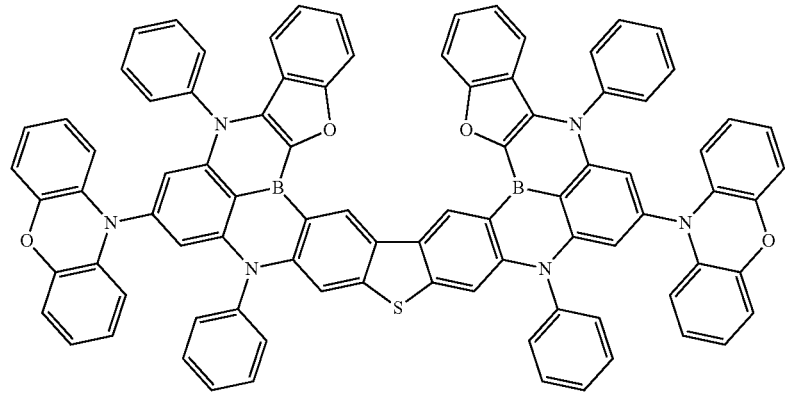
168
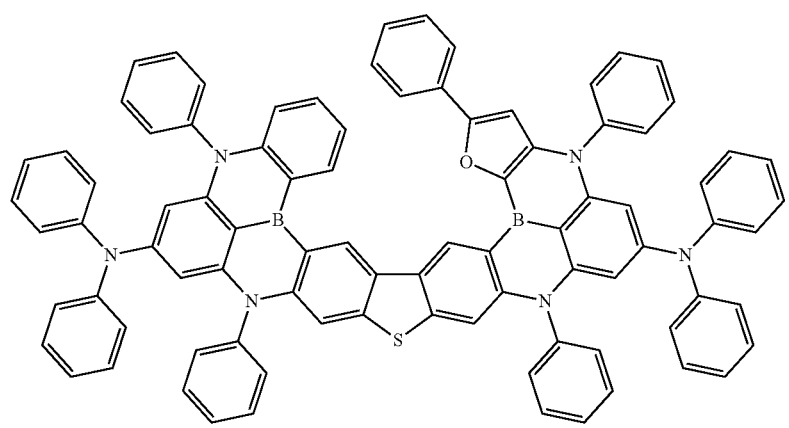
169
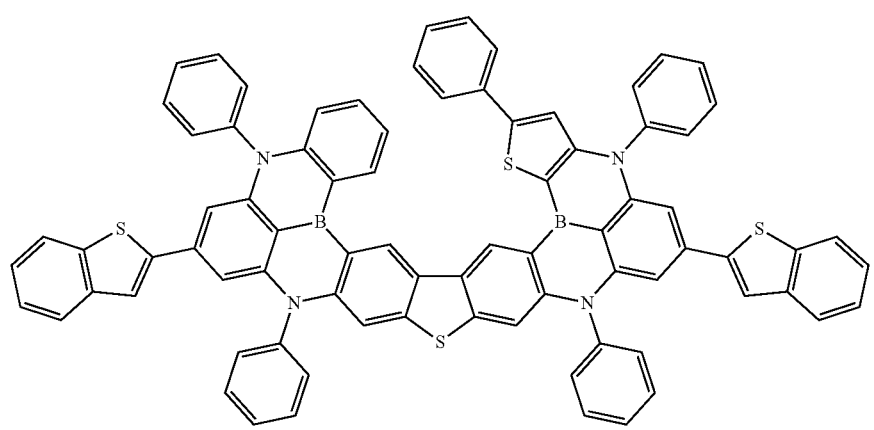
170

171
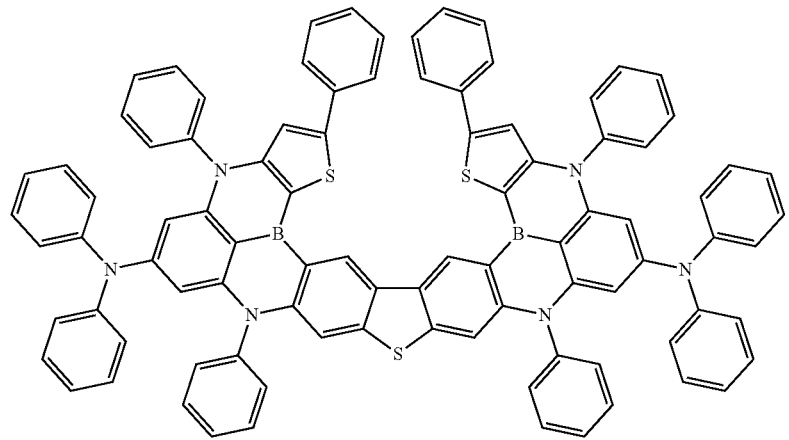
172
173
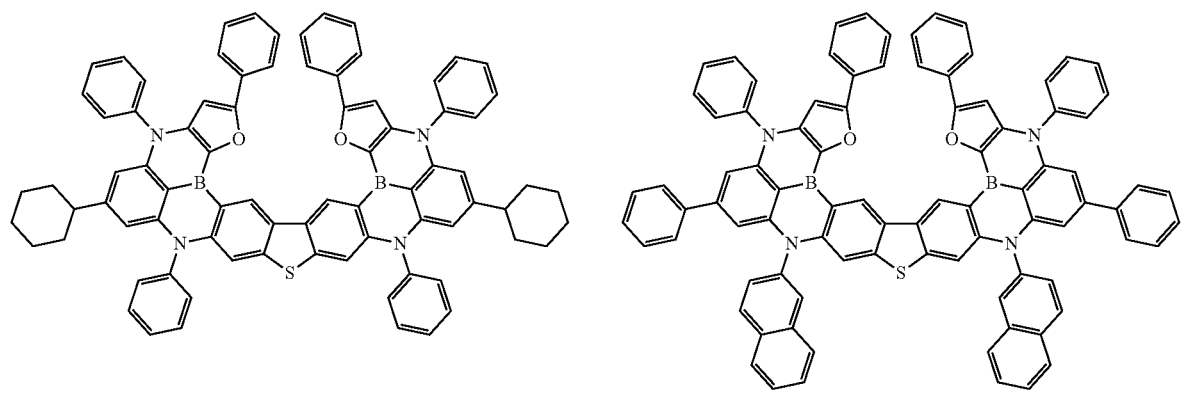
174
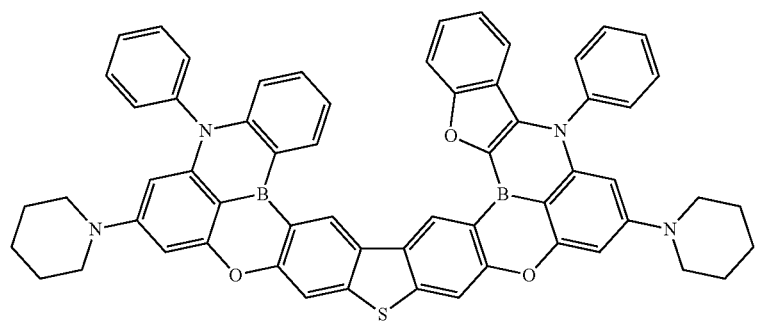
175
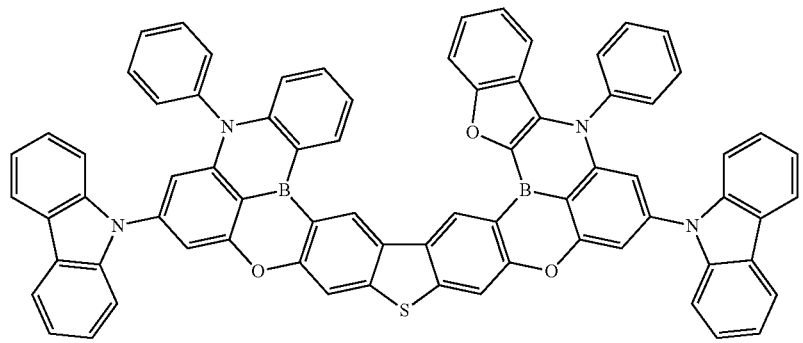

-continued
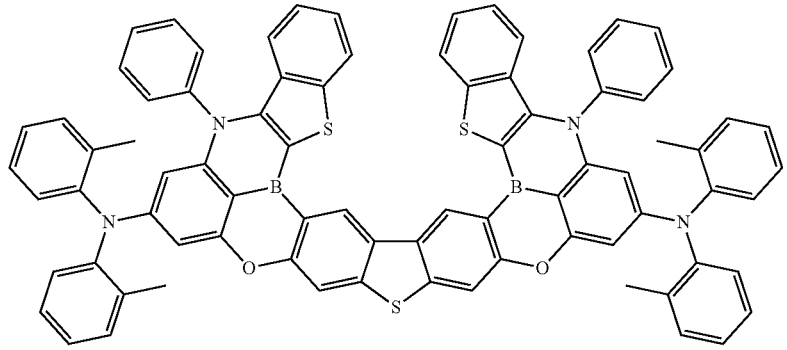
176
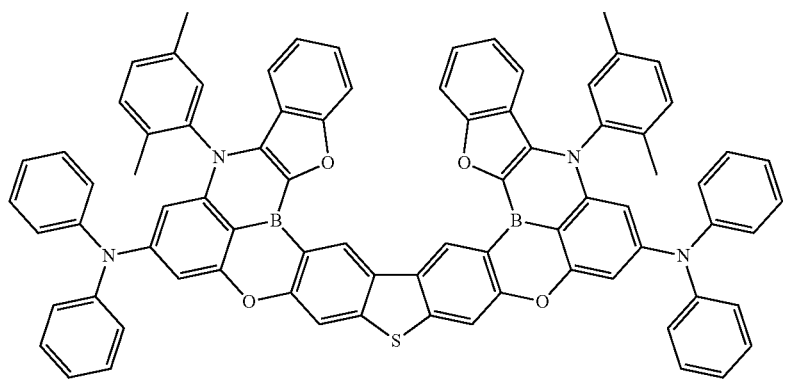
177
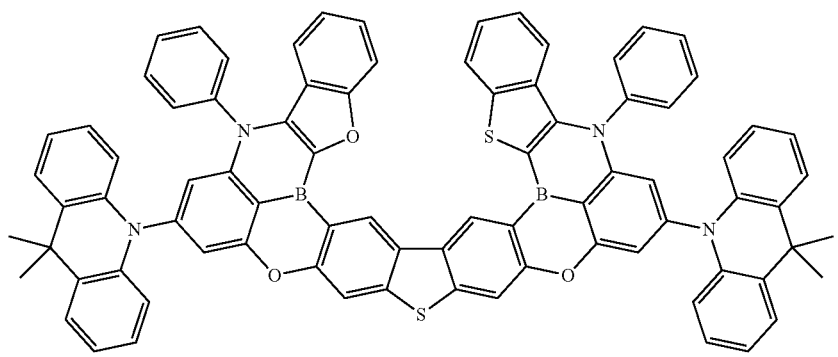
178
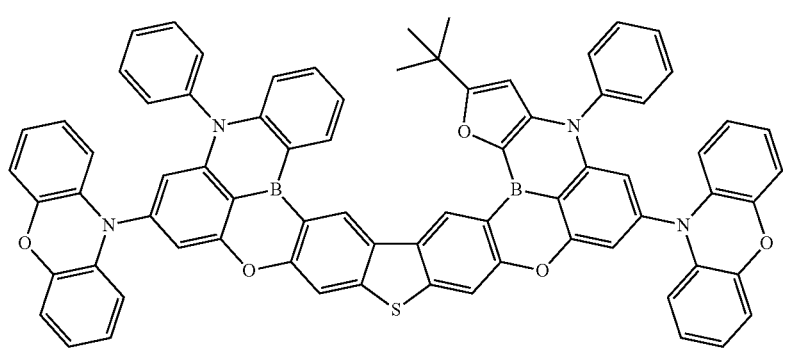
179

180
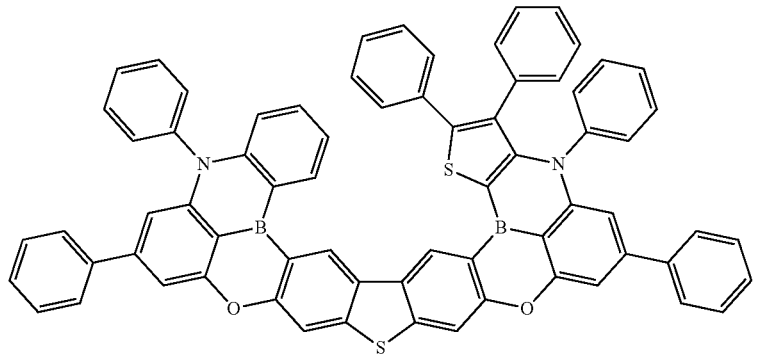
181
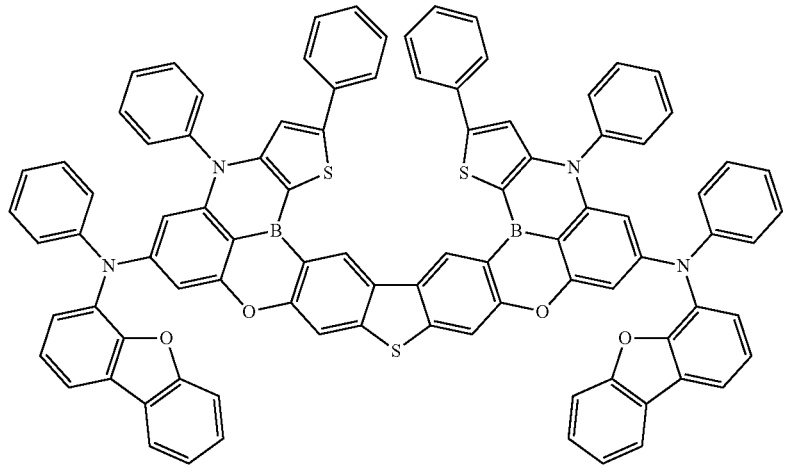
182
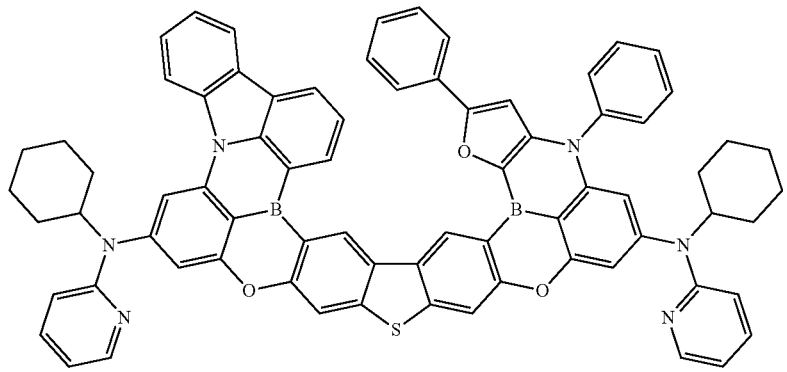
183
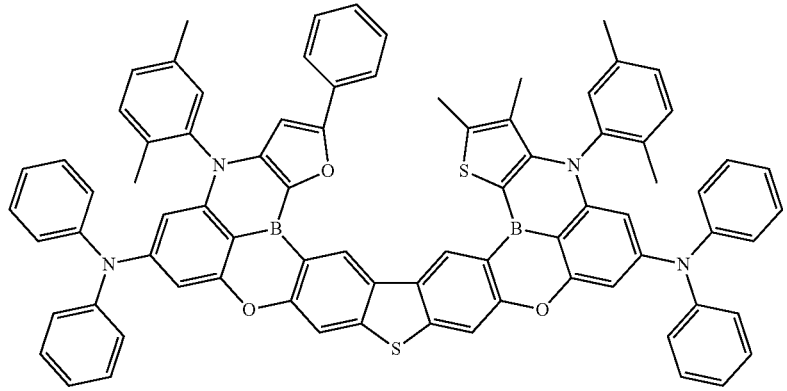

-continued
184
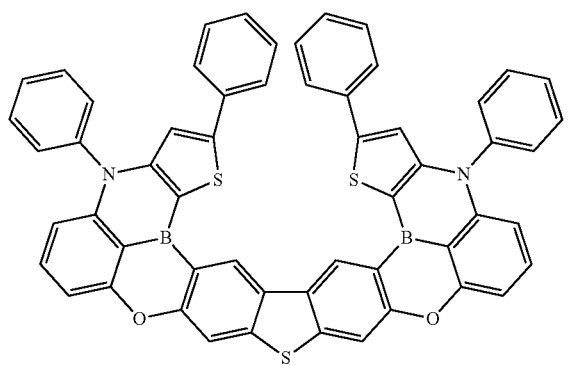
185
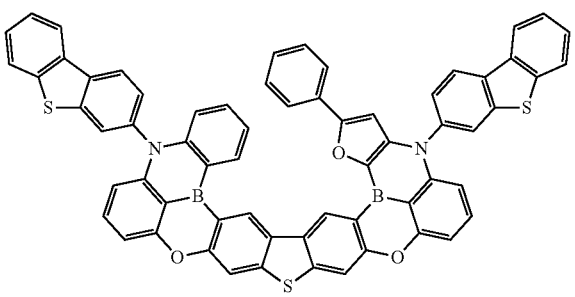
186
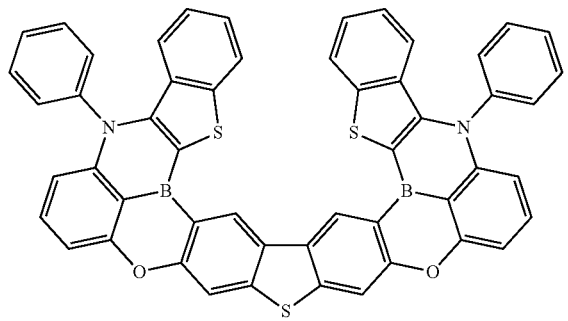
187
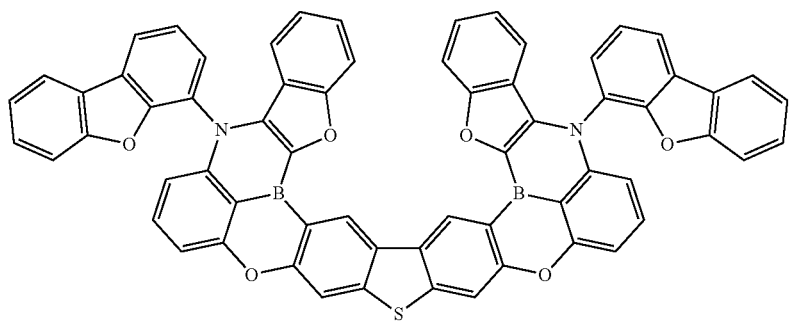
188
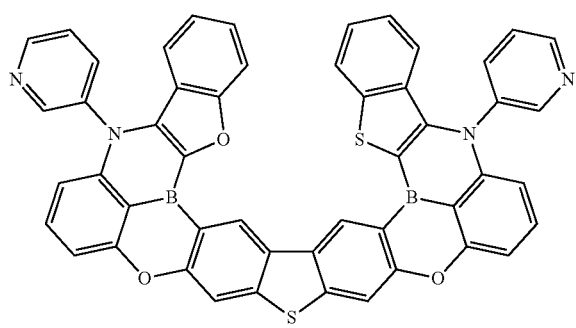

189
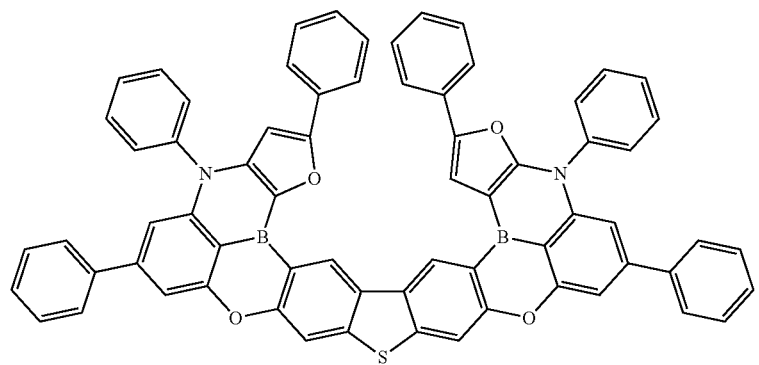
190
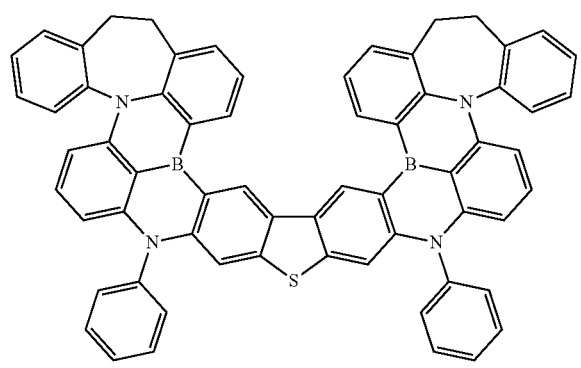
191
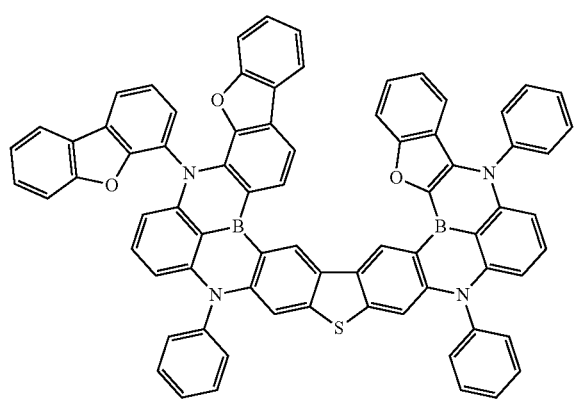
192
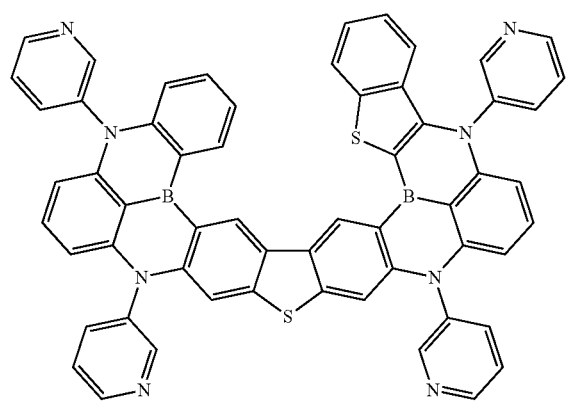
193
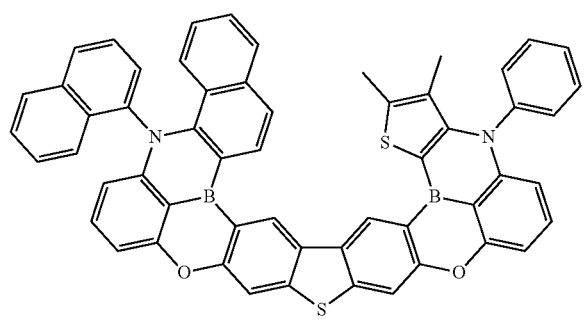

194
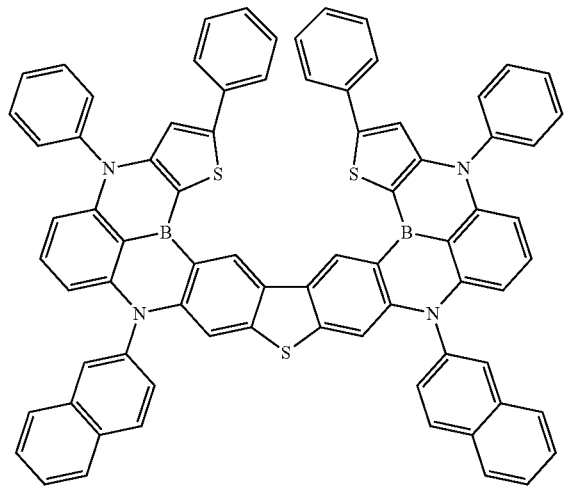
195
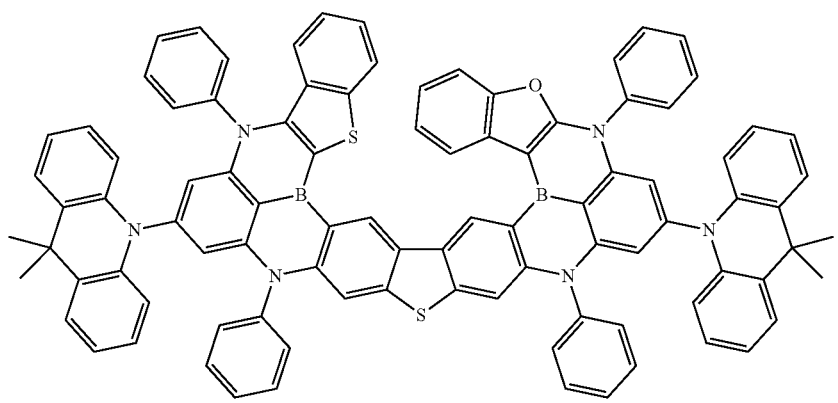
196
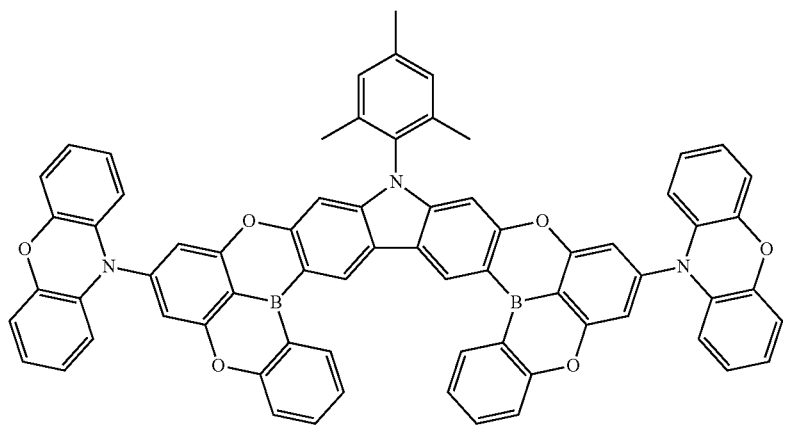

-continued

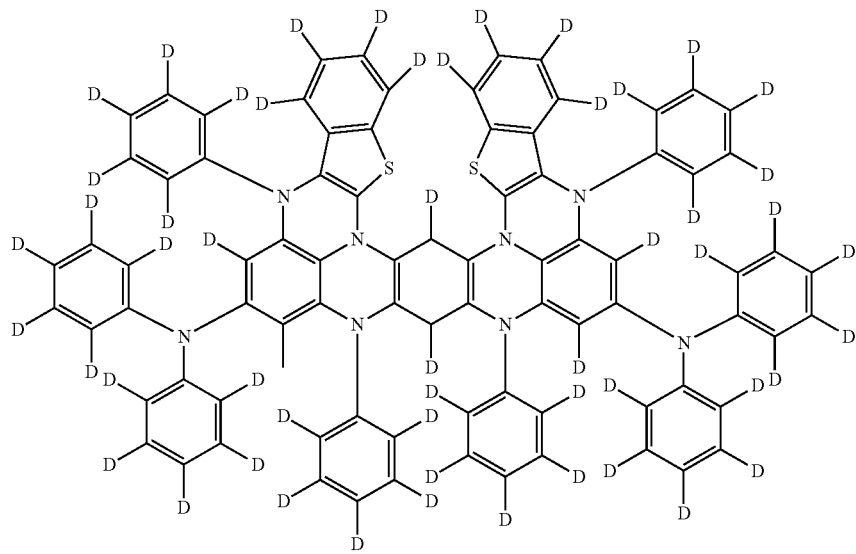

197

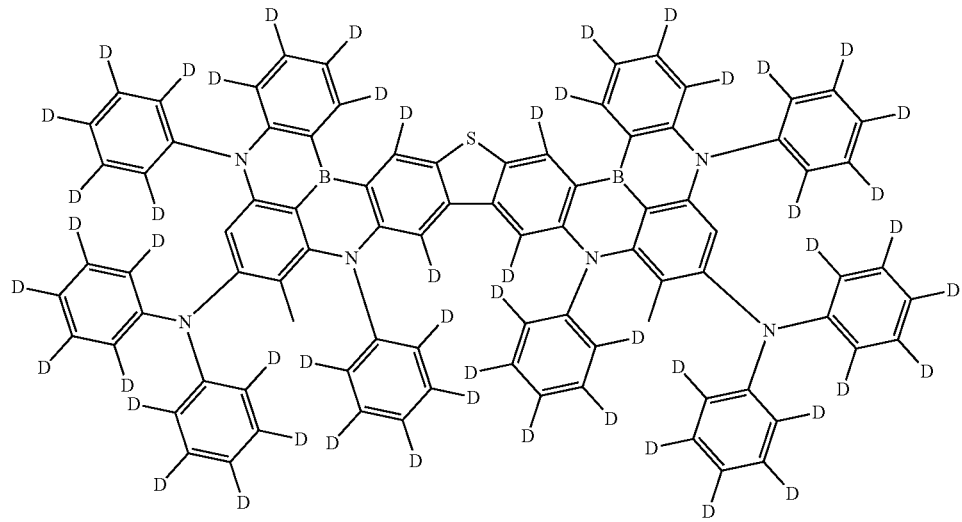

198

The compound of Chemical Formula 1 above of the present disclosure may be usefully used as a dopant material for the light emitting layer. Specifically, the organic compound may provide an organic compound, as a dopant material, capable of remarkably improving color gamut by being thermally stable and having narrow emission spectrum and full width at half maximum compared to existing boron-based dopants.

The organic compound of the present disclosure may be usefully used as a material for forming the light emitting layer. The above-mentioned material for forming the light emitting layer may further include a material, for example, a host material or the like, which is usually added when the organic compound is prepared in a form required for use in forming the light emitting layer.

The material for forming the light emitting layer may be a material for a dopant.

The present disclosure provides an organic electroluminescent device comprising the compound represented by Chemical Formula 1 above.

The organic compound of the present disclosure may be usefully used as a material for forming a hole injection layer, a hole transport layer, or an electron blocking layer.

Further, the present disclosure relates to a material for forming the light emitting layer comprising the organic compound.

The above-mentioned material for forming the light emitting layer may further include a material, for example, a host material or the like, which is usually added when the organic compound is prepared in a form required for use in forming the light emitting layer.

Further, the present disclosure relates to an organic electroluminescent device in which an organic thin film layer consisting of a single layer or multiple layers including at least a light emitting layer is laminated between a cathode and an anode,
wherein the light emitting layer contains the organic compound represented by Chemical Formula 1 above alone or in combination of two or more.

The organic electroluminescent device may have a structure in which an anode, a hole injection layer, a hole transport layer, a light emitting layer, an electron transport layer, an electron injection layer, and a cathode are laminated, and an electron blocking layer, a hole blocking layer, etc. may be further laminated as needed.

Hereinafter, the organic electroluminescent device of the present disclosure will be described for example. However, the contents exemplified below do not limit the organic electroluminescent device of the present disclosure.

The organic electroluminescent device of the present disclosure may have a structure in which an anode (hole injection electrode), a hole injection layer (HIL), a hole transport layer (HTL), a light emitting layer (EML), and a cathode (electron injection electrode) are sequentially laminated, and preferably, the organic electroluminescent device may further comprise an electron blocking layer (EBL) which is between the anode and the light emitting layer, and an electron transport layer (ETL) and an electron injection layer (EIL) which are between the cathode and the light emitting layer. Further, the organic electroluminescent device may further comprise a hole blocking layer (HBL) which is between the cathode and the light emitting layer.

In a method for manufacturing the organic electroluminescent device according to the present disclosure, the anode is formed by first coating a material for the anode on the surface of a substrate in a conventional manner. At this time, the substrate used is preferably a glass substrate or a transparent plastic substrate excellent in transparency, surface smoothness, handling easiness, and waterproofing properties. Further, indium tin oxide (ITO), indium zinc oxide (IZO), tin oxide ($SnO_2$), zinc oxide (ZnO), etc., which are transparent and have excellent conductivity, may be used as the material for the anode.

Next, the hole injection layer is formed by vacuum thermal evaporating or spin coating a hole injection layer (HIL) material on the surface of the anode in a conventional manner. Examples of the hole injection layer material may include copper phthalocyanine (CuPc), 4,4'',4''-tris(3-methylphenylamino)triphenylamine (m-MTDATA), 4,4'',4''-tris(3-methylphenylamino)phenoxybenzene (m-MTDAPB), starburst type amines of 4,4',4''-tri(N-carbazolyl)triphenylamine (TCTA) and 4,4',4''-tris(N-(2-naphthyl)-N-phenylamino)-triphenylamine (2-TNATA), or IDE406 commercially available from Idemitsu.

The hole transport layer is formed by vacuum thermal evaporating or spin coating a hole transport layer (HTL) material on the surface of the hole injection layer in a conventional manner. At this time, examples of the hole transport layer material may include bis(N-(1-naphthyl-n-phenyl))benzidine (α-NPD), N,N''-di(naphthalene-1-yl)-N, N''-biphenyl-benzidine (NPB), or N,N'-biphenyl-N,N'-bis(3-methylphenyl)-1,1'-biphenyl-4,4'-diamine (TPD).

The light emitting layer is formed by vacuum thermal evaporating or spin coating a light emitting layer (EML) material on the surface of the hole transport layer in a conventional manner. At this time, although a single light emitting material or a light emitting host material of the light emitting layer material used may include tris(8-hydroxyquinolinolato)aluminum ($Alq_3$), etc. in the case of green, and include $Alq_3$, CBP (4,4'-N,N'-dicabazole-biphenyl, 4,4'-N, N'-dicarbazole-biphenyl), PVK (poly(n-vinylcabazole), poly(n-vinylcarbazole)), ADN (9,10-di(naphthalene-2-yl)anthracene, 9,10-di(naphthalene-2-yl)anthracene), TCTA, TPBI (1,3,5-tris(N-phenylbenzimidazole-2-yl)benzene, 1,3,5-tris(N-phenylbenzimidazole-2-yl)benzene), TBADN (3-tert-butyl-9,10-di(naphth-2-yl)anthracene, 3-tert-butyl-9,10-di(naphth-2-yl)anthracene), E3, DSA (distyrylarylene), or a mixture of two or more thereof in the case of blue, the present disclosure is not limited thereto.

In the case of a dopant that may be used together with a light emitting host among the light emitting layer materials, the compound of the present disclosure may be preferably used.

Selectively, the electron blocking layer (EBL) may be additionally formed between the hole transport layer and the light emitting layer.

The electron transport layer is formed by vacuum thermal evaporating or spin coating an electron transport layer (ETL) material on the surface of the light emitting layer in a conventional manner. At this time, the electron transport layer material used is not particularly limited, and tris(8-hydroxyquinolinolato)aluminum ($Alq_3$) may be preferably used.

Selectively, it is possible to prevent a phenomenon that triplet excitons or holes are diffused into the electron transport layer by additionally forming the hole blocking layer (HBL) between the light emitting layer and the electron transport layer and using a phosphorescent dopant together in the light emitting layer.

The formation of the hole blocking layer may be carried out by vacuum thermal evaporating or spin coating a hole blocking layer material in a conventional manner, and although the hole blocking layer material is not particularly limited, preferably (8-hydroxyquinolinolato)lithium (Liq), bis(8-hydroxy-2-methylquinolinolato)-aluminum biphenoxide (BAlq), bathocuproine (BCP), LiF, etc. may be used.

The electron injection layer is formed by vacuum thermal evaporating or spin coating an electron injection layer (EIL) material on the surface of the electron transport layer in a conventional manner. At this time, materials such as LiF, Liq, $Li_2O$, BaO, NaCl, CsF, etc. may be used as the electron injection layer material used.

The cathode is formed by vacuum thermal evaporating a material for the cathode on the surface of the electron injection layer in a conventional manner.

At this time, lithium (Li), aluminum (Al), aluminum-lithium (Al—Li), calcium (Ca), magnesium (Mg), magnesium-indium (Mg—In), magnesium-silver (Mg—Ag), etc. may be used as the material for the cathode used. Further, in the case of a top emission organic electroluminescent device, a transparent cathode through which light can pass may be formed using indium tin oxide (ITO) or indium zinc oxide (IZO). A capping layer (CPL) may be formed on the surface of the cathode.

Hereinafter, a method for synthesizing the compounds will be described below by giving typical examples. However, the method for synthesizing the compounds of the present disclosure is not limited to the method exemplified below, and the compounds of the present disclosure may be prepared by the method illustrated below and methods known in the art.

Synthesis Example 1-1

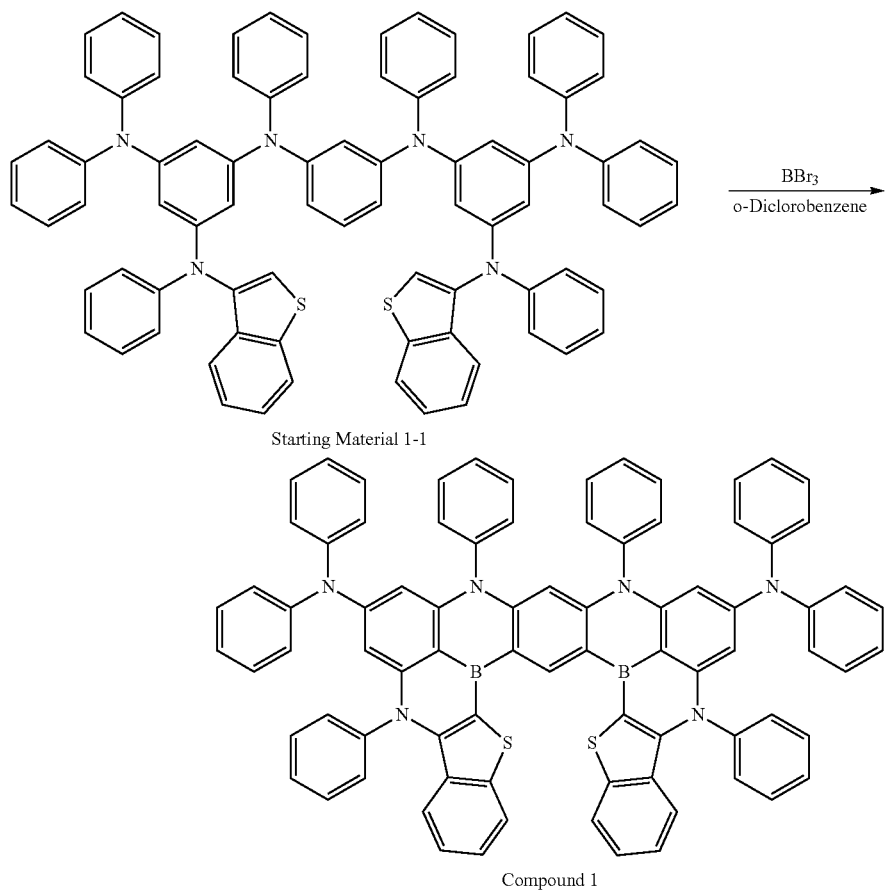

11.94 g (10.0 mmol) of Starting Material 1-1, 30 ml of orthodichlorobenzene, and 4.82 mL (50.0 mmol) of boron tribromide were injected into a high-pressure reactor, and then stirred. A reaction product was heated to 180 to 190° C. and stirred for 12 hours.

After cooling a reaction solution to room temperature, cooled water was injected into the cooled reaction solution to extract an organic layer using ethyl acetate. After drying a solvent of an extracted organic layer with MgSO$_4$, filtration was performed. After concentrating a filtrate under reduced pressure, a concentrated filtrate was purified by a silica gel column chromatography (DCM/Hexane) method.

Thereafter, 0.97 g of Compound 1 above was obtained at an 8% yield by performing recrystallization purification of a resulting material using a DCM/Acetone mixed solvent.

MS (MALDI-TOF) m/z: 1209 [M]+

Synthesis Example 1-2

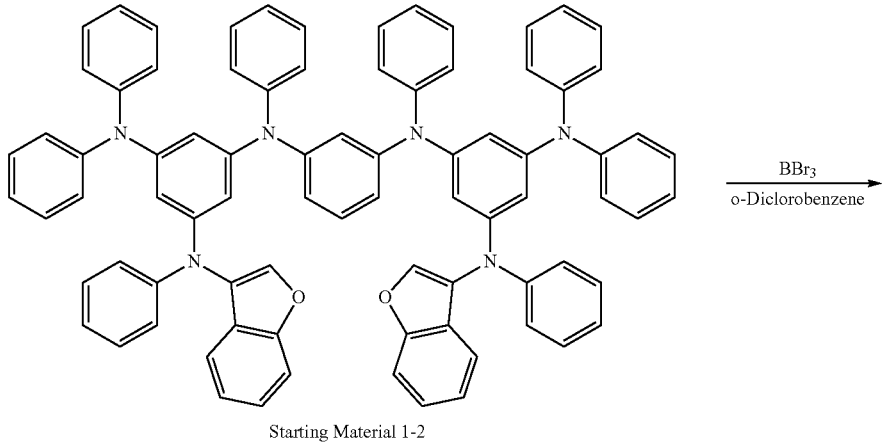

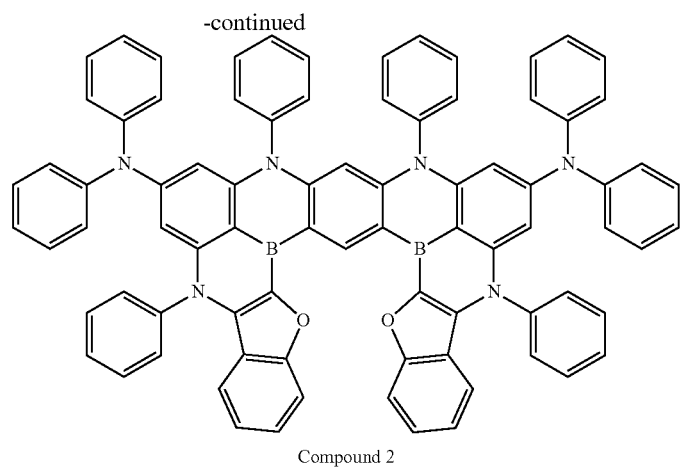
Compound 2
1.06 g of Compound 2 above was obtained at a 9% yield by synthesizing Compound 2 above in the same manner as in the preparation of Compound 1 except that 11.61 g (10.0 mmol) of Starting Material 1-2 was used instead of Starting Material 1-1.
MS (MALDI-TOF) m/z: 1176 [M]+
Synthesis Example 1-3
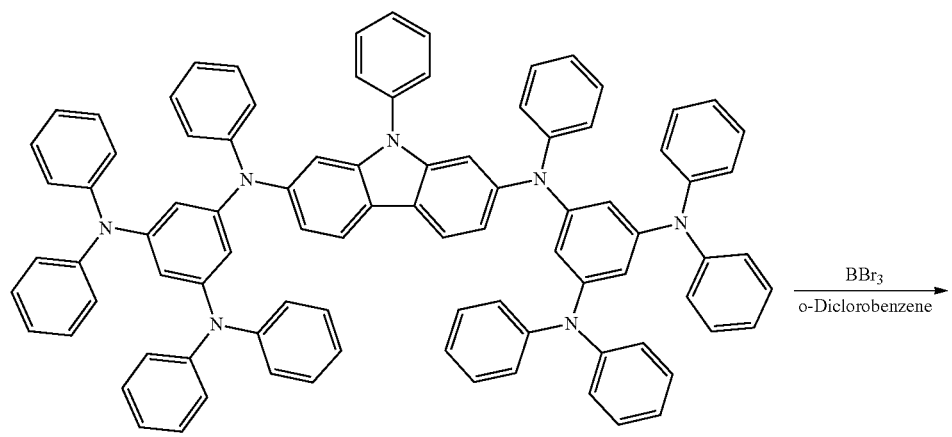
Starting Material 1-3
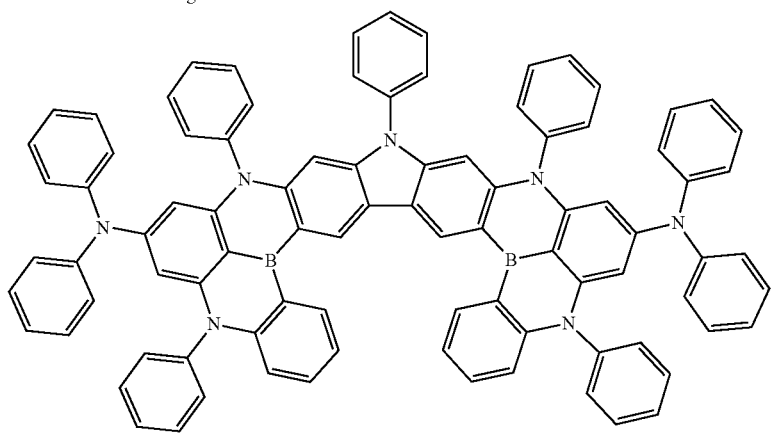
Compound 66

1.14 g of Compound 66 above was obtained at a 9% yield by synthesizing Compound 66 above in the same manner as in the preparation of Compound 1 except that 12.47 g (10.0 mmol) of Starting Material 1-3 was used instead of Starting Material 1-1.

MS (MALDI-TOF) m/z: 1262 [M]+

Synthesis Example 1-4

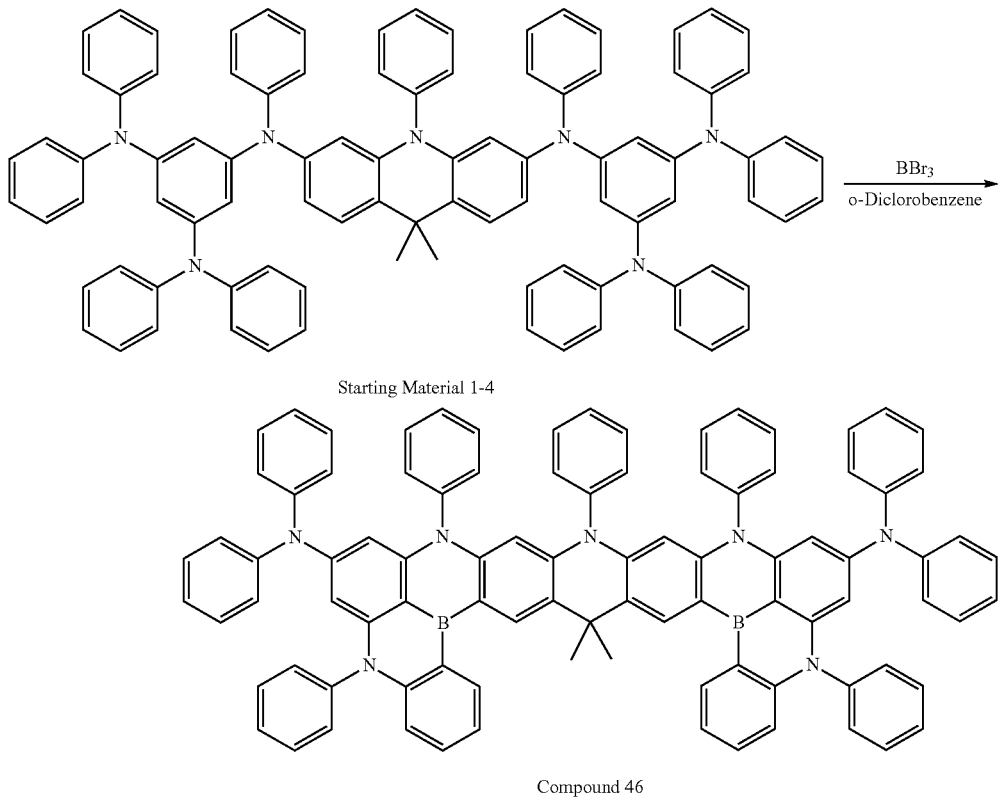

Starting Material 1-4

Compound 46

1.30 g of Compound 46 above was obtained at a 10% yield by synthesizing Compound 46 above in the same manner as in the preparation of Compound 1 except that 12.89 g (10.0 mmol) of Starting Material 1-4 was used instead of Starting Material 1-1.

MS (MALDI-TOF) m/z: 1304 [M]+

Synthesis Example 1-5

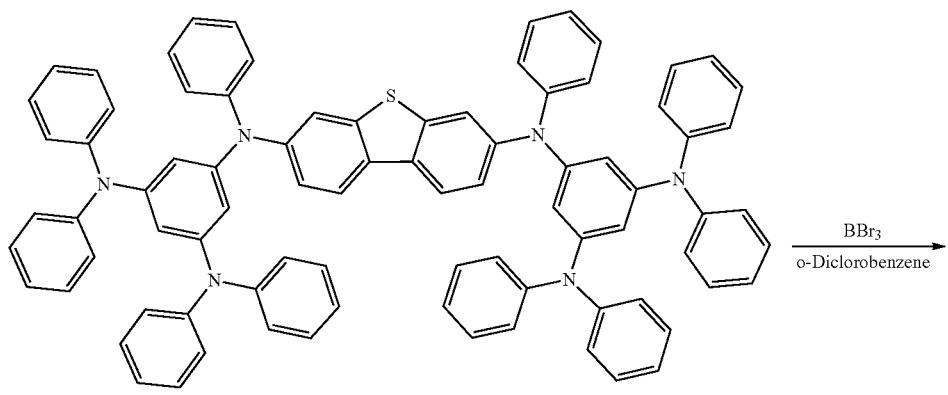

Starting Material 1-5

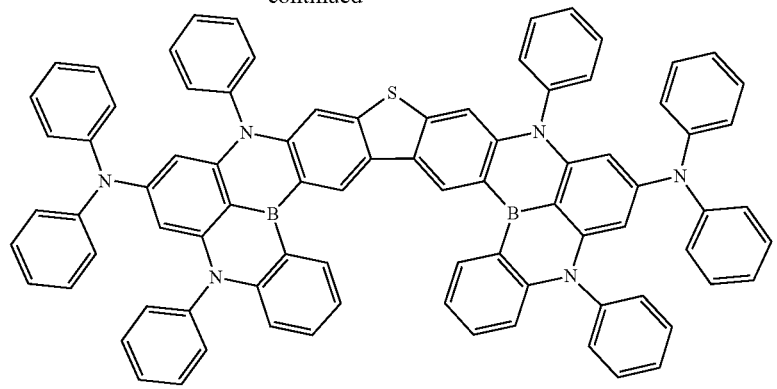
Compound 161
1.32 g of Compound 161 above was obtained at an 11% yield by synthesizing Compound 161 above in the same manner as in the preparation of Compound 1 except that 11.88 g (10.0 mmol) of Starting Material 1-5 was used instead of Starting Material 1-1.
MS (MALDI-TOF) m/z: 1203 [M]+
Synthesis Example 1-6
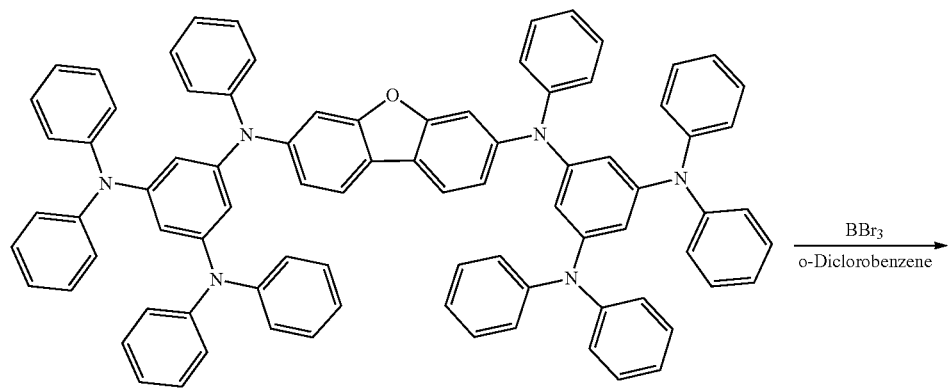
Starting Material 1-6
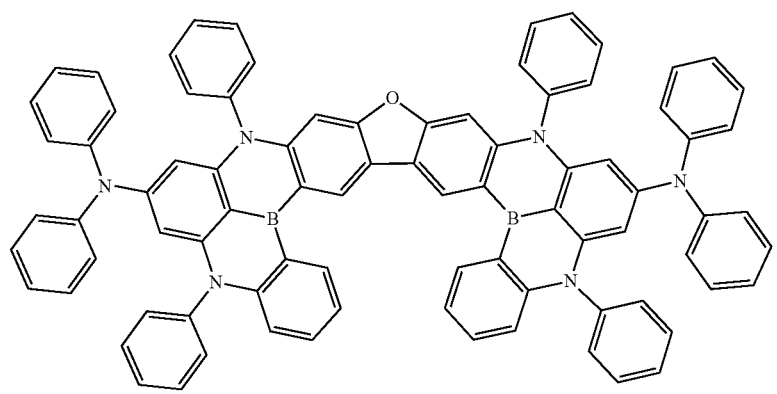
Compound 121

1.07 g of Compound 121 above was obtained at a 9% yield by synthesizing Compound 121 above in the same manner as in the preparation of Compound 1 except that 11.71 g (10.0 mmol) of Starting Material 1-6 was used instead of Starting Material 1-1.

MS (MALDI-TOF) m/z: 1187 [M]+

Synthesis Example 1-7

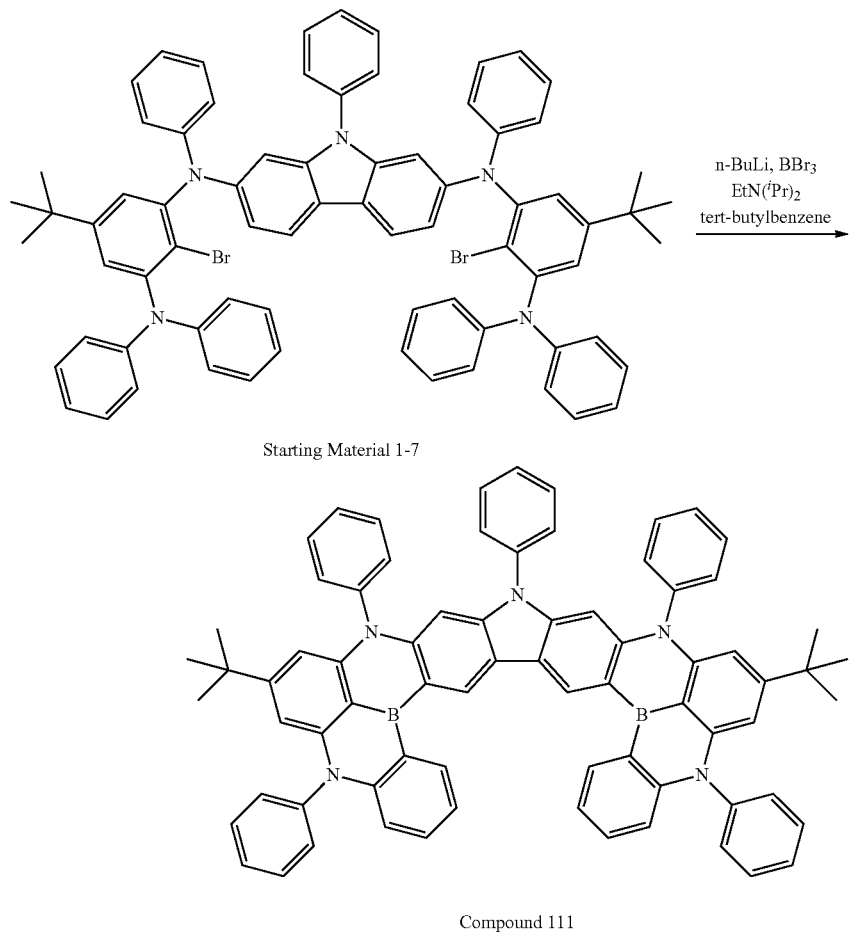

Starting Material 1-7

Compound 111

11.82 g (10.0 mmol) of Starting Material 1-7 was dissolved in 42 ml of tert-butylbenzene, and then cooled to 0° C. After adding 12.0 mL (30.0 mmol) of a 2.5M n-butyllithium solution (in hexane) to a cooled dissolved solution under a nitrogen atmosphere, stirring was performed at room temperature for 3 hours.

After that, a reaction product was cooled to 0° C. again, 2.89 mL (30.0 mmol) of boron tribromide was added to the cooled reaction product, and then a mixture was stirred at room temperature for 0.5 hour. After cooling a reaction product to 0° C. again and adding 6.97 mL (40 mmol) of N,N-diisopropylethylamine to the cooled reaction product, stirring was performed at 60 to 70° C. for 2 hours.

A reaction solution was cooled to room temperature, and an organic layer was extracted using ethyl acetate and water. After drying a solvent of the extracted organic layer with MgSO$_4$, filtration was performed. After concentrating a filtrate under reduced pressure, a concentrated filtrate was purified by a silica gel column chromatography (DCM/Hexane) method.

Thereafter, 0.94 g of Compound 111 above was obtained at a 9% yield by performing recrystallization purification of a resulting material using a DCM/Acetone mixed solvent MS (MALDI-TOF) m/z: 1039 [M]+ .

Synthesis Example 1-8

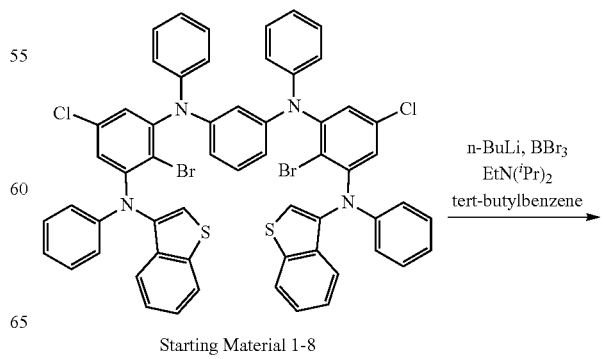

Starting Material 1-8

-continued

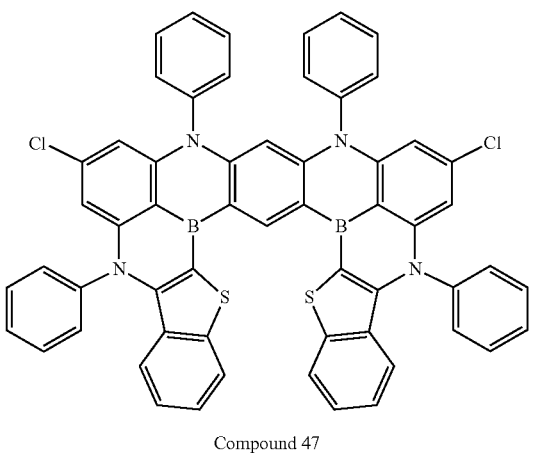

Compound 47

0.66 g of Compound 47 above was obtained at a 7% yield by synthesizing Compound 47 above in the same manner as in the preparation of Compound 111 except that 10.86 g (10.0 mmol) of Starting Material 1-8 was used instead of Starting Material 1-7.

MS (MALDI-TOF) m/z: 943 [M]+

Synthesis Example 1-9

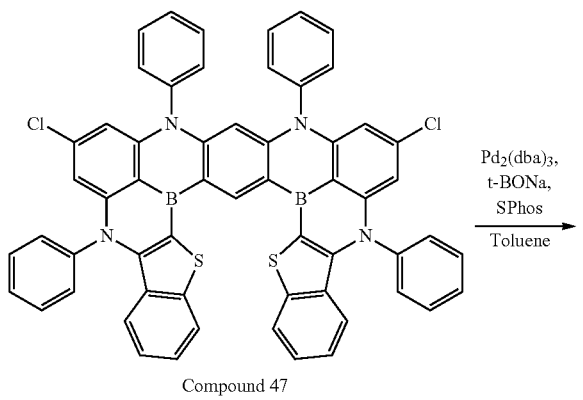

Compound 47

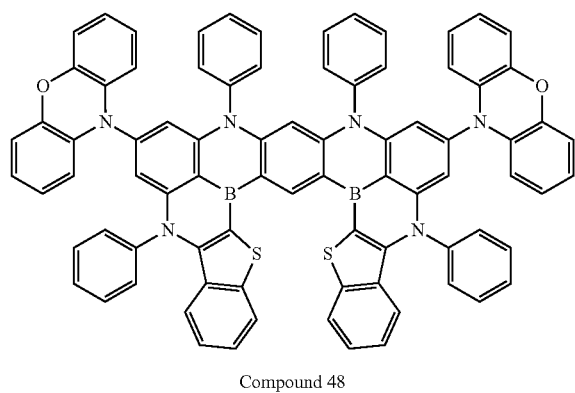

Compound 48

0.94 g (1.0 mmol) of the compound 47, 0.46 g (2.5 mmol) of phenoxazine, 0.288 g (3.0 mmol) of sodium tert-butoxide, 0.046 g (0.05 mmol) of tris(dibenzylideneacetone)dipalladium(0), 0.041 g (0.1 mmol) of 2-dicyclohexylphosphino-2',6'-dimethoxybiphenyl, and 100 mL of toluene were injected and refluxed while performing stirring. After completion of the reaction, a toluene layer was extracted using 50 mL of water.

A reaction solution was cooled to room temperature, and an organic layer was extracted using ethyl acetate and water. After drying a solvent of the extracted organic layer with MgSO$_4$, filtration was performed. After concentrating a filtrate under reduced pressure, a concentrated filtrate was purified by a silica gel column chromatography (DCM/Hexane) method.

Thereafter, 0.84 g of Compound 48 above was obtained at a 68% yield by performing recrystallization purification of a resulting material using a DCM/Acetone mixed solvent.

MS (MALDI-TOF) m/z: 1237 [M]+

Synthesis Example 1-10

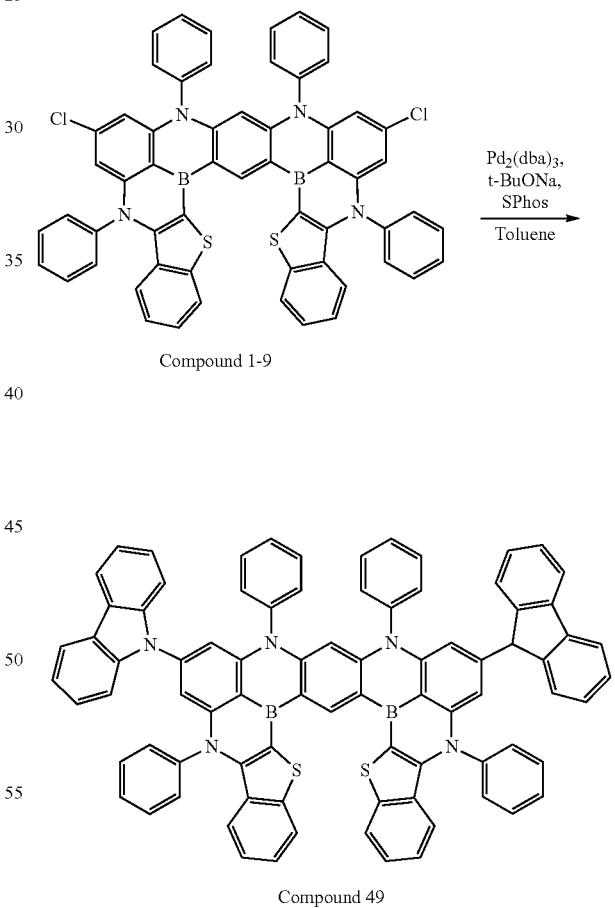

Compound 1-9

Compound 49

0.84 g of Compound 49 above was obtained at a 70% yield by synthesizing Compound 49 above in the same manner as in the preparation of Compound 48 except that 0.42 g (2.5 mmol) of carbazole was used instead of phenoxazine.

MS (MALDI-TOF) m/z: 1205 [M]+

Synthesis Example 1-11

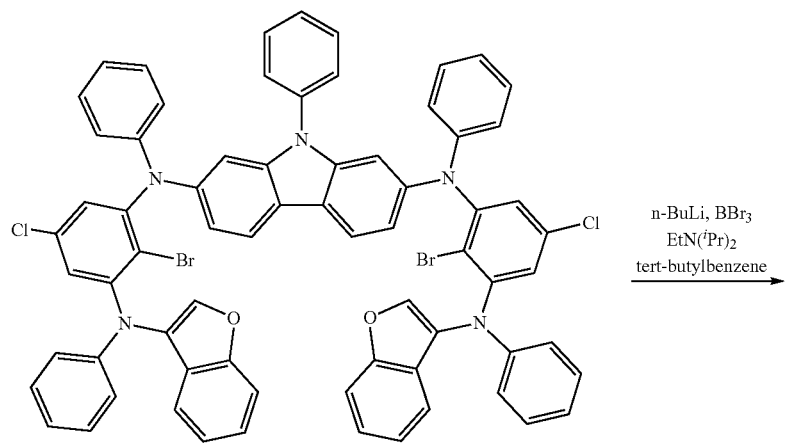

Starting Material 1-11

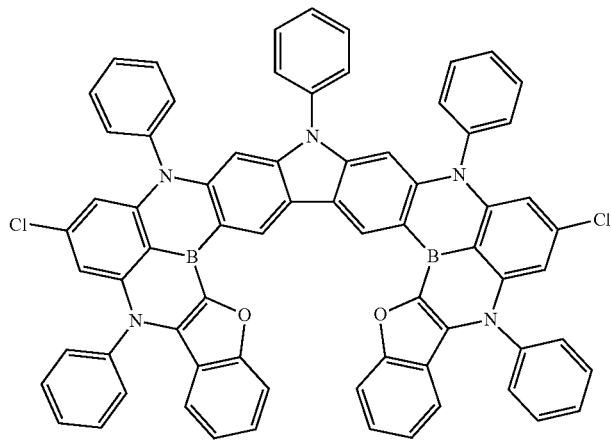

Compound 112

0.86 g of Compound 112 above was obtained at an 8% yield by synthesizing Compound 112 above in the same manner as in the preparation of Compound 111 except that 12.19 g (10.0 mmol) of Starting Material 1-11 was used instead of Starting Material 1-7.

MS (MALDI-TOF) m/z: 1076 [M]+

Synthesis Example 1-12

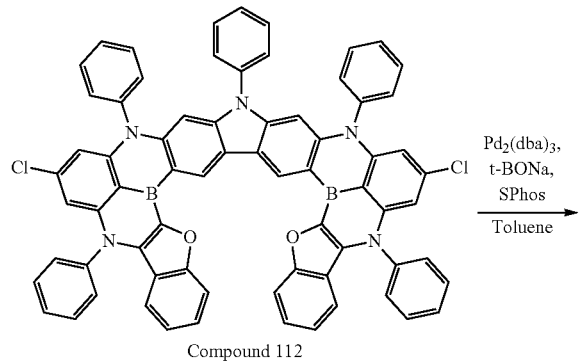

Compound 112

-continued

Compound 114

0.85 g of Compound 114 above was obtained at a 72% yield by synthesizing Compound 114 above in the same manner as in the preparation of Compound 48 except that 0.21 g (2.5 mmol) of piperidine was used instead of phenoxazine.

MS (MALDI-TOF) m/z: 1174 [M]+

Synthesis Example 1-13
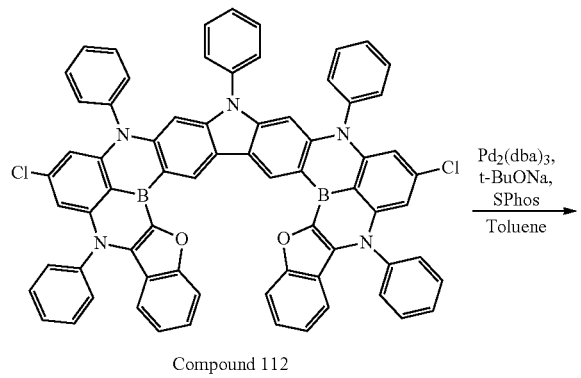
Compound 112
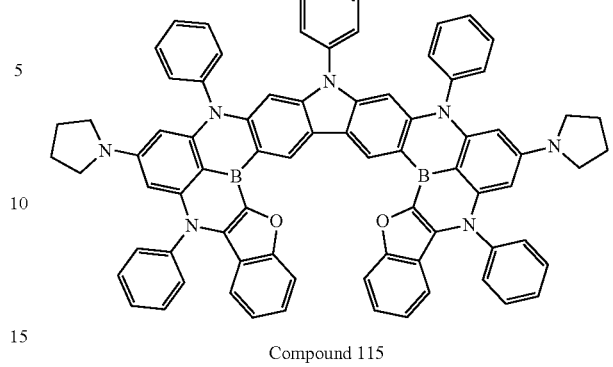
Compound 115
0.84 g of Compound 115 above was obtained at a 73% yield by synthesizing Compound 115 above in the same manner as in the preparation of Compound 48 except that 0.18 g (2.5 mmol) of pyrrolidine was used instead of phenoxazine.
MS (MALDI-TOF) m/z: 1145 [M]+
Synthesis Example 1-14
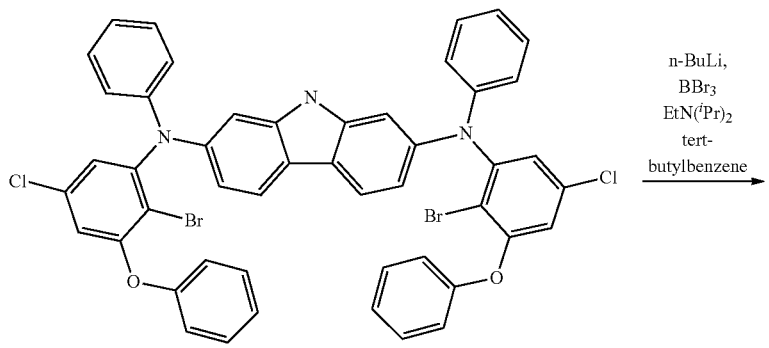
Starting Material 1-14
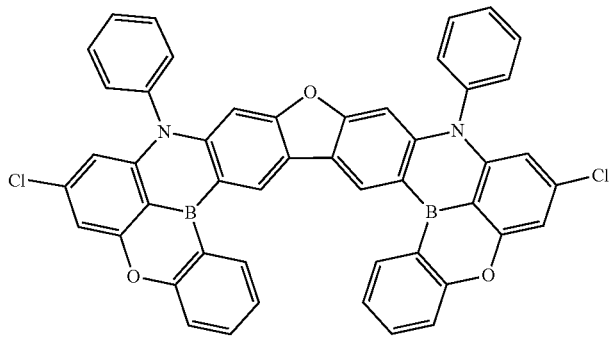
Compound 117

0.93 g of Compound 117 above was obtained at a 12% yield by synthesizing Compound 117 above in the same manner as in the preparation of Compound 111 except that 9.13 g (10.0 mmol) of Starting Material 1-14 was used instead of Starting Material 1-7.

MS (MALDI-TOF) m/z: 771 [M]+

Synthesis Example 1-15

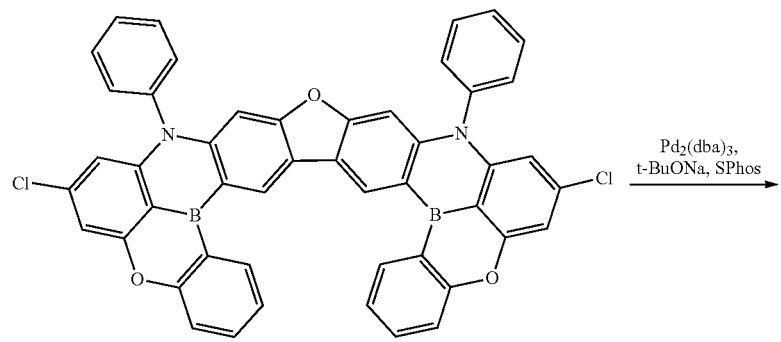

Compound 117

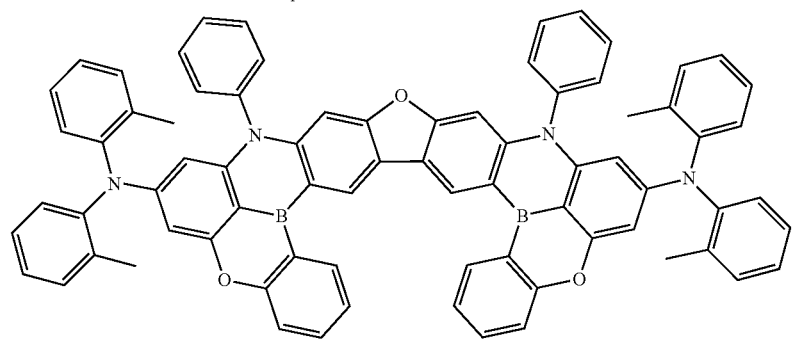

Compound 118

0.87 g of Compound 118 above was obtained at an 80% yield by synthesizing Compound 118 above in the same manner as in the preparation of Compound 48 except that 0.5 g (1.0 mmol) of ditolylamine was used instead of phenoxazine.

MS (MALDI-TOF) m/z: 1092 [M]+

Synthesis Example 1-16

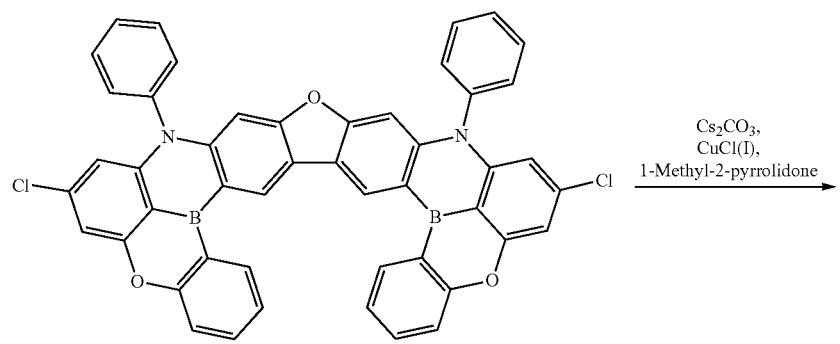

Compound 117

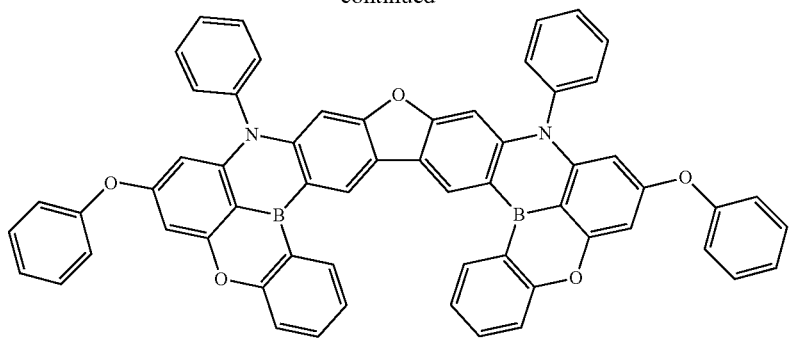

Compound 119

0.77 g (1.0 mmol) of Compound 117, 0.24 g (2.5 mmol) of phenol, 1.6 g (5.0 mmol) of cesium carbonate, 0.03 g (0.2 mmol) of copper(I) chloride, and 10 mL of methylpyrrolidone were injected and refluxed while performing stirring.

A reaction solution was cooled to room temperature, and an organic layer was extracted using ethyl acetate and water. After drying a solvent of the extracted organic layer with $MgSO_4$, filtration was performed. After concentrating a filtrate under reduced pressure, a concentrated filtrate was purified by a silica gel column chromatography (DCM/Hexane) method.

Thereafter, 0.87 g of Compound 119 above was obtained at a 76% yield by performing recrystallization purification of a resulting material using a DCM/Acetone mixed solvent.

MS (MALDI-TOF) m/z: 886 [M]+

Synthesis Example 1-17

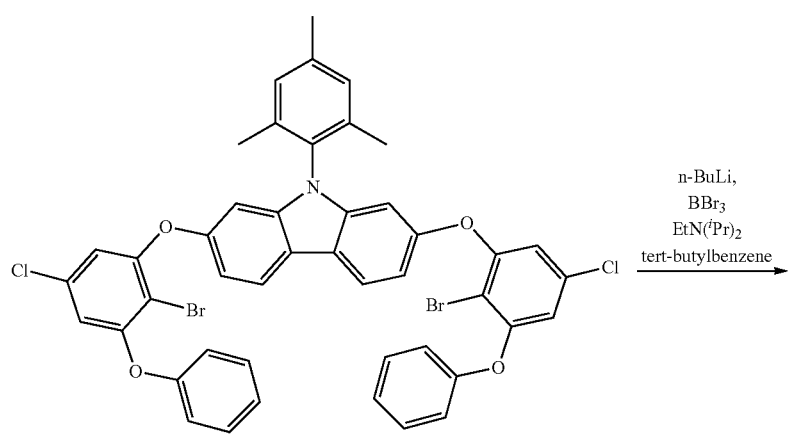

Starting Material 1-17

-continued
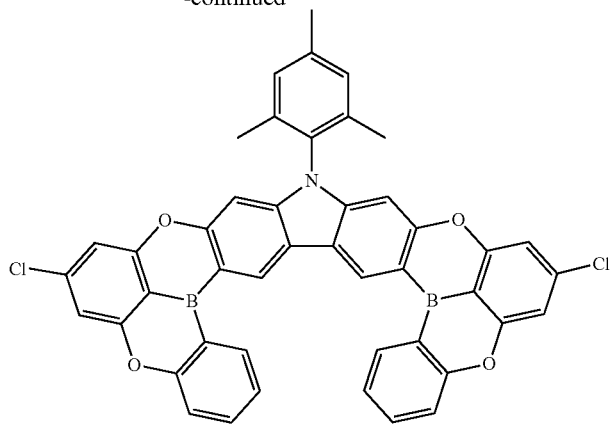
Compound 120
0.81 g of Compound 120 above was obtained at an 11% yield by synthesizing Compound 120 above in the same manner as in the preparation of Compound 111 except that 10.19 g (10.0 mmol) of Starting Material 1-17 was used instead of Starting Material 1-7.
MS (MALDI-TOF) m/z: 738 [M]+
Synthesis Example 1-18
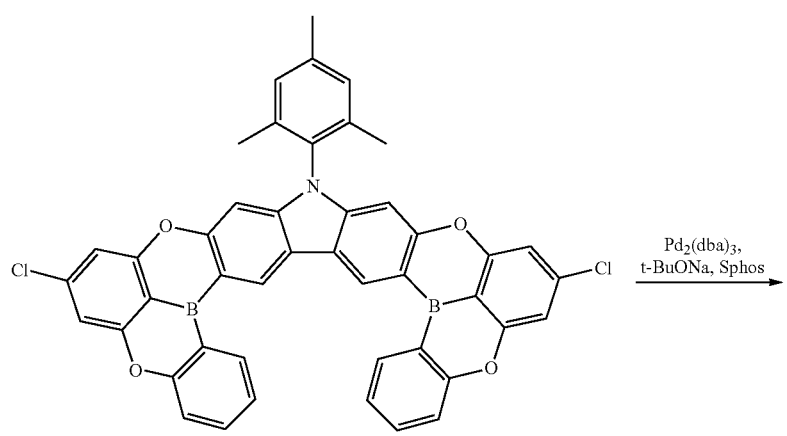
Compound 120
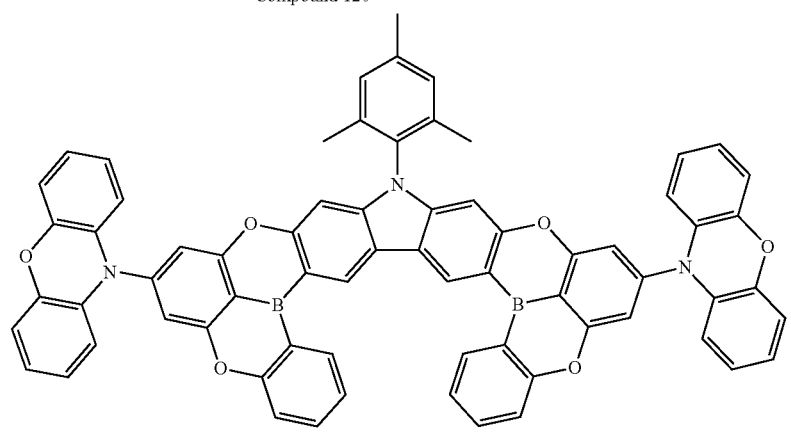
Compound 196

0.77 g of Compound 196 above was obtained at a 75% yield by synthesizing Compound 196 above in the same manner as in the preparation of Compound 48 except that 0.74 g (1.0 mmol) of the compound 120 was used instead of Starting Material 1-8.

MS (MALDI-TOF) m/z: 1031 [M]+

Synthesis Example 1-19

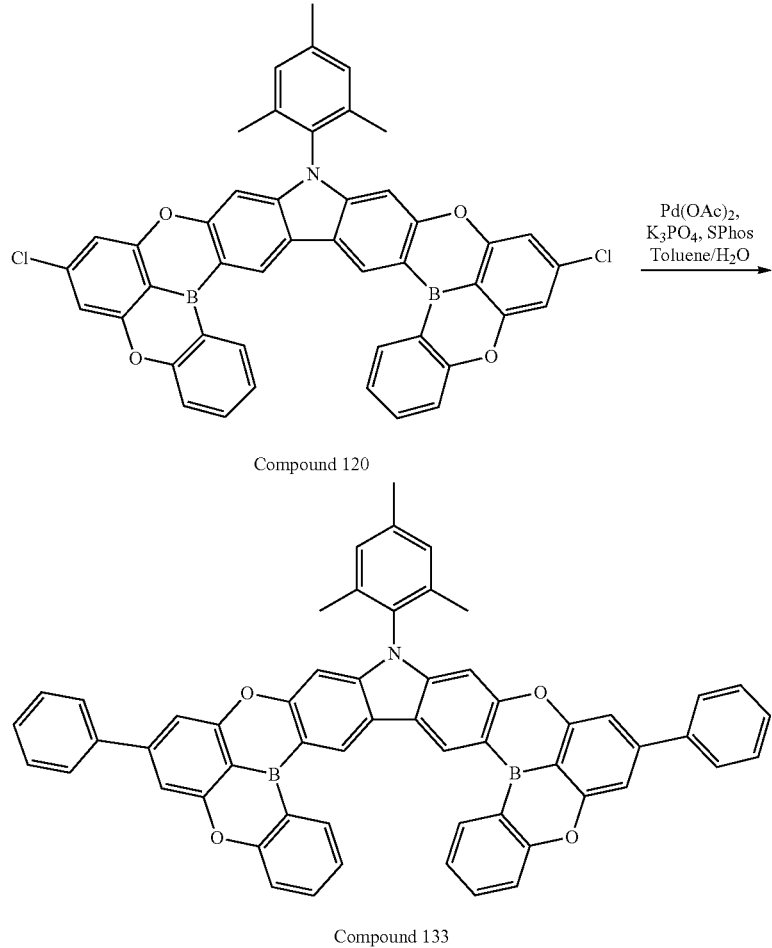

0.74 g (1.0 mmol) of Compound 120, 0.31 g (2.5 mmol) of phenyl boronic acid, 1.06 g (5.0 mmol) of potassium triphosphate, 0.01 g (0.06 mmol) of palladium (II) acetate, 0.05 g (0.12 mmol) of 2-dicyclohexyl phosphino-2',6'-dimethoxybiphenyl, 10 mL of toluene, and 1 mL of $H_2O$ were injected and refluxed while performing stirring.

A reaction solution was cooled to room temperature, and an organic layer was extracted using ethyl acetate and water. After drying a solvent of the extracted organic layer with $MgSO_4$, filtration was performed. After concentrating a filtrate under reduced pressure, a concentrated filtrate was purified by a silica gel column chromatography (DCM/Hexane) method.

Thereafter, 0.66 g of Compound 133 above was obtained at an 80% yield by performing recrystallization purification of a resulting material using a DCM/Acetone mixed solvent.

MS (MALDI-TOF) m/z: 821 [M]+

Example 1: Method for Manufacturing a Bottom Emission Organic Electroluminescent Device A substrate on which ITO (100 nm), which was an anode of the organic electroluminescent device, was laminated was patterned by dividing the substrate into a cathode region, an anode region, and an insulating layer through a photolithograph process, and then the substrate was surface-treated by UV ozone treatment and $O_2:N_2$ plasma for the purpose of work-function increase and cleaning of the anode (ITO). HAT-CN was formed to a thickness of 10 nm thereon as a hole injection layer (HIL). Subsequently, N4,N4,N4',N4'-tetra([1,1'-biphenyl]-4-yl)-[1,1'-biphenyl]-4,4'-diamine was vacuum deposited on the top portion of the hole injection layer to form a hole transport layer with a thickness of 90 nm, and N-phenyl-N-(4-(spiro[benzo[de]anthracene-7,9'-fluorene]-2'-yl)phenyl)dibenzo[b,d]furan-4-amine as an electron blocking layer (EBL) was formed to a thickness of 15 nm on the top portion of the hole transport layer (HTL).

While depositing α,β-AND as a host of the light emitting layer on the top portion of the electron blocking layer (EBL), 2% of Compound 1 was doped as a dopant at the same time to form a light emitting layer (EML) with a thickness of 25 nm.

A mixture prepared by mixing 2-(4-(9,10-di(naphthalene-2-yl)anthracene-2-yl)phenyl)-1-phenyl-1H-benzo[d]imidazole and LiQ at a weight ratio of 1:1 as an electron transport layer (ETL) was deposited to a thickness of 25 nm thereon, an electron injection layer was deposited to a thickness of 1 nm on the electron transport layer, and aluminum was deposited to a thickness of 100 nm as a cathode. Thereafter, an organic electroluminescent device was manufactured by laminating a seal cap including a getter with a UV curable adhesive to protect the organic electroluminescent device from oxygen or moisture in the atmosphere.

Examples 2 to 10: Manufacturing of Organic Electroluminescent Devices

Organic electroluminescent devices were manufactured in the same manner as in Example 1 except that Compounds 2, 66, 46, 161, 121, 48, 49, 114, and 115 were used instead of Compound 1 above as a dopant.

Comparative Example 1: Manufacturing of Organic Electroluminescent Device

An organic electroluminescent device was manufactured in the same manner as in Example 1 except that Compound A was used instead of Compound 1 above as a dopant.

<Compound A>

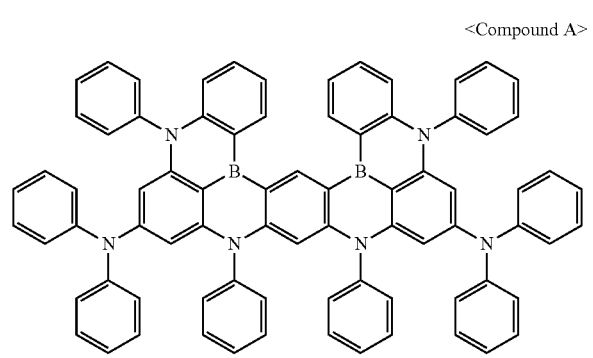 [SMILES: c1ccc(N(c2ccccc2)c2cc3c4c(c2)N(c2ccccc2)c2cc5c(cc2B4c2ccccc2N3c2ccccc2)B2c3ccccc3N(c3ccccc3)c3cc(N(c4ccccc4)c4ccccc4)cc(c32)N5c2ccccc2)cc1]

<Analysis of Characteristics of Organic Electroluminescent Devices>

Hereinafter, after measuring electro-optical characteristics by applying a current of 10 mA/cm² to the bottom emission organic electroluminescent devices manufactured in Examples 1 to 10 and Comparative Example 1 and measuring lifespans of the bottom emission organic electroluminescent devices by driving a constant current of 10 mA/cm², the measurement results are shown in comparison in Table 1 below.

TABLE 1

| Classification | DOPANT | Voltage (V) | Current efficiency (Cd/A) | Lifespan T95 (hr) |
|---|---|---|---|---|
| Example 1 | Compound 1 | 3.98 | 7.7 | 188 |
| Example 2 | Compound 2 | 3.95 | 7.6 | 147 |
| Example 3 | Compound 66 | 3.96 | 8.1 | 105 |

TABLE 1-continued

| Classification | DOPANT | Voltage (V) | Current efficiency (Cd/A) | Lifespan T95 (hr) |
|---|---|---|---|---|
| Example 4 | Compound 46 | 4.00 | 8.2 | 101 |
| Example 5 | Compound 161 | 3.88 | 8.1 | 123 |
| Example 6 | Compound 121 | 3.92 | 8.0 | 140 |
| Example 7 | Compound 48 | 3.90 | 7.7 | 105 |
| Example 8 | Compound 49 | 3.89 | 7.8 | 140 |
| Example 9 | Compound 114 | 3.95 | 7.7 | 127 |
| Example 10 | Compound 115 | 3.94 | 7.7 | 114 |
| Comparative Example 1 | Compound A | 3.95 | 6.5 | 94 |

Compared to the organic electroluminescent device using Compound A above as a dopant, it was confirmed that although the organic electroluminescent devices using the compounds of the present disclosure as a dopant material had the same voltage level, they exhibited excellent effects in current efficiency and lifespan.

Further, as results of measuring emission wavelengths of Compounds 1 and 2 of Examples 1 and 2, and Comparative Compound 1 (Compound A) of Comparative Example 1 of the present disclosure, it was confirmed that the compounds of the present disclosure had narrower full widths at half maximum than Comparative Compound as shown in the FIGURE.

Example 11: Method for Manufacturing Bottom Emission Organic Electroluminescent Device A substrate on which ITO (100 nm), which was an anode of the organic electroluminescent device, was laminated was patterned by dividing the substrate into a cathode region, an anode region, and an insulating layer through a photolithograph process, and then the substrate was surface-treated by UV ozone treatment and $O_2$:$N_2$ plasma for the purpose of work-function increase and cleaning of the anode (ITO). HAT-CN was formed to a thickness of 10 nm thereon as a hole injection layer (HIL). Subsequently, N4,N4,N4',N4'-tetra([1,1'-biphenyl]-4-yl)-[1,1'-biphenyl]-4,4'-diamine was vacuum deposited on the top portion of the hole injection layer to form a hole transport layer with a thickness of 90 nm, and mCP as an electron blocking layer (EBL) was formed to a thickness of 15 nm on the top portion of the hole transport layer (HTL). While depositing Compound B as a host of the light emitting layer on the top portion of the electron blocking layer (EBL), 2% of Compound 1 was doped as a dopant at the same time to form a light emitting layer (EML) with a thickness of 20 nm.

After depositing TSPO1 as a hole blocking layer (HBL) to a thickness of 5 nm on the light emitting layer, TPBI as an electron transport layer (ETL) was deposited to a thickness of 30 nm on the hole blocking layer (HBL), LIF was deposited to a thickness of 1 nm on the electron transport layer, and aluminum as a cathode was deposited to a thickness of 50 nm. Thereafter, an organic electroluminescent device was manufactured by laminating a seal cap including a getter with a UV curable adhesive to protect the organic electroluminescent device from oxygen or moisture in the atmosphere.

<Compound B>

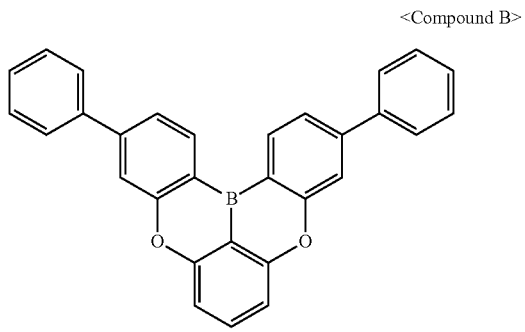 [SMILES: c1ccc(-c2ccc3c(c2)Oc2cccc4c2B3c2ccc(-c3ccccc3)cc2O4)cc1]

Examples 12 to 20: Manufacturing of Organic Electroluminescent Devices

Organic electroluminescent devices were manufactured in the same manner as in Example 11 except that Compounds 2, 66, 46, 161, 121, 48, 49, 114, and 115 were used instead of Compound 1 above as a dopant.

Comparative Example 2: Manufacturing of Organic Electroluminescent Device

An organic electroluminescent device was manufactured in the same manner as in Example 8 except that Compound A was used instead of Compound 1 above as a dopant.

<Compound A>

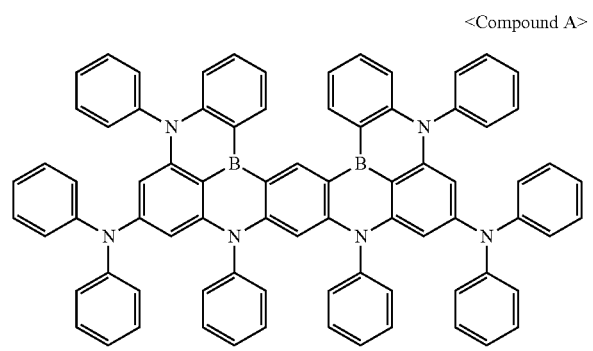 [SMILES: c1ccc(N(c2ccccc2)c2cc3c4c(c2)N(c2ccccc2)c2cc5c(cc2B4c2ccccc2N3c2ccccc2)B2c3ccccc3N(c3ccccc3)c3cc(N(c4ccccc4)c4ccccc4)cc(c32)N5c2ccccc2)cc1]

<Analysis of Characteristics of Organic Electroluminescent Devices>

Hereinafter, after measuring electro-optical characteristics by applying a current of 10 mA/cm$^2$ to the bottom emission organic electroluminescent devices manufactured in Examples 11 to 20 and Comparative Example 2 and measuring lifespans of the bottom emission organic electroluminescent devices by driving a constant current of 10 mA/cm$^2$, the measurement results are shown in comparison in Table 2 below.

TABLE 2

| Classification | DOPANT | Voltage (V) | Current efficiency (Cd/A) |
|---|---|---|---|
| Example 11 | Compound 1 | 6.89 | 15.1 |
| Example 12 | Compound 2 | 6.95 | 14.8 |
| Example 13 | Compound 66 | 6.98 | 15.4 |
| Example 14 | Compound 46 | 7.03 | 15.7 |
| Example 15 | Compound 161 | 6.90 | 14.8 |
| Example 16 | Compound 121 | 6.94 | 15.0 |
| Example 17 | Compound 48 | 7.02 | 15.2 |
| Example 18 | Compound 49 | 7.00 | 15.4 |
| Example 19 | Compound 114 | 7.01 | 15.2 |
| Example 20 | Compound 115 | 7.02 | 15.0 |
| Comparative Example 2 | Compound A | 7.05 | 12.6 |

Compared to the organic electroluminescent device using Compound A above as a dopant, it was confirmed that although the organic electroluminescent devices using the compounds of the present disclosure as a dopant material had the same voltage level, they exhibited excellent effects in current efficiency.

Although the preferred embodiments of the present disclosure have been described in detail above, the right scope of the present disclosure is not limited thereto, and various modifications and improvements made by those skilled in the art using the basic concept of the present disclosure defined in the following claims also belong to the right scope of the present disclosure.

The invention claimed is:

1. A compound selected from the group consisting of:

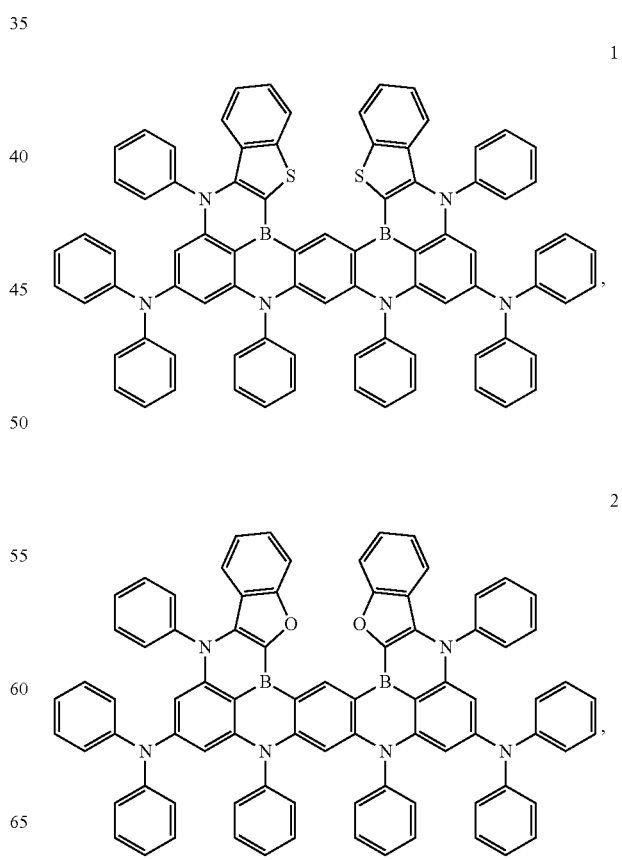

127
-continued
3
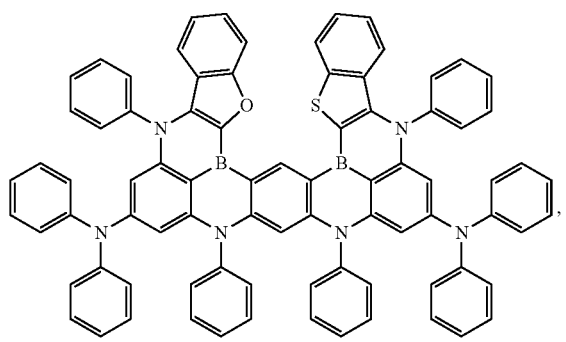
4
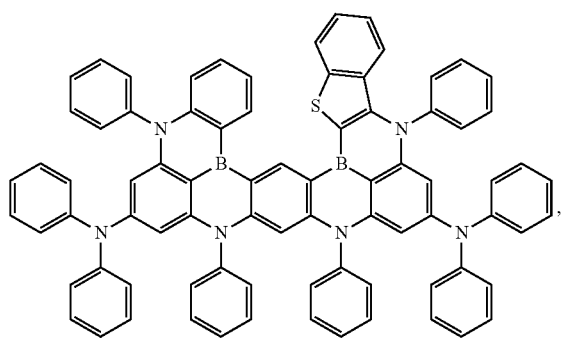
5
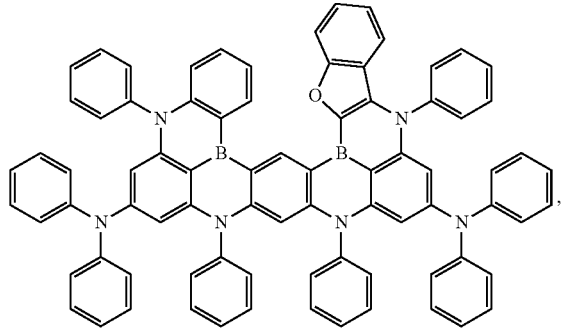
6
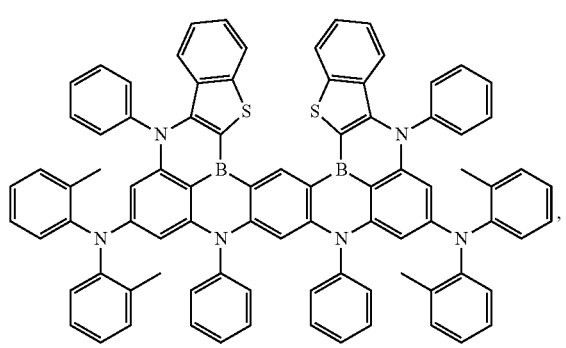
128
-continued
7
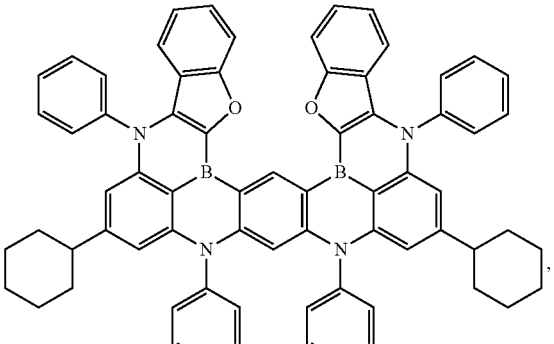
8
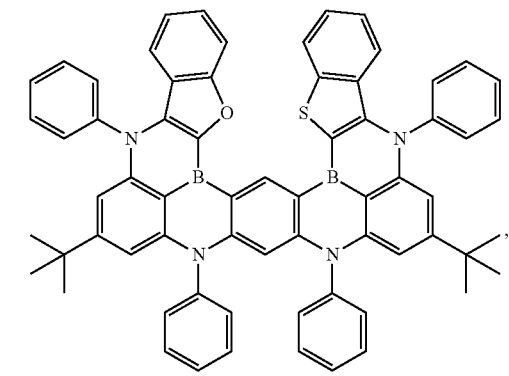
9
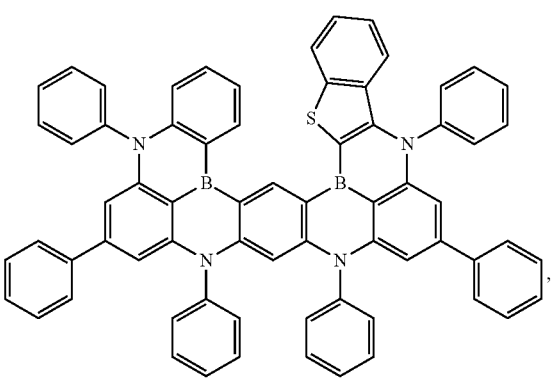
10
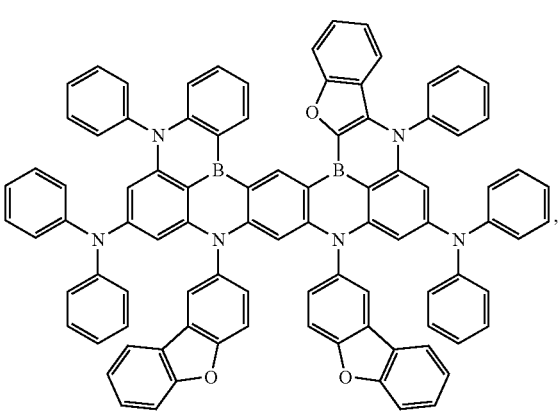

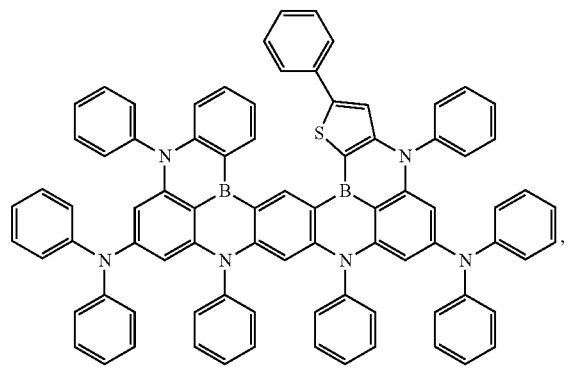
14
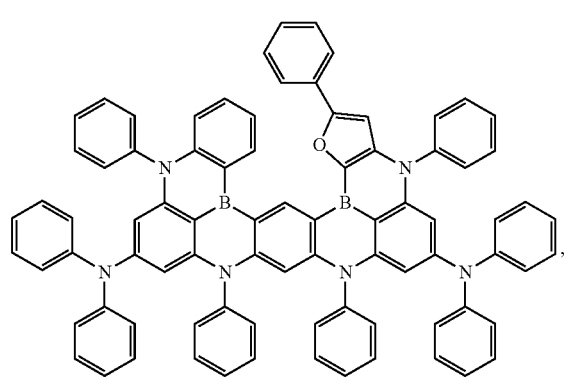
15
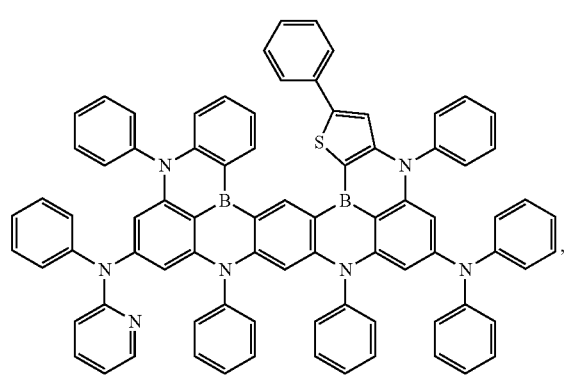
19
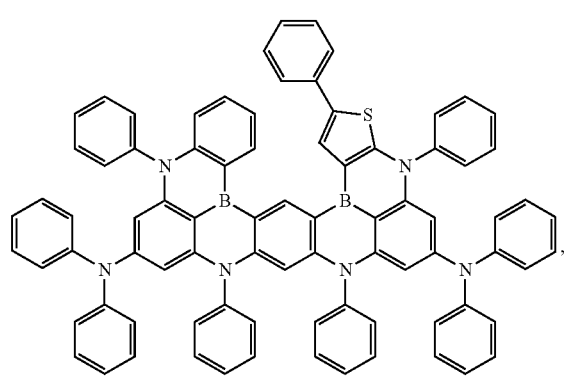
24
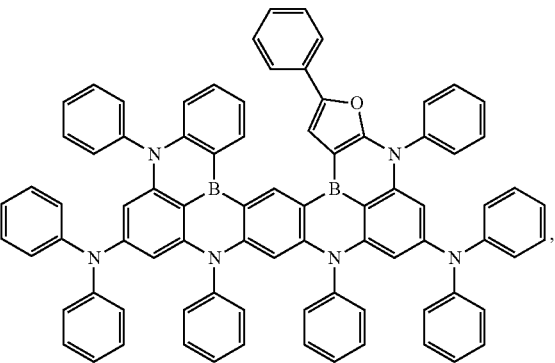
25
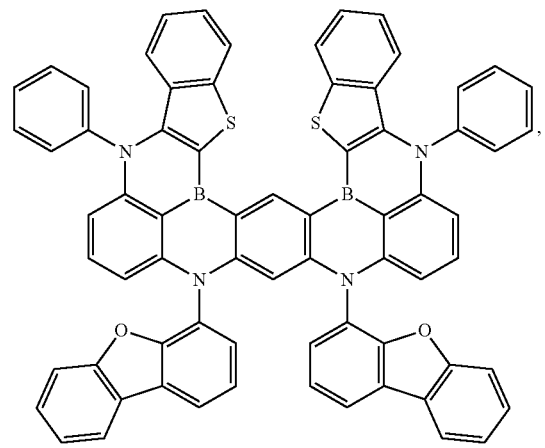
26
27

28
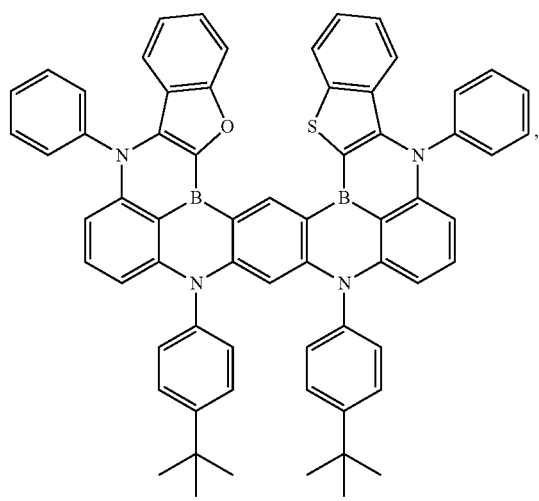
29
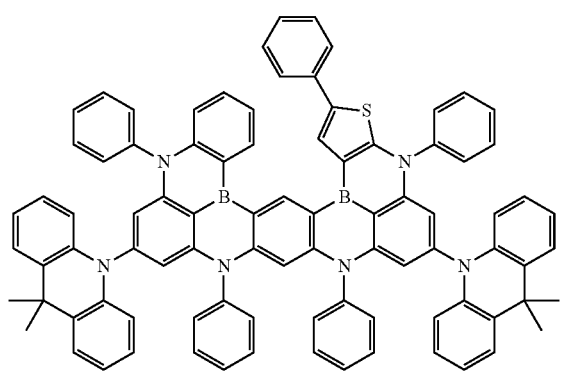
30
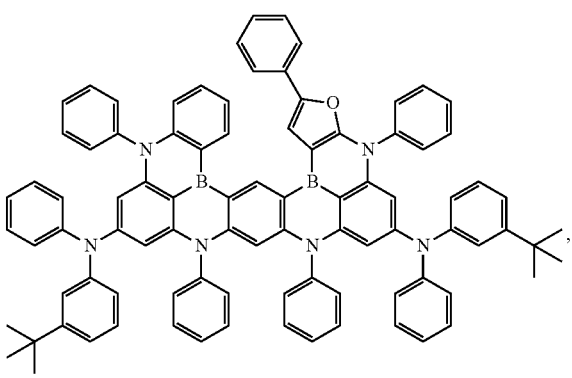
35
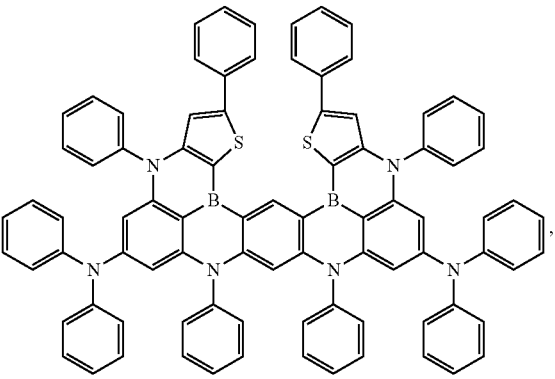
36
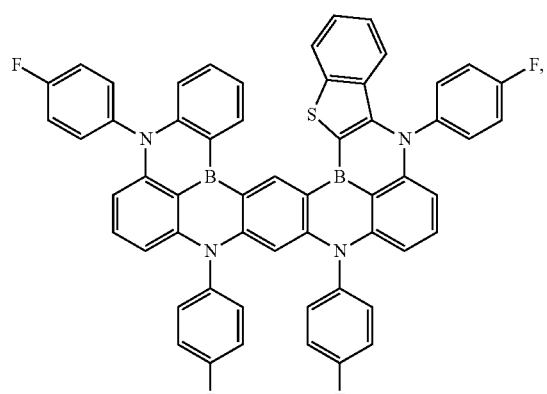
37
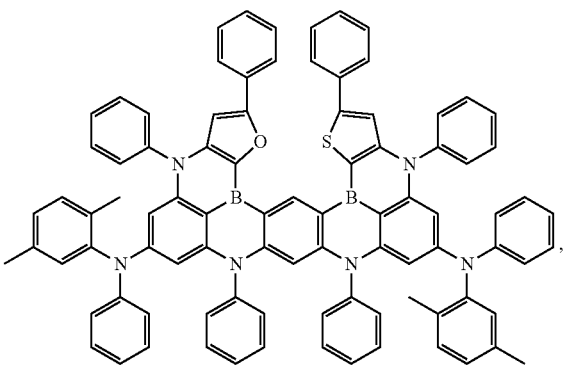

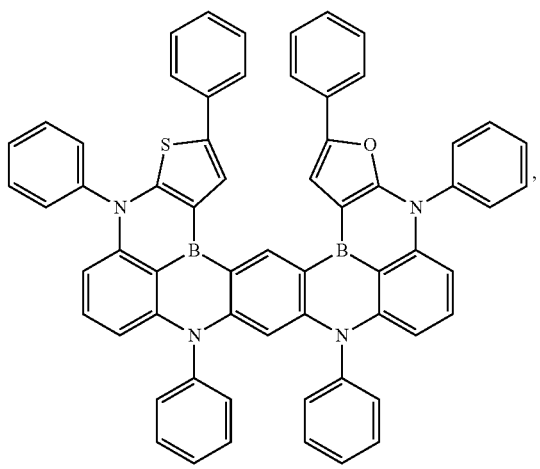

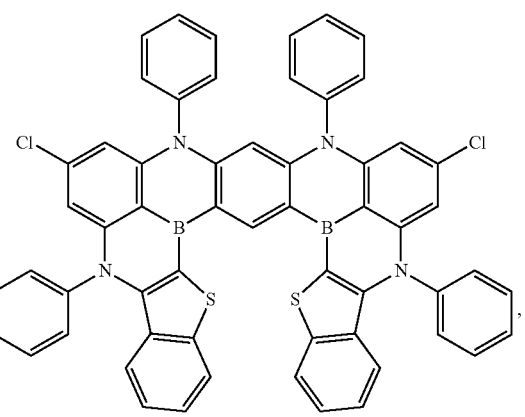

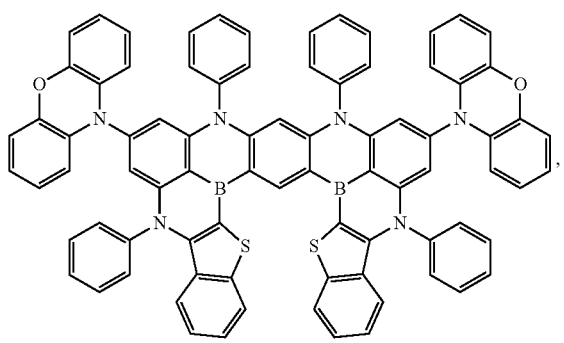

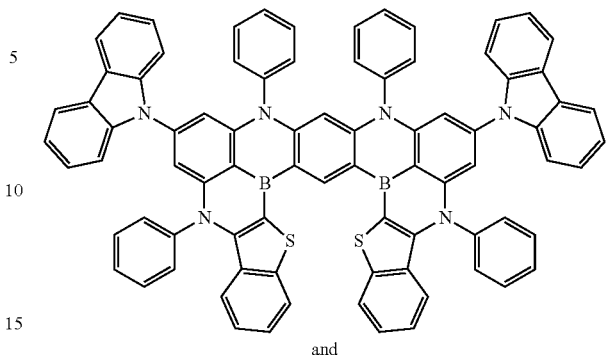

and

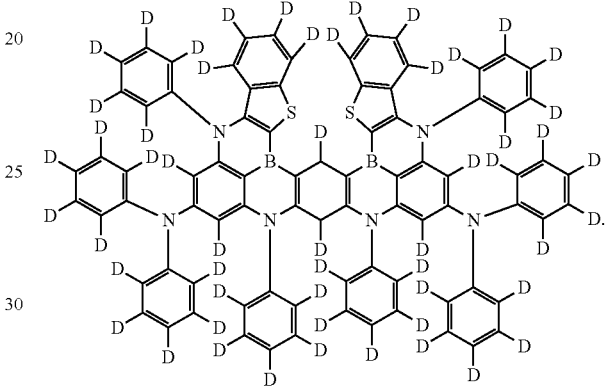

2. An organic electroluminescent device including: a first electrode; a second electrode provided to face the first electrode; and one or more organic material layers provided between the first electrode and the second electrode, wherein at least one of the one or more organic material layers comprises the compound according to claim 1.

3. The organic electroluminescent device of claim 2, wherein the organic material layer is selected from the group consisting of a hole injection layer, a hole transport layer, an electron blocking layer, a light emitting layer, a hole blocking layer, an electron transport layer, and an electron injection layer.

4. The organic electroluminescent device of claim 2, wherein the organic material layer is the light emitting layer.

5. The organic electroluminescent device of claim 2, wherein the compound according to claim 1 is used as a dopant material for the light emitting layer.

* * * * *